(12) United States Patent
Kim et al.

(10) Patent No.: US 8,837,224 B2
(45) Date of Patent: Sep. 16, 2014

(54) NONVOLATILE MEMORY DEVICE, OPERATING METHOD THEREOF AND MEMORY SYSTEM INCLUDING THE SAME

(71) Applicant: Samsung Electronics Co., Ltd., Suwon-si (KR)

(72) Inventors: Tae-Young Kim, Seoul (KR); Youngho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/909,238

(22) Filed: Jun. 4, 2013

(65) Prior Publication Data

US 2013/0336061 A1    Dec. 19, 2013

Related U.S. Application Data

(63) Continuation of application No. 13/038,962, filed on Mar. 2, 2011, now Pat. No. 8,467,246.

(30) Foreign Application Priority Data

Aug. 26, 2010 (KR) .................. 10-2010-0083039

(51) Int. Cl.
*G11C 16/06* (2006.01)
*G11C 11/406* (2006.01)
*G11C 16/10* (2006.01)
*H01L 27/115* (2006.01)
*G11C 16/04* (2006.01)
*G11C 16/16* (2006.01)

(52) U.S. Cl.
CPC .............. *G11C 16/16* (2013.01); *G11C 11/406* (2013.01); *G11C 16/10* (2013.01); *H01L 27/11556* (2013.01); *H01L 27/11573* (2013.01); *G11C 16/0483* (2013.01); *H01L 27/1157* (2013.01); *H01L 27/11582* (2013.01); *H01L 27/11529* (2013.01)
USPC ............ 365/185.17; 365/185.19; 365/185.29; 365/185.22; 365/185.11; 365/185.33

(58) Field of Classification Search
CPC .......... G11C 16/0483; G11C 11/5635; G11C 2211/5621; G11C 16/3468; G11C 16/16; G11C 16/344; G11C 16/14; H01L 27/11529; H01L 27/1157
USPC ............. 365/185.19, 185.29, 185.17, 185.22, 365/185.11, 185.18, 185.33
See application file for complete search history.

(56) References Cited

U.S. PATENT DOCUMENTS

2009/0296471 A1 * 12/2009 Goda et al. ............... 365/185.11
2010/0110796 A1   5/2010 Park et al.

* cited by examiner

*Primary Examiner* — Thong Q Le
(74) *Attorney, Agent, or Firm* — F. Chau & Associates, LLC

(57) ABSTRACT

A method of operating a non-volatile memory device includes storing one or more addresses of word lines (WLs), but not the entire addresses of the WLs, into a latch, the WLs disposed between a string selection line (SSL) and a ground selection line (GSL), selecting a first WL from the latch, performing an erasing operation on memory cells associated with the string selection line (SSL), the memory cells associated with the SSL constituting a memory block, and verifying the erasing operation on memory cells associated with the selected first WL.

18 Claims, 76 Drawing Sheets

Fig. 10

| BL | Vbl1(Vcc) |
|---|---|
| SSL | Vssl2(Vcc) |
| Selected WL | Vvfy1(Vss) |
| Unselected WL | Vuwl1 |
| GSL | Vgsl2(Vcc) |
| CSL | Vcsl1(Vss) |

| SSL | Float / Vssl3 |
| --- | --- |
| WL | Vwe2(Vss) |
| GSL | Float / Vgsl3 |
| CSL | Float |
| Substrate | Vers2 |

Fig. 26

| BL | Vbl2(Vcc) |
|---|---|
| Selected SSL | Vssl4(Vcc) |
| Unselected SSL | Vssl5(Vss) |
| Selected WL | Vvfy2(Vss) |
| Unselected WL | Vuwl2 |
| GSL | Vgsl4(Vcc) |
| CSL | Vcsl2(Vss) |

Fig. 30

| SSL | Float / Vssl3 |
|---|---|
| WL of selected sub-block | Vwe2(Vss) |
| DWL | Vdwl1 |
| WL of unselected sub-block | Float / Vuwl3 |
| GSL | Float / Vgsl3 |
| CSL | Float |
| Substrate | Vers2 |

Fig. 33

| BL | Vbl2(Vcc) |
|---|---|
| Selected SSL | Vssl4(Vcc) |
| Unselected SSL | Vssl5(Vss) |
| Selected WL of selected sub-block | Vvfy2(Vss) |
| Unselected WL of selected sub-block | Vuwl2 |
| DWL | Vuwl2 |
| WL of unselected sub-block | Vuwl2 |
| GSL | Vgsl4(Vcc) |
| CSL | Vcsl2(Vss) |

Fig. 37

| BL | Vbl2(Vcc) |
|---|---|
| Selected SSL | Vssl4(Vcc) |
| Unselected SSL | Vssl5(Vss) |
| Selected WL | Vvfy2(Vss) |
| Unselected WL | Vuwl2 |
| Selected GSL | Vgsl4(Vcc) |
| Unselected GSL | Vgsl5(Vss) |
| CSL | Vcsl2(Vss) |

Fig. 52

| SSL | Float |
|---|---|
| WL | Float → Vwe3 |
| GSL | Vss → Float |
| CSL | Float |
| Substrate | Vpr → Vers3 |

Fig. 55

| | |
|---|---|
| SSL | Float |
| WL of unselected sub-block | Float |
| DWL | Vdwl2 |
| WL of selected sub-block | Float → Vwe3 |
| GSL | Vss → Float |
| CSL | Float |
| Substrate | Vbr → Vers3 |

NONVOLATILE MEMORY DEVICE, OPERATING METHOD THEREOF AND MEMORY SYSTEM INCLUDING THE SAME

CROSS-REFERENCE TO RELATED APPLICATIONS

This application is a continuation of U.S. application Ser. No. 13/038,962, filed Mar. 2, 2011, which claims priority to Korean Patent Application No. 10-2010-0083039, filed on Aug. 26, 2010, the entire contents of which are herein incorporated by reference.

BACKGROUND

1. Technical Field

The present disclosure relates to a semiconductor memory device, and more particularly, to a nonvolatile memory device, an operating method thereof, and a memory system including the same.

2. Related Art

Semiconductor memory devices comprise semiconductor materials such as silicon (Si), germanium (Ge), gallium arsenide (GaAs), and indium phosphide (InP). The semiconductor memory devices are largely divided into volatile memory devices and nonvolatile memory devices.

Volatile memory devices lose stored data when power supply is cut off. Examples of volatile memory devices include Static Random Access Memories (SRAMs), Dynamic Random Access Memories (DRAMs) and Synchronous Dynamic Random Access Memories (SDRAMs). Nonvolatile memory devices are able to retain stored data even when power supply is cut off. Examples of nonvolatile memory devices include Read-Only Memories (ROMs), Programmable Read Only Memories (PROMs), Erasable Programmable Read Only Memories (EPROMs), Electrical Erasable Programmable Read Only Memories (EEPROMs), flash memory devices, Phase-change Random Access Memories (PRAMs), Magnetoresistive Random Access Memories (MRAM), Resistive Random Access Memories (RRAMs), and Ferroelectric Random Access Memories (FRAMs). Flash memory devices can be largely divided into a NOR type and a NAND type.

SUMMARY

According to an embodiment, a method of operating a non-volatile memory device includes storing one or more addresses of word lines (WLs), but not the entire addresses of the WLs, into a latch, the WLs disposed between a string selection line (SSL) and a ground selection line (GSL), selecting a first WL from the latch, performing an erasing operation on memory cells associated with the string selection line (SSL), the memory cells associated with the SSL constituting a memory block, and verifying the erasing operation on the memory cells associated with the selected first WL.

The method may further comprise resetting an erase count prior to the erasing operation.

The method may further comprise selecting a second WL from the latch when verifying the erasing operation on the memory cells associated with the first WL passes.

The method may further comprise counting up the erase count when verifying the erasing operation on the memory cells associated with the first WL fails, and adjusting an erase voltage to erase the memory block.

The method may further comprise deleting the address of the first WL when verifying the erasing operation on the memory cells associated with the first WL passes.

The method may further comprise selecting a second WL from the latch when verifying the erasing operation on the memory cells associated with the first WL fails.

The method may further comprise counting up the erase count when the latch stores any WL address after verifying the last stored WL address.

The method may further comprise performing an error report when the erase count reaches a preset value.

The memory block may include a plurality of NAND strings connected to one bit line.

The one or more addresses of the word lines (WLs) can correspond to a word line connected to memory cells having slower erase speed as compared to memory cells connected to a word line whose address is not stored in the latch, or correspond to a word line located at an edge among the word lines.

The address of the first WL stored in the latch can be received from a fuse in a fuse unit.

According to an embodiment, a non-volatile memory device includes a memory cell array comprising memory cells associated with a string selection line (SSL), a voltage generating unit configured to generate an erase voltage for performing an erasing operation on the memory cells associated with the string selection line (SSL), the memory cells associated with the SSL constituting a memory block, and a control logic comprising a latch configured to store one or more addresses of word lines (WLs), but not the entire addresses of the WLs, into the latch, the WLs disposed between an SSL and a GSL, wherein the control logic is configured to verify the erasing operation on the memory cells associated with a first WL whose address is stored in the latch.

The address of the first WL can be received from a fuse in a fuse unit.

The non-volatile memory device may further comprise an address decoder connected to the memory cell array through SSLs, word lines, and at least one ground selection line (GSL).

The non-volatile memory device may further comprise a read/write circuit connected to the memory cell array through bit lines.

The non-volatile memory device may further comprise a pass/fail check unit for determining whether the verification of the erasing operation on the memory cells has failed or passed.

The control logic may further comprise an erase control unit and an erase counter, the erase control unit receiving pass/fail data from the pass/fail check unit.

The non-volatile memory device can be configured to receive a signal from a controller.

The controller may include a RAM, a processing unit, a host interface, and a memory interface.

The non-volatile memory device can be configured to transmit an error signal to an error correction block.

According to an embodiment, a method of operating a non-volatile memory device includes storing one or more addresses of word lines (WLs), but not the entire addresses of the WLs, into a latch, the WLs disposed between an SSL and a GSL, selecting a first WL from the latch, performing an erasing operation on memory cells associated with a plurality of string selection lines (SSLs), the memory cells associated with the plurality of SSLs constituting a memory block, and verifying the erasing operation on the memory cells associated with a second SSL after verifying the erasing operation on the memory cells associated with the first SSL, wherein verifying the erasing operation on the memory cells associated with the first SSL comprises verifying the erasing operation on the memory cells associated with the one or more addresses of the WLs, but not the entire addresses of the WLs, stored in the latch.

The method may further comprise resetting an SSL count and an erase count prior to the erasing operation.

The method may further comprise counting up the SSL count when verifying the erasing operation on the memory cells associated with the first SSL passes prior to verifying the erasing operation on the memory cells associated with the second SSL.

The method may further comprise counting up the erase count when verifying the erasing operation on the memory cells associated with the first WL fails, and adjusting an erase voltage to erase the memory block.

The method may further comprise selecting a second WL from the latch when verifying the erasing operation on the memory cells associated with the first WL passes.

The method may further comprise deleting the address of the first WL when verifying the erasing operation on the memory cells associated with the first WL passes.

The method may further comprise selecting a second WL from the latch when verifying the erasing operation on the memory cells associated with the first WL fails.

The method may further comprise counting up the erase count when the latch stores any WL address after verifying the last stored WL address.

The method may further comprise performing an error report when the erase count reaches a preset value.

The memory cells of the non-volatile memory device can be stacked in a direction perpendicular with respect to a major axis of a substrate where the memory cells are disposed.

BRIEF DESCRIPTION OF THE DRAWINGS

Exemplary embodiments of the present invention can be understood in more detail from the following descriptions taken in conjunction with the accompanying drawings, in which:

FIG. 10 is a table illustrating voltage conditions during ease verification of the nonvolatile memory device of FIG. 1;

FIG. 26 is a table illustrating voltage conditions during an erase-verification operation of the nonvolatile memory device of FIG. 13;

FIG. 30 is a table illustrating voltage conditions applied to an equivalent circuit of the memory block of FIG. 15 during an erase operation;

FIG. 33 is a table illustrating voltage conditions applied to an equivalent circuit of the memory block of FIG. 15 during erase-verification;

FIG. 37 is a table illustrating voltage conditions applied to an equivalent circuit of the memory block of FIG. 15 during erase-verification;

FIG. 52 is a table illustrating voltage conditions during an erase operation of the memory block of FIGS. 50 and 51;

FIG. 55 is a table illustrating voltage conditions during an erase operation of the memory block of FIGS. 50 and 51 according to an embodiment of the inventive concept;

DETAILED DESCRIPTION OF EXEMPLARY EMBODIMENTS

Exemplary embodiments of the inventive concept will be described below in more detail with reference to the accompanying drawings. The inventive concept may, however, be embodied in different forms and should not be construed as limited to the embodiments set forth herein.

Hereinafter, expressions such as "a word line is erase-verified" and "erase-verification is performed in a word line" may represent that memory cells connected to a corresponding word line are erase-verified. Additionally, expressions such as "a selected row is erase-verified" and "erase-verification is performed in a selected row" may represent that memory cells in the selected row are erase-verified.

Hereinafter, it is defined that all memory cells connected to a corresponding word line (or string selection line) are erase-passed in a word line (or string selection line) corresponding to erase-passed memory cells (or memory cell). It is defined that at least one of memory cells connected to a corresponding word line (or string selection line) are erase-failed in a word line (or string selection line) corresponding to erase-failed memory cells (or memory cell).

Exemplarily, when a nonvolatile memory device or its host has an error correction function, if the number of erase-failed memory cells is less than a specific number, the memory cells are treated as being erase-passed. Technical ideas and embodiments of the inventive concept may be applied in the same manner. That is, if the number of erase-failed memory cells among memory cells connected to a specific word line (or string selection line) is less than a specific number, a corresponding word line may be treated as being connected to erase-passed memory cells. If the number of erase-failed memory cells among memory cells connected to a specific word line (or string selection line) is more than a specific number, a corresponding word line may be treated as being connected to erase-failed memory cells.

Figure 1:
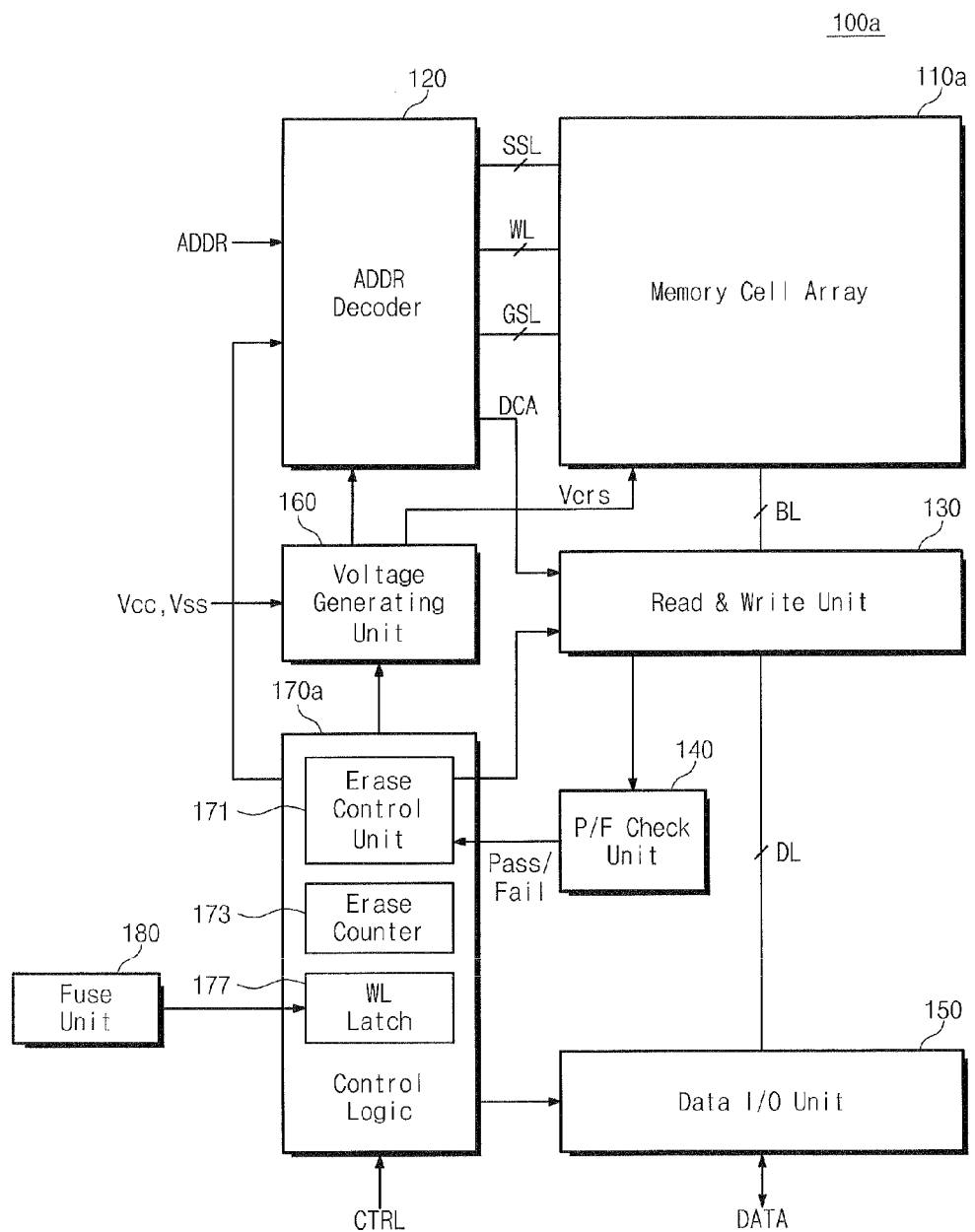
FIG. 1 is a block diagram illustrating a nonvolatile memory device according to an embodiment of the inventive concept.

FIG. 1 is a block diagram illustrating a nonvolatile memory device 100a according to an embodiment of the inventive concept. Referring to FIG. 1, the nonvolatile memory device 100a includes a memory cell array 110a, an address decoder 120, a read & write unit 130, a pass/fail check unit 140, a data input/output unit 150, a voltage generating unit 160, a control logic 170a, and a fuse unit 180.

The memory cell array 110a is connected to the address decoder 120 through word lines WL and selection lines. For example, the selection lines may include string selection lines SSL and ground selection lines GSL. In an embodiment, the memory cell array 110a is connected to the read & write unit 130 through a bit line BL.

The memory cell array 110a may include a plurality of memory cells. For example, the memory cell array 110a includes memory cells disposed on a substrate along row and column directions. In an embodiment, the memory cell array 110a includes a plurality of memory cells, each cell storing at least one bit.

The address decoder 120 is connected to the memory cell array 110a through word lines WL, string selection lines SSL, and ground selection lines GSL. The address decoder 120 is configured to operate in response to control of the control logic 170a. The address decoder 120 receives addresses ADDR from the outside.

The address decoder 120 is configured to decode a row address among the received addresses ADDR. The address decoder 120 is configured to select a word line corresponding to the decoded row address among the word lines WL. The address decoder 120 is configured to select selection lines corresponding to the decoded row address among the selection lines including string selection lines SSL and ground selection lines GSL.

The address decoder 120 is configured to deliver various voltages received from the voltage generating unit 160 to the selected word line, non-selected word line, selected selection line, and non-selected selection line.

When the address decoder 120 is additionally connected to the memory cell array 110a through dummy word lines DWL, the address decoder 120 can be configured to further select a dummy word line corresponding to the decoded row address among the dummy word lines DWL. In an embodiment, the address decider 120 may be configured to deliver various voltages received from the voltage generating unit 160 to the selected dummy word line DWL and non-selected dummy word line DWL.

The address decoder 120 is configured to decode a column address among the received address ADDR. The address decoder 120 delivers the decoded column address DCA to the read & write unit 130.

In an embodiment, the address decoder 120 may include a row decoder decoding a row address, a column decoder decoding a column address, and an address buffer storing a received address ADDR.

The read & write unit 130 is connected to the memory cell array 110a through bit lines BL, and is connected to the data input/output unit 150 through data lines DL. The read & write unit 130 operates in response to control of the control logic 170a. The read & write unit 130 receives a decoded column address DCA from the address decoder 120. Using the decoded column address DCA, the read & write unit 130 selects bit lines BL.

In an embodiment, the read & write unit 130 receives data from the data input/output unit 150, and writes the received data in the memory cell array 110a. The read & write unit 130 reads data from the memory cell array 110a and delivers the read data to the data input/output unit 150. The read & write unit 130 reads data from a first storage region of the memory cell array 110a and writes the read data in a second storage region of the memory cell array 110a. For example, the read & write unit 130 performs a copy-back operation.

In an embodiment, the read & write unit 130 may include components such as a page buffer (or page register) and a column selection circuit. In an embodiment, the read & write unit 130 may include components such as a sense amplifier, a write driver, and a column selection circuit.

The pass/fail check unit 140 is connected to the read & write unit 130 and the control logic 170a. During erase-verification, the pass/fail check unit 140 is configured to receive data sensed by the read & write unit 130. Based on the received data, the pass/fail check unit 140 determines whether it is erase-passed or erase-failed. According to a determination result, the pass/fail check unit 140 is configured to transmit a pass signal Pass or a fail signal Fail to the control logic 170a.

The data input/output unit 150 is connected to the read & write unit 130 through data lines DL. The data input/output unit 140 operates in response to control of the control logic 170a. The data input/output unit 150 is configured to exchange data DATA with an external device. The data input/output unit 150 is configured to deliver data DATA from the external device to the read & write unit 130 through data lines DL. The data input/output unit 150 is configured to output data DATA delivered from the read & write unit 130 through data lines DL to the outside. In an embodiment, the data input/output unit 150 may include components such as a data buffer.

The voltage generating unit 160 is connected to the memory cell array 110a, the address decoder 120, and the control logic 170a. The voltage generating unit 160 receives power from the outside. For example, the voltage generating unit 160 receives a power voltage Vcc and a ground voltage Vss from the outside. In response to a control of the control logic 170a, the voltage generating unit 160 is configured to generate voltages having various levels from the power voltage Vcc and the ground voltage Vss. For example, the voltage generating unit 160 is configured to generate various voltages such as a high voltage Vpp, a program voltage Vpgm, a pass voltage Vpass, a read voltage Vread, and an erase voltage Vers.

Voltages generated by the voltage generating unit 160 are supplied to the address decoder 120 and the memory cell array 110a under a control of the control logic 170a. For example, a program voltage Vpgm and a pass voltage Vpass may be supplied to the address decoder 120 during a program operation. During a read operation, a read voltage Vread may be supplied to the address decoder 120. During erasing the memory cell array 110a, an erase voltage Vers may be supplied to the memory cell array 110a.

The above-mentioned voltages are exemplary voltages generated by the voltage generating unit 160. Voltages generated by the voltage generating unit 160 are not limited to the above-mentioned voltages.

The control logic 170a is connected to the address decoder 120, the read & write unit 130, the pass/fail check unit 160, and the data input/output unit 150. The control logic 170a is configured to control general operations of the nonvolatile memory device 100a. The control logic 170a operates in response to a control signal CTRL delivered from the outside.

The control logic 170a includes an erase control unit 171, an erase counter 173, and a word line address latch 177. The erase control unit 171 is configured to control an erase operation of the nonvolatile memory device 100a. For example, the erase operation of the nonvolatile memory device 100a includes erase and erase-verification. Under the control of the erase control unit 171, a selected memory block of the memory cell array 110a may be erased and erase-verified.

The erase control unit 171 may control the address decoder 120, the read & write unit 130, and the voltage generating unit 160 such that a selected memory block of the memory cell array 110a is erased. The erase control unit 171 controls the address decoder 120, the read & write unit 130, and the voltage generating unit 160 such that a selected memory block of the memory cell 110a is erase-verified. For example, the erase control unit 171 controls an erase operation based on information stored in the erase counter 173. For example, the erase control unit 171 control erase-verification based on information stored in the word line latch 177.

The erase control unit 171 recognizes whether it is erase-passed or erase-failed based on an output of the pass/fail check unit 140. According to whether it is erase-passed or erase-failed, the erase control unit 171 controls following erase or erase-verification.

A counter value (hereinafter, referred to as an erase count) of the erase counter 173 represents the erased number of a specific memory block of the memory cell array 110a during an erase operation. For example, an erase count corresponds to the number of applying an erase voltage Vers to a specific memory block during an erase operation. For example, the erase count represents the number of applying an erase voltage (or erase pulse) to a specific memory block according to an incremental step pulse erase (ISPE). Hereinafter, a count value of the erase counter 173 is defined as an erase count.

The word line address latch 177 is configured to store an address of at least one word line WL of a specific memory block. More specifically, the word line address latch 177 is configured to store addresses of some of the word lines WL of the specific memory block. In an embodiment, the addresses of some of the word lines WL may be stored in the word line address latch 177 from the fuse unit 180.

For example, the addresses of some of the word lines WL may be stored in the word line address latch 177 upon power-on read. For example, the addresses of some of the word lines WL may be stored in the word line address latch 177 when an erase operation starts.

The fuse unit 180 includes at least one fuse. The fuse unit 180 is configured to store the addresses of some of the word lines WL. For example, the fuse unit 180 may include a laser fuse or an electric fuse. The addresses of some of the word lines WL stored in the fuse unit 180 may be transmitted to the word line address latch 177.

Figure 2:
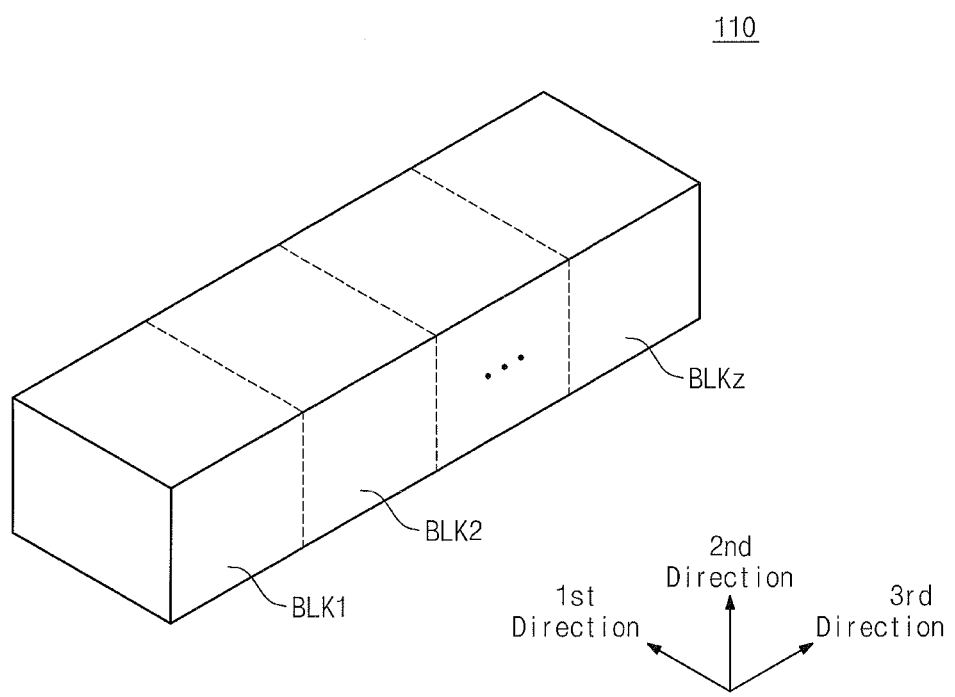
FIG. 2 is a block diagram illustrating a cell array according to an embodiment of the inventive concept.

FIG. 2 is a block diagram illustrating the cell array 110a of FIG. 1. Referring to FIG. 2, the memory cell array 110a includes a plurality of memory blocks BLK1 to BLKz. In an embodiment, the memory blocks BLK1 to BLKz are selected by the address decoder 120 of FIG. 1. For example, the address decoder 120 is configured to select a memory block BLK corresponding to a block address among the memory blocks BLK1 to BLKz.

Figure 3:
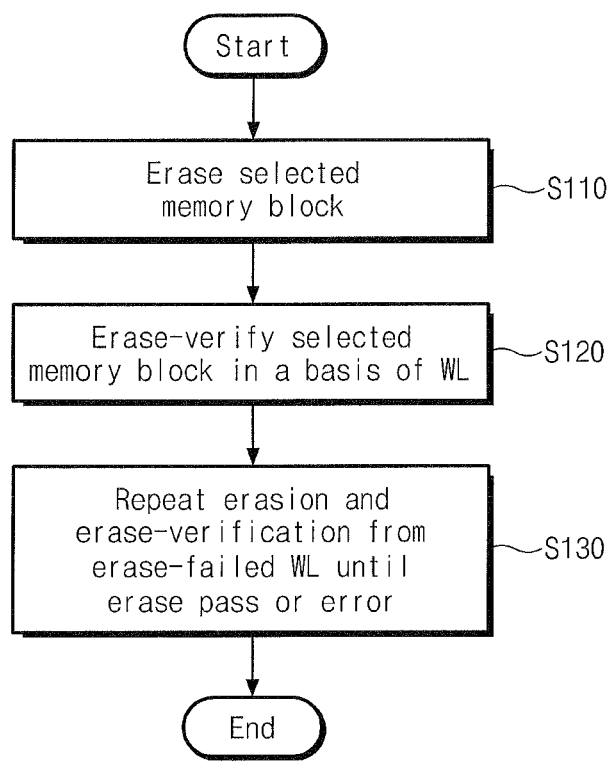
FIG. 3 is a flowchart illustrating a method of operating the nonvolatile memory device according to an embodiment of the inventive concept.

FIG. 3 is a flowchart illustrating a method of operating the nonvolatile memory device 100a of FIG. 1 according to an embodiment of the inventive concept. In more detail, a flowchart of an erase operation of the nonvolatile memory device 100a is shown in FIG. 3. Referring to FIGS. 1 and 3, a selected memory block is erased in operation S110. For example, a selected memory block among the memory blocks BLK1 to BLKz of the memory cell array 110a may be erased.

In operation S120, the selected memory block is erase-verified by unit of respective word line.

In operation S130, erase and erase-verification from erase-failed word line repeat until it is erase-passed or error occurs.

According to an embodiment of the inventive concept, erase-verification is performed by unit of respective word line. As compared to a method through which an erase verify voltage is applied to all word lines WL, in an erase-verification method according to an embodiment of the inventive concept, RC loading of a word line WL, i.e., a target that erase verify voltage is applied, is reduced. Accordingly, when an erase verify voltage is applied to a word line WL, it may be adjusted more accurately to the level of an erase verify voltage of a word line WL. That is, a threshold voltage of a memory cell to be erased may be more accurately adjusted to a target value.

According to an embodiment of the inventive concept, erase-verification resumes from an erase-failed word line. When erase and erase-verification are performed in a first erase loop, an erase-failed word line is detected during the erase-verification, and first to i−1th word lines are erase-passed and i-th to j-th word lines are erase-failed, erase and erase-verification are performed in a second erase loop. Erase-verification of the second erase loop may be performed from the erase-failed word line WL detected in the first erase loop. As such, erase-verification on the first to i−1th word lines is omitted and erase-verification is performed from the i-th word line.

Since erase-verification resumes from an erase-failed word line, erase-verification time is shortened.

Figure 4:
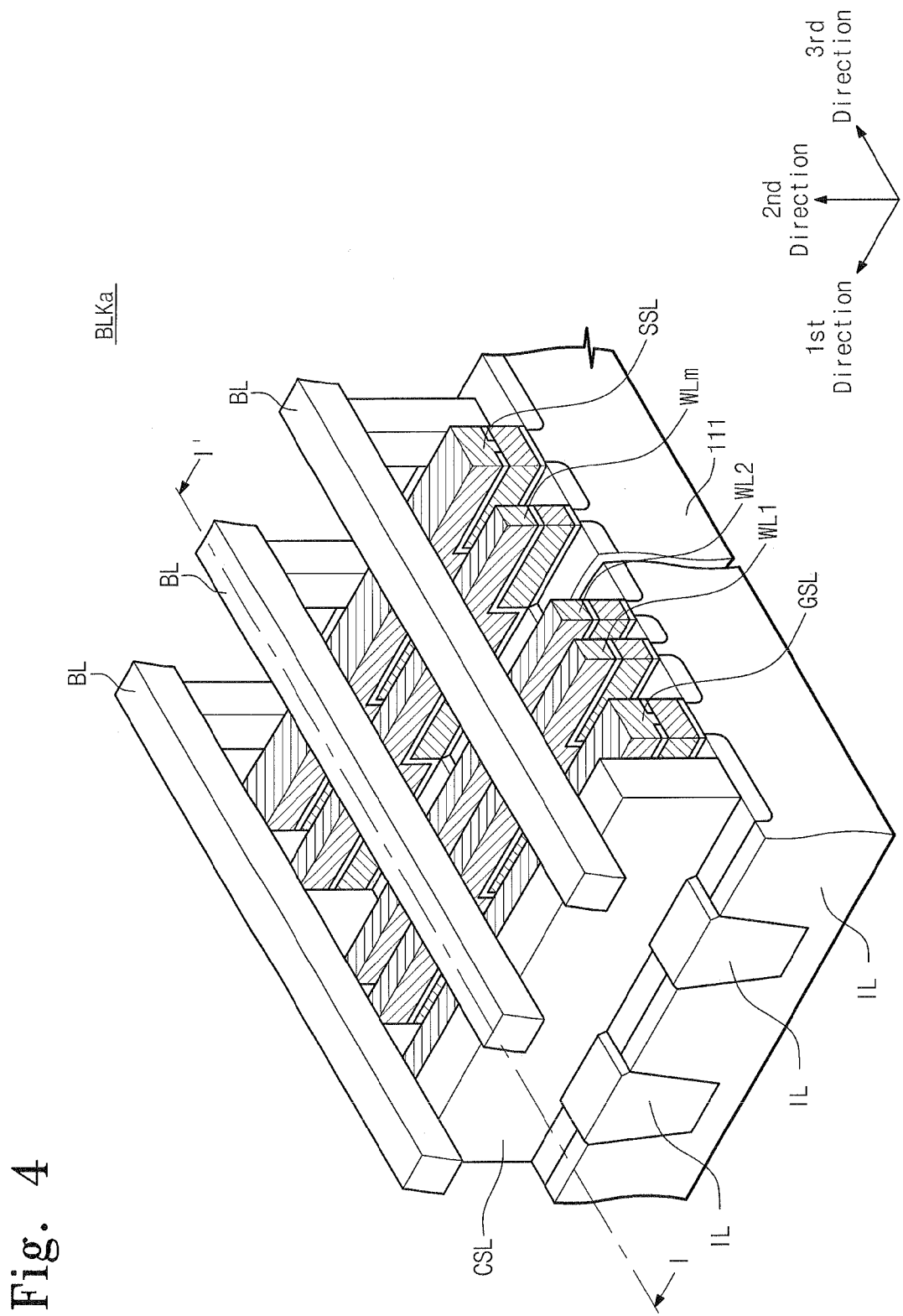
FIG. 4 is a perspective view illustrating a memory block according to an embodiment of the inventive concept.
Figure 5:
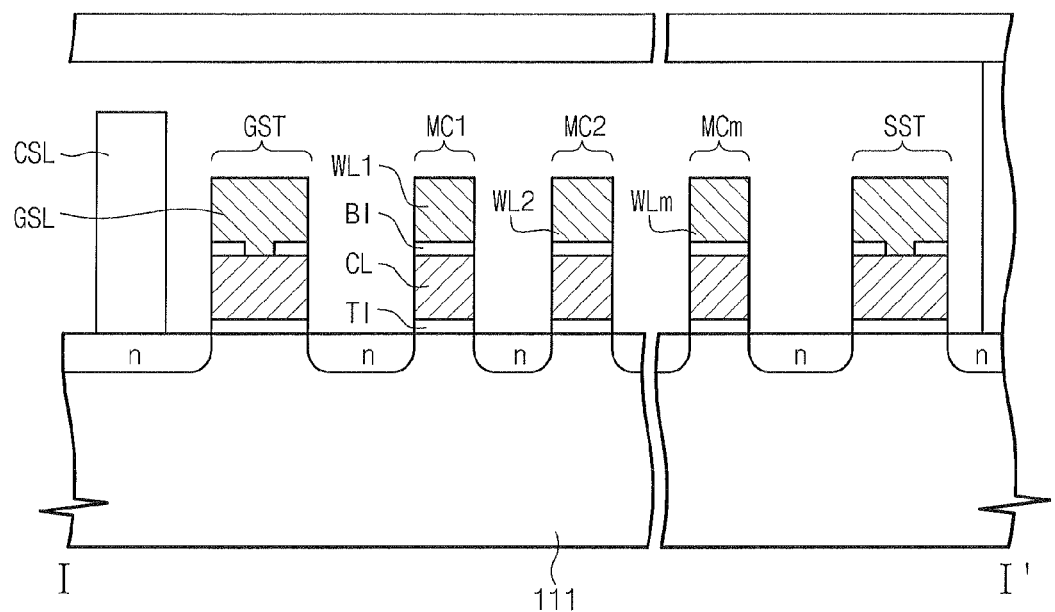
FIG. 5 is a sectional view taken along the line I-I' of the memory block of FIG. 4.

FIG. 4 is a perspective view illustrating one BLKa of the memory blocks BLK1 to BLKz of FIG. 2. FIG. 5 is a sectional view taken along the line I-I' of the memory block BLKa of FIG. 4. Referring to FIGS. 4 and 5, a device isolation layer IL is provided on the substrate 111 to define an active region. In an embodiment, it is shown that three active regions that extend along a third direction and is spaced along a first direction by a specific distance are defined. However, the number of active regions is not limited.

A tunnel insulation layer TI is provided on each active region. In each active region, the tunnel insulation layers TI are spaced along the third direction by a specific distance. For example, each tunnel insulation layer TI may include a thermal oxide layer. For example, each tunnel insulation layer TI may include an oxide layer.

In each active region, charge storage layers CL are provided on the tunnel insulation layers TI. For example, the charge storage layers CL may include a conductive material such as polysilicon. For example, each charge storage layer CL may include a nitride layer or a metal oxide layer (e.g., an aluminum oxide layer, or a hafnium oxide layer).

If the charge storage layers CL include a conductive material such as polysilicon, the charge storage layers CL may operate as floating gates. That is, the charge storage layers CL store data by accumulating charges. If the charge storage layers CL include an insulation material, the charge storage layers CL operate as charge trapping layers. That is, the charge storage layers CL store data by trapping charges.

The tunnel insulation layers TI and charge storage layers CL are provided along the first direction on a plurality of active regions. On an axial line where the tunnel insulation layers TI and the charge storage layers CL are provided along the first direction, block insulation layers BI are provided along the first direction. Each block insulation layer BI may include a nitride layer. Each blocking insulation layer BI may include a high dielectric layer (e.g., an aluminum oxide layer, or a hafnium oxide layer) having a higher dielectric constant than the tunneling insulation layers TI.

A polysilicon layer is provided on the tunnel insulation layers TI. The polysilicon layer extends along the first direction on a plurality of active regions. The polysilicon layer is spaced along the third direction by a specific distance.

Each of the tunneling insulation layer TI, the charge storage layer CL, the blocking insulation layer BI, and the polysilicon layer constitutes a gate structure. In an embodiment, each of the tunneling insulation layer TI, the charge storage layer CL, the blocking insulation layer BI, and the polysilicon layer may constitute a memory cell MC. In an embodiment, perforation is formed in the blocking insulation layer BI such that the polysilicon layer and the charge storage layer CL may be connected. This gate structure may form a selection transistor SST or GST.

In an embodiment, if the charge storage layer CL includes an insulation material, perforations may not be provided at a blocking insulation layer BI of a gate structure. That is, a charge storage layer CL and a control polysilicon layer of a gate structure of a selection transistor SST or GST may not be separated by a blocking insulation layer BI.

In an embodiment, a polysilicon layer forming a gate structure of a memory cell may extend along the first direction to form a word line WL. In an embodiment, the polysilicon layer forming a gate structure of the selection transistor SST or GST extends along the first direction to form a selection line SSL or GSL.

Junction regions having an n conductive type are formed between gate structures. In an embodiment, a source and a drain of a selection transistor SST or GST is formed simultaneously. A conductive material extending along the first direction is provided on a source of a ground selection transistor GST. This conductive material forms a common source line CSL. For example, the common source line CSL may include polysilicon. For example, the common source line CSL may include a metal material.

A bit line contact BP connected to a bit line BL is provided on a drain of the string selection transistor SST. That is, a drain of the string selection transistor SST is connected to a corresponding bit line BL through the bit line contact BP. Bit lines are provided on the same axial line as the active regions. As an example, three bit lines are shown.

Figure 6:
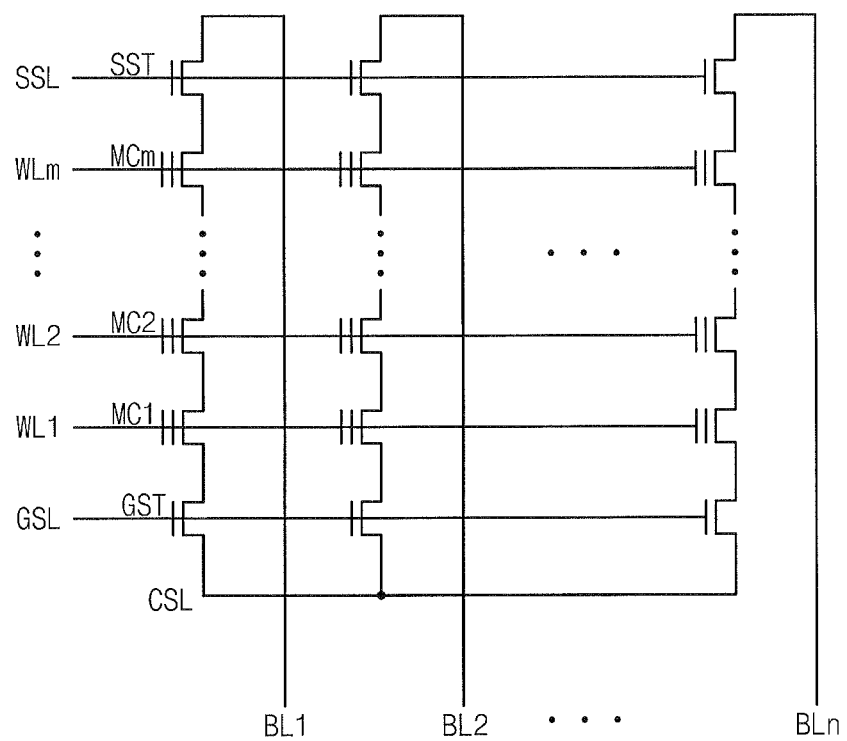
FIG. 6 is a circuit diagram illustrating an equivalent circuit of the memory block described with reference to FIGS. 4 and 5.

FIG. 6 is a circuit diagram BLKa_1 of the memory block BLKa described with reference to FIGS. 4 and 5. Referring to FIG. 6, memory cells provided along a row direction are connected to the word lines WL1 to WLm. The memory cell MC of the same row is connected to the same word line WL.

The memory cells MC provided along a column direction correspond to bit lines BL1 to BLn. The memory cells MC of the same column correspond to the same bit lines BL.

String selection transistors SST are provided between the memory cells MC and the bit lines BL1 to BLn. The string selection transistors SST are commonly connected to one string selection line SSL.

Ground selection transistors GST are connected between the memory cells MC and the common source line CLS. The ground selection transistors GST are commonly connected to one ground selection line GSL.

Figure 7:
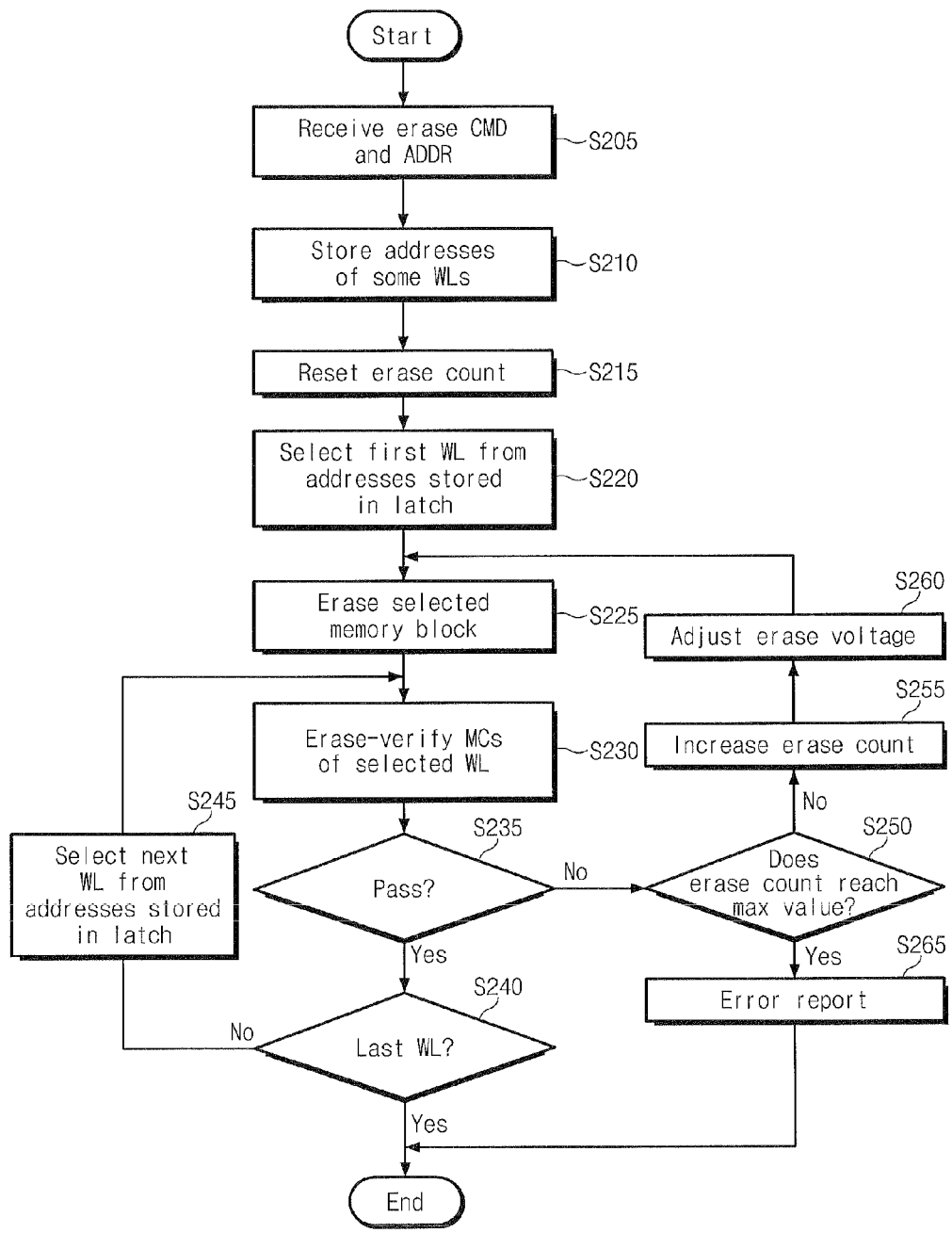
FIG. 7 is a flowchart illustrating a method of operating a nonvolatile memory device according to an embodiment of the inventive concept.

FIG. 7 is a flowchart illustrating a method of operating a nonvolatile device according to an embodiment of the inventive concept. Referring to FIGS. 1 through 7, in operation S205, an erase command and an address are received. For example, the received address corresponds to one of a plurality of memory blocks BLK1 to BLKz of the nonvolatile memory device 100a. Among the plurality of memory blocks BLK1 to BLKz, a memory block (e.g., BLKa) corresponding to the received address is selected. The received address corresponds to at least one string selection line SSL.

In operation S210, addresses of some of word lines (i.e., partial word line addresses) are stored. For example, the addresses of some of a plurality of word lines corresponding to the received address are stored. For example, the addresses of some of the word lines among the selected memory block BLKa are stored in the word line address latch 177. For example, the addresses of some of the word lines are stored in the word line address latch 177 from the fuse unit 180.

In operation S215, an erase count is reset. For example, the erase count is reset to 1.

In an embodiment, operations S210 and S215 may be construed as initialization of the erase operation. The initialization of operations S210 and 215 may be performed regardless of the order.

In operation S220, a first word line is selected from the addresses stored in the word line address latch 180. For example, a first word line among some of the word lines corresponding to the addresses stored in the word line address latch 180 is selected.

In operation S225, memory cells MC corresponding to the received address are erased. For example, the selected memory block BLKa is erased. The control logic 170a controls the address decoder 120, the read & write unit 130, and the voltage generating unit 160 to erase the selected memory block BLKa.

In operation S230, the selected word line is erase-verified. For example, the control logic 170a controls the address decoder 120, the read & write unit 130, and the voltage generating unit 160 to erase-verify memory cells MC corresponding to the selected word line.

In operation S235, it is determined whether an erase-verification result is passed or not. For example, according to whether a pass signal or a fail signal is received from the pass/fail check unit 140, it is determined as being erase-passed or erase-failed. If the erase-verification result is Pass, it proceeds to operation S240.

In operation S240, it is determined whether it is the last word line. For example, the control logic 170a determines whether the selected word line is the last word line among some of the word lines corresponding to the addresses stored in the word line address latch 177. If the selected word line is not the last word line, operation S245 is performed.

In operation S245, a next word line is selected from the addresses stored in the word line address latch 177. For example, the next word line of erase-verified word line is selected from some of the word lines corresponding to the addresses stored in the word line address latch 177. Thereafter, erase-verification is again performed in operations S230 and S235.

As shown in operations S235 through S245, when the selected word line is erase-passed, the next word line is selected. That is, if the selected word line is the last word line, all of some of the word lines corresponding to the addresses stored in the word line address latch 177 are in an erase-passed state. Accordingly, the erase operation of the selected memory block BLKa is terminated.

In operation S235, if the erase-verification result is failed, it proceeds to operation S250. In operation S250, it is determined whether the erase count reaches the maximum value. In an embodiment, the maximum value of the erase count is the maximum number that an erase voltage (or an erase pulse)

is applied to the selected block during an erase operation. If the erase count does not reach the maximum value, it proceeds to operation S255.

In operation S255, the erase count is increased. Later, in operation S260, the erase voltage is adjusted. For example, the level of the erase voltage is increased. Next, the erase (in operation S225) and the erase-verification (in operations S230 to S235) of the selected memory block BLKa are performed again.

In operation S250, if the erase count reaches the maximum value, operation S265 is performed. In operation S265, an error report is generated. For example, the control logic 170a generates an error report representing that an error has occurred during an erase operation. The generated error report is provided to a host of the nonvolatile memory device 100a.

The selected word line can be erase-verified in the selected memory block BLKa. That is, the selected memory block BLKa is erase-verified on a per-word line basis.

If the erase-verification result is erase-failed, the erase and erase-verification are performed while maintaining selection of word line. That is, the erase-verification resumes from the erase-failed word line.

Some of the word lines corresponding to the addresses stored in the word line address latch 177 among the word lines of the selected memory block BLKa are erase-verified.

In an embodiment, some of the word lines that are erase-verified during the erase operation include word lines connected to memory cells MC of relatively slow erase speed among the word lines of the nonvolatile memory device 100a. Accordingly, data integrity during the erase operation of the nonvolatile memory device 100a can be ensured, and the operation speed can be improved.

In an embodiment, some of the word lines that are erase-verified may be selected through a test of the erase operation of the nonvolatile memory device 100a. The addresses of the selected word lines are stored in the fuse unit 180 by controlling the fuse of the fuse unit 180. In an embodiment, some of the word lines that are erase-verified may be identical in the memory blocks BLK1 to BLKz of the nonvolatile memory device 100a. For example, when i-th, j-th, and k-th word lines are erase-verified during the erase operation of the first memory block, the i-th, j-th, and the k-th word lines may be erase-verified during the erase operation of other memory blocks. However, the erase-verified word lines are not limited to the same word lines in the memory blocks BLK1 to BLKz. For example, the address and number of the erase-verified word lines may vary in the memory blocks BLK1 to BLKz.

Figures 8, 9:
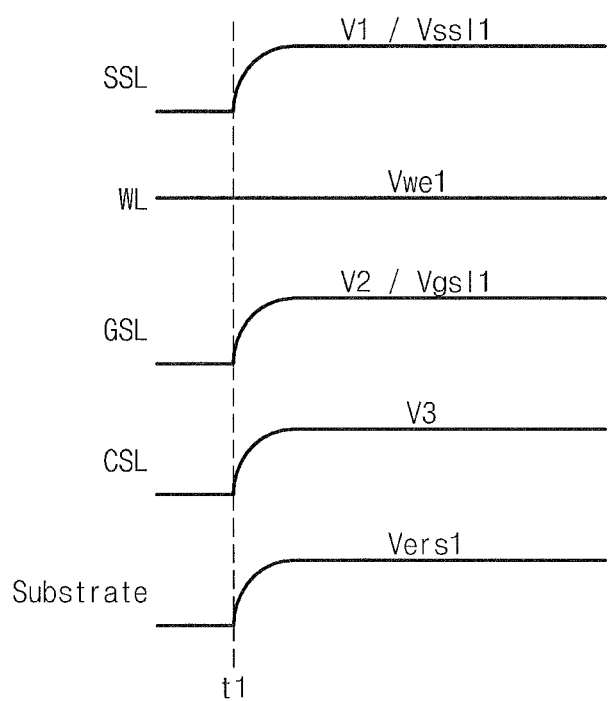
FIG. 8 is a table illustrating voltage conditions during an erase operation of the nonvolatile memory device of FIG. 1.
FIG. 9 is a timing diagram illustrating a voltage change according to voltage conditions of FIG. 8.

FIG. 8 is a table illustrating voltage conditions during an erase operation of the nonvolatile memory device 100a of FIG. 1. Referring to FIGS. 1 through 8, the string selection line SSL of the selected memory block BLKa may float or may be driven using a first string selection line voltage Vssl1.

A first word line erase voltage Vwe1 is applied to word lines WL of the selected memory block BLKa. For example, the first word line erase voltage Vwe1 may be a low voltage. For example, the first word line erase voltage Vwe1 may be a ground voltage Vss.

The ground selection line GSL of the selected memory block BLKa may float or may be driven by a first ground selection line voltage Vgsl1. A common source line CSL may float. A first erase voltage Vers1 may be applied to the substrate 111.

FIG. 9 is a timing diagram illustrating a voltage change according to voltage conditions of FIG. 8. Referring to FIGS. 1 through 9, at the first timing t1, the first word line erase voltage Vwe1 is applied to word lines of the selected memory block BLKa and the first erase voltage Vers is applied to the substrate 111. In an embodiment, the levels of the first word line erase voltage Vwe1 and the first erase voltage Vers1 are set such that Fowler-Nordheim tunneling occurs by a voltage difference between the first word line erase voltage Vwe1 and the first erase voltage Vers1. Accordingly, memory cells MC are erased.

If the string selection line SSL of the selected memory block BLKa floats, the string selection line SSL may be affected by coupling from the substrate 111. As a voltage of the substrate 111 is increased to the first erase voltage Vers1, a voltage of the string selection line SSL may be increased to a first voltage V1. If the first string selection line voltage Vssl1 is applied to the string selection line SSL, a voltage of the string selection line SSL may be controlled by the first string selection line voltage Vssl1. In an embodiment, levels of the first voltage V1 and the first string selection line voltage Vssl1 may be different from each other.

If the ground selection line GSL of the selected memory block BLKa floats, the ground selection line GSL may be affected by coupling from the substrate 111. As a voltage of the substrate 111 is increased to the first erase voltage Vers1, a voltage of the ground selection line GSL may be increased to a second voltage V2. If the first ground selection line voltage Vgsl1 is applied to the ground selection line GSL, a voltage of the ground selection line GSL may be controlled by the first ground selection line voltage Vgsl1. In an embodiment, levels of the second voltage V2 and the first string selection line voltage Vssl1 may be different from each other.

A source of the ground selection transistor GST forms a p-n forward junction with the substrate 111. Accordingly, the first erase voltage Vers1 is delivered to the common source line CSL through a source of the ground selection transistor GST. For example, a voltage of the common source line CSL may be increased to a third voltage V3.

FIG. 10 is a table illustrating voltage conditions during ease verification of the nonvolatile memory device 100a of FIG. 1. Referring to FIGS. 1 through 7 and 10, a first bit line voltage Vbl1 is applied to bit lines BL. For example, the first bit line voltage Vbl1 is a power voltage Vcc.

A second string selection line voltage Vssl2 is applied to the string selection line SSL of the selected memory block BLKa. For example, the second string selection line voltage Vssl2 may be a voltage for turning on the string selection transistors SST. For example, the second string selection line voltage Vssl2 may be a power voltage Vcc.

Erase-verification according to an embodiment of the inventive concept is performed on a per-word line basis. Accordingly, a voltage of the selected word line and voltages of the word lines are controlled differently. A first verify voltage Vvfy1 is applied to a selected word line of the selected memory block BLKa. For example, the first erase verify voltage Vvfy1 is set as the upper limit of a threshold voltage required for memory cells in an erase state. For example, the first erase verify voltage Vvfy1 may be a ground voltage Vss.

A first non-selection word line voltage Vuwl1 is applied to unselected word lines of the selected memory block BLKa. For example, the first non-selection word line voltage Vuwl1 is a voltage for turning on memory cells MC regardless of a logic state of the memory cells MC. For example, the first non-selection word line voltage Vuwl1 may be a non-selection read voltage Vread applied to the unselected word lines during a read operation or a pass voltage Vpass applied to the unselected word lines during a program operation.

A second ground selection line voltage Vgsl2 is applied to the ground selection line GSL of the selected memory block BLKa. For example, the second ground selection line voltage Vgsl2 is a voltage for turning on the ground selection transistors. For example, the second ground selection line voltage Vgsl2 may be a power voltage Vcc.

A common source line voltage Vcsl1 is applied to the common source line CSL. For example, the first common source line voltage Vcsl1 may be a ground voltage Vss.

Figure 11:
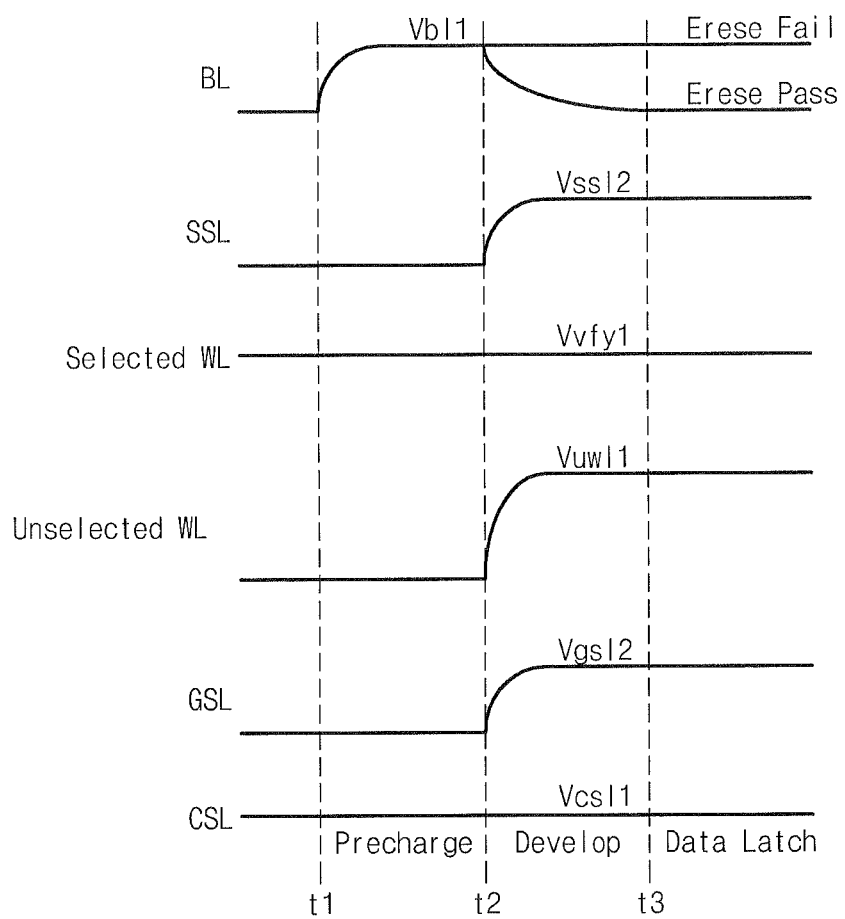
FIG. 11 is a timing diagram illustrating a voltage change according to voltage conditions of FIG. 10.

FIG. 11 is a timing diagram illustrating a voltage change according to voltage conditions of FIG. 10. Referring to FIGS. 1 through 7, 10, and 11, pre-charging is performed at the first timing t1. A first bit line voltage Vbl1 is applied to bit lines BL. The bit lines BL are pre-charged with the first bit line voltage Vbl1. After the pre-charging of the bit lines BL, the bit lines BL may float.

Developing is performed at the second timing t2. A second string selection line voltage Vssl2 is applied to a string selection line SSL of the selected memory block BLKa. That is, string selection transistors SST of the selected memory block BLKa are turned on.

A second ground selection line voltage Vgsl2 is applied to the ground selection line GSL of the selected memory block BLKa. That is, ground selection transistors GST of the selected memory block BLKa are turned on.

A first non-selection word line voltage Vuwl1 is applied to the unselected word lines of the selected memory block BLKa. That is, memory cells MC connected to the unselected word lines of the selected memory block BLKa are turned on.

A first erase verify voltage Vvfy1 is applied to a selected word line of the selected memory block BLKa. If a threshold voltage of the memory cell MC connected to the selected word line is higher than the first erase verify voltage Vvfy1, the corresponding memory cell MC may be turned off. That is, since no channel is formed between the bit line BL and the common source line CSL, a voltage of the bit line BL maintains the first bit line voltage Vbl1.

If a threshold voltage of the memory cell MC connected to a selected word line is lower than a first erase verify voltage Vvfy1, a corresponding memory cell MC may be turned on. That is, a channel is formed between the bit line BL and the common source line CSL. The first bit line voltage Vbl1 pre-charged to the bit line BL is discharged to the common source line CSL. That is, a voltage of the bit line BL becomes lower than the first bit line voltage Vbl1.

Data latching is performed at the third timing t3. For example, according to voltage levels of the bit lines BL, erase-pass and erase-fail are determined. For example, if voltages of the bit lines BL are lower than the first bit line voltage Vbl1, the selected word line may be determined as being erase-passed. When at least one voltage of the bit lines BL maintains the first bit line voltage Vbl1, the selected word line may be determined as being erase-failed.

In an embodiment, according to error correction ability of the nonvolatile memory device 100a or a host of the nonvolatile memory device 100a, a determination criterion of the erase-pass and erase-fail about the selected word line may vary. For example, if the error correction ability of the nonvolatile memory device 100a or a host of the nonvolatile memory device 100n is improved, the selected word line may be determined as being erase-passed even if at least one voltage of the bit lines BL maintains the first bit line voltage Vbl1.

Figure 12:
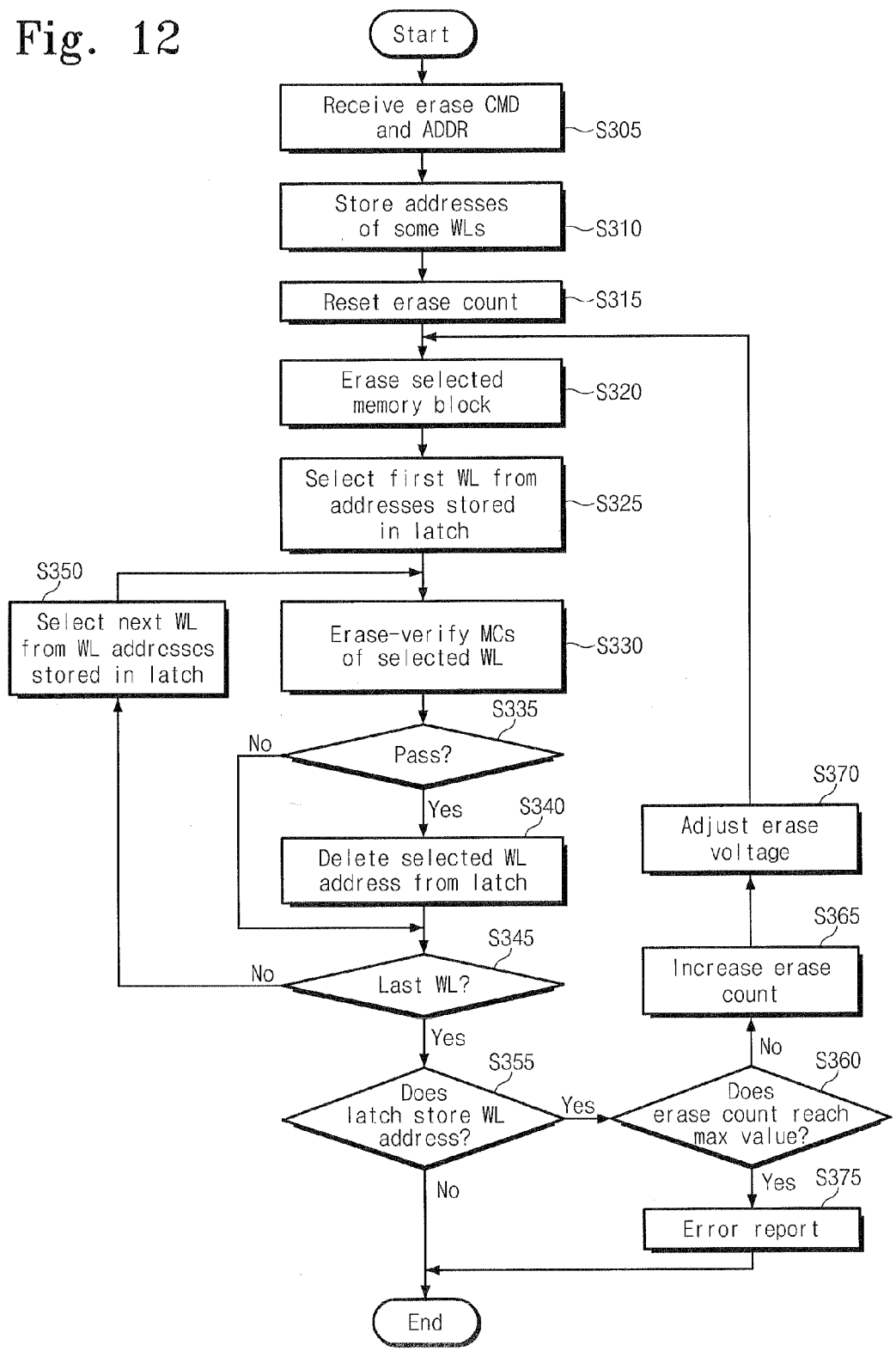
FIG. 12 is a flowchart illustrating a method of operating a nonvolatile memory device according to an embodiment of the inventive concept.

FIG. 12 is a flowchart illustrating a method of operating a nonvolatile memory device 100a according to an embodiment of the inventive concept. Referring to FIGS. 1 and 12, an erase command and an address are received in operation S305. For example, the received address corresponds to one of the plurality of memory blocks BLK1 to BLKz of the nonvolatile memory device 100b. A memory block (e.g., BLKa) corresponding to the received address among the plurality of memory blocks BLK1 to BLKz is selected. For example, the received address corresponds to at least one string selection line SSL.

In operation S310, the addresses of some of word lines are stored. For example, the addresses of some of word lines corresponding to the received address are stored. For example, the addresses of some of the word lines among the word lines of the selected memory block BLKa are stored in the word line address latch 177. For example, the addresses of some of the word lines are stored in the word line address latch 177 from the fuse unit 180.

In operation S315, an erase count is reset. For example, the erase count is reset to 1.

In an embodiment, operations S310 and S315 may be construed as initialization of erase operation. The initialization of operations S310 and S315 may be performed regardless of the order.

In operation S320, memory cells MC corresponding to the received address are erased. For example, the selected memory block BLKa may be erased.

In operation S325, a first word line is selected from the addresses stored in the word line address latch 177. For example, the first word line is selected from the word lines corresponding to the addresses stored in the word line address latch 177.

In operation S330, the selected word line is erase-verified. A plurality of memory cells MC corresponding to the selected word line are erase-verified.

In operation S335, it is determined whether a verification result is passed or not. If the selected word line is determined as being erase-passed, the address of the selected word line is erased in operation S340. Next, operation S440 is performed. Thereafter, operation 345 is performed. If the selected word line is determined as being erase-failed, operation S3340 is omitted and operation S345 is performed.

In operation S345, it is determined whether the selected word line is the last word line or not. For example, it is determined whether the selected word line is the last word line among some of the word lines corresponding to addresses stored in the word line address latch 177. If the selected word line is not the last word line, the next word line is selected from addresses stored in the word line address latch 177 in operation S350. Next, operations S330 through S345 are performed again. If the selected word line is the last word line, operation S355 is performed.

In operations S330 through S350, some of the word lines corresponding to the addresses stored in the word line address latch 177 among the word lines of the selected memory cells BLKa are erase-verified. The address of the erase-passed word line is erased from the word line address latch 177. That is, when operations S330 through S350 are performed, addresses of the erase-failed word lines among the addresses of some of the word lines transmitted from the fuse unit 180 remain in the word line address latch 177.

In operation S355, it is determined whether an address is stored in the word line address latch 177. If an address is not stored in the word line address latch 177, it means that some of the word lines corresponding to the addresses transmitted from the fuse unit 180 have been erase-passed. Accordingly, an erase operation is terminated. If at least one address is stored in the word line address latch 177, it means that at least one of some of the word lines corresponding to the addresses transmitted from the fuse unit 180 has been erase-failed.

In operation S360, it is determined whether the erase count reaches the maximum value or not. If the erase count does not reach the maximum value, the erase count is increased in operation S365. An erase voltage Vers is adjusted in operation S370. For example, the level of the erase voltage Vers may be increased. Thereafter, the erase operation (operation S320) and erase-verification (operations S325 through S345) of the selected memory block BLKa are again performed.

If the erase count has reached the maximum value, an error report is generated in operation S375. For example, the control logic 170b generates an error report representing that an error has occurred during an erase operation. The generated error report may be provided to a host of the nonvolatile memory device 100b.

Figure 13:
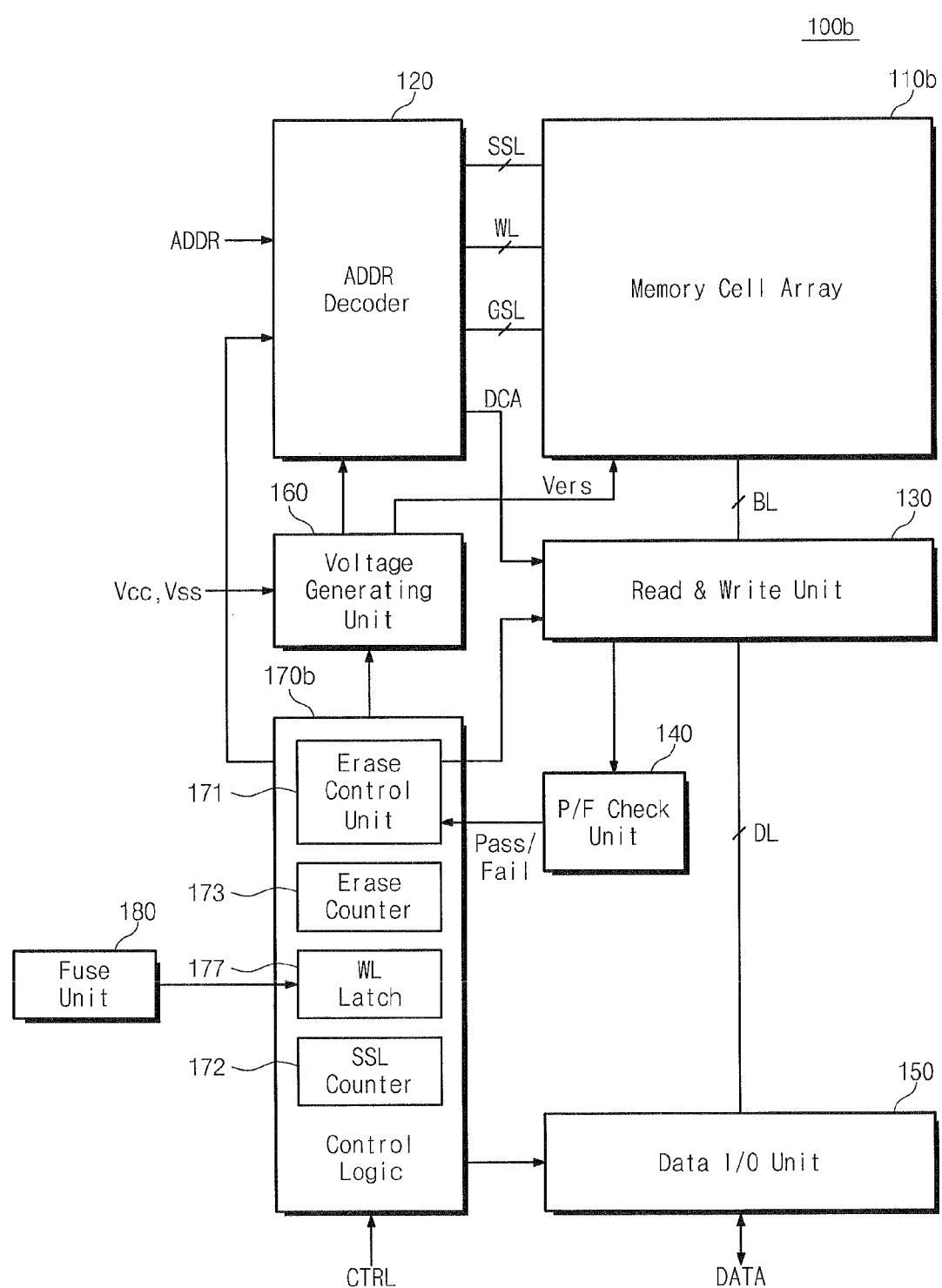
FIG. 13 is a block diagram illustrating a nonvolatile memory device according to an embodiment of the inventive concept.

FIG. 13 is a block diagram of a nonvolatile memory device 100b according to an embodiment of the inventive concept. Referring to FIG. 13, the nonvolatile memory device 100b includes a memory cell array 110b, an address decoder 120, a read & write unit 130, a pass/fail check unit 140, a data input/output unit 150, a voltage generating unit 160, a control logic 170b, and a fuse unit 180. Except for the memory cell array 110b and the control logic 170b, the nonvolatile memory device 100b has substantially the same structure as the nonvolatile memory device 100a described with reference to FIG. 1.

The memory cell array 110b is connected to the address decoder 120 through word lines WL, string selection lines SSL, and ground selection lines GSL. Additionally, the memory cell array 110b is connected to the read & write unit 130 through the bit lines BL. As shown in FIG. 2, the memory cell array 110b includes a plurality of memory blocks BLK1 to BLKz. A plurality of string selection lines SSL, a plurality of word lines WL, and at least one ground selection line GSL are provided in each memory block.

The memory cell array 110b includes a plurality of memory cell groups. For example, the memory cell array 110b includes memory cell groups disposed on a substrate along the row and column directions. Each memory cell group includes a plurality of memory cells stacked along a direction intersecting the substrate. That is, the memory cells are provided on the substrate along the row and column, and are stacked in a direction intersecting the substrate to form a three-dimensional structure. In an embodiment, the memory cell array 110b includes a plurality of memory cells storing at least one bit in each cell.

The control logic 170c includes an erase control unit 171, an erase counter 173, a word line address latch 177, and a string selection line counter (hereinafter, referred to as a SSL counter) 172. The erase control unit 171 is configured to control an erase operation of the nonvolatile memory device 100b. For example, the erase control unit 171 controls erase and erase-verification. For example, the erase control unit 171 controls erase and erase-verification based on information stored in the erase counter 173, information stored in the word line address latch 177, information stored in the SSL counter 172, and information transmitted from the pass/fail check unit 140.

An erase count of the erase counter 173 represents how many times a specific memory block of the memory cell array 110a is erased during an erase operation.

The word line address latch 177 is configured to store an address of at least one word line WL of a specific memory block. The word line address latch 177 is configured to store addresses of some of the word lines WL of the specific memory block. In an embodiment, the addresses of some of the word lines WL may be stored in the word line address latch 177 from the fuse unit 180.

A count value of the SSL counter 172 represents an address of the string selection line SSL of the selected memory block. For example, the count value of the SSL counter 172 represents one address of the string selection lines SSL of the selected memory block. Hereinafter, the count value of the SSL counter 172 is defined as a SSL count.

Figure 14:
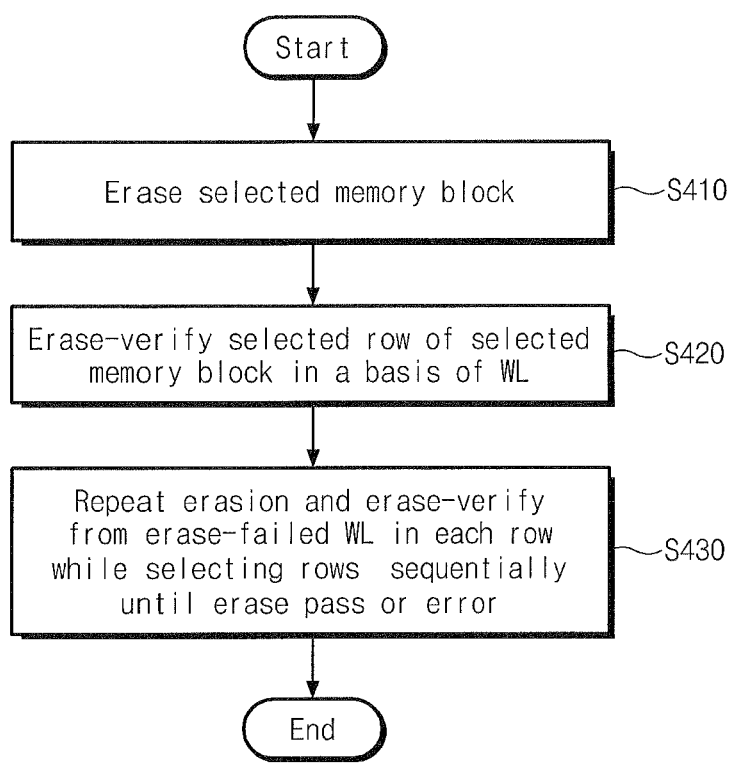
FIG. 14 is a flowchart illustrating an operating method of the nonvolatile memory device of FIG. 13.

FIG. 14 is a flowchart illustrating an operating method of the nonvolatile memory device 100b of FIG. 13. Referring to FIGS. 13 and 14, the selected memory block is erased in operation S410. For example, a memory block selected from the memory blocks BLK1 to BLKz of the memory cell array 110b may be erased.

In operation S420, a selected row of the selected memory block is erase-verified on a per-word line basis. For example, if a first row of the selected memory block is selected, it may be erase-verified on a per-word line basis. If an i-th row of the selected block is selected, it may be erase-verified on a per-respective word line basis. In an embodiment, one of some of the word lines corresponding to the addresses stored in the word line address latch 177 may be selected.

In operation S430, until it is erase-passed or an error occurs, rows are sequentially selected and erase-verification is repeated from the erase and erase failed word line in each row.

That is, the selected memory block is erase-verified on a per-word line basis. Erase-verification resumes from the erase-failed word line. Some of the word lines of the selected memory block are erase-verified.

Figure 15:
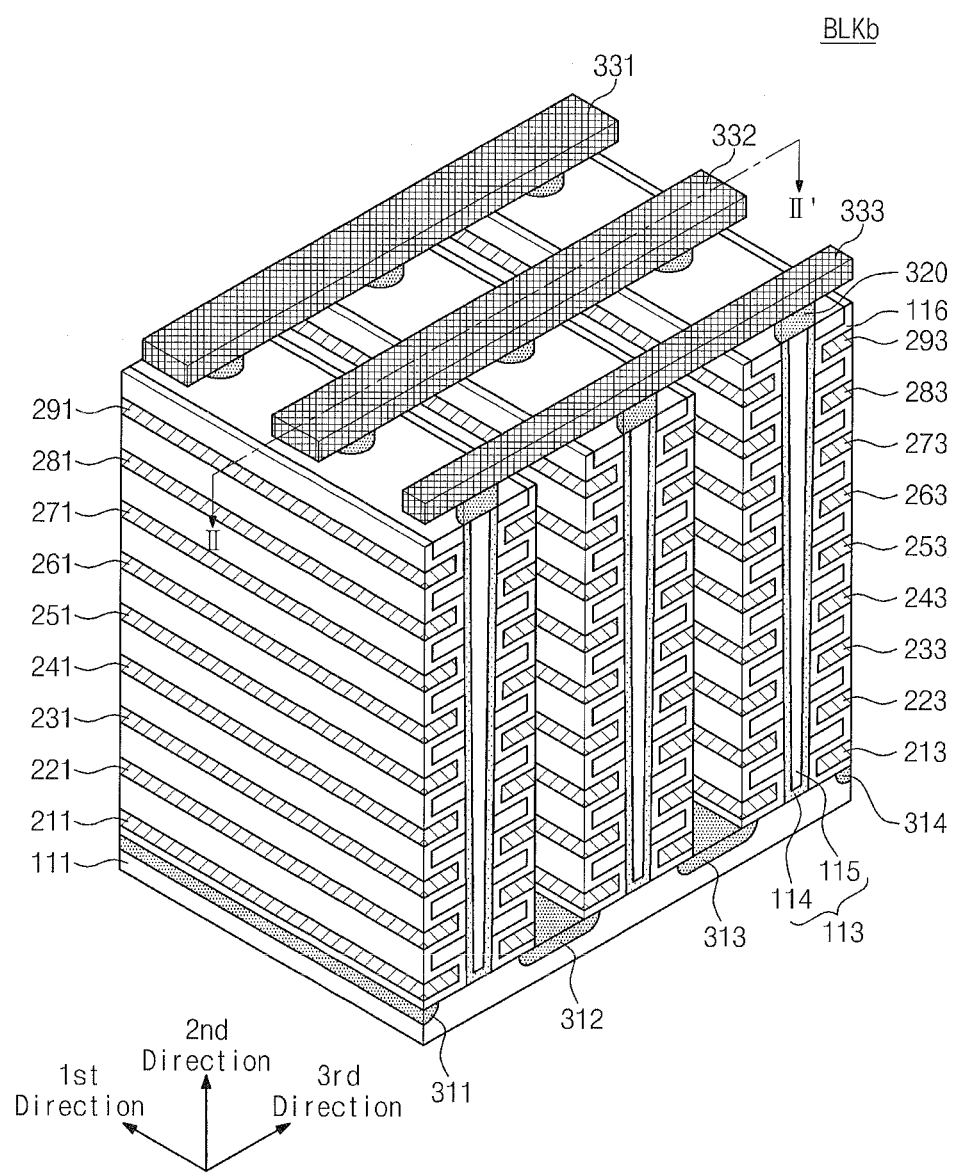
FIG. 15 is a perspective view illustrating a memory block of a nonvolatile memory device according to an embodiment of the inventive concept.
Figure 16:
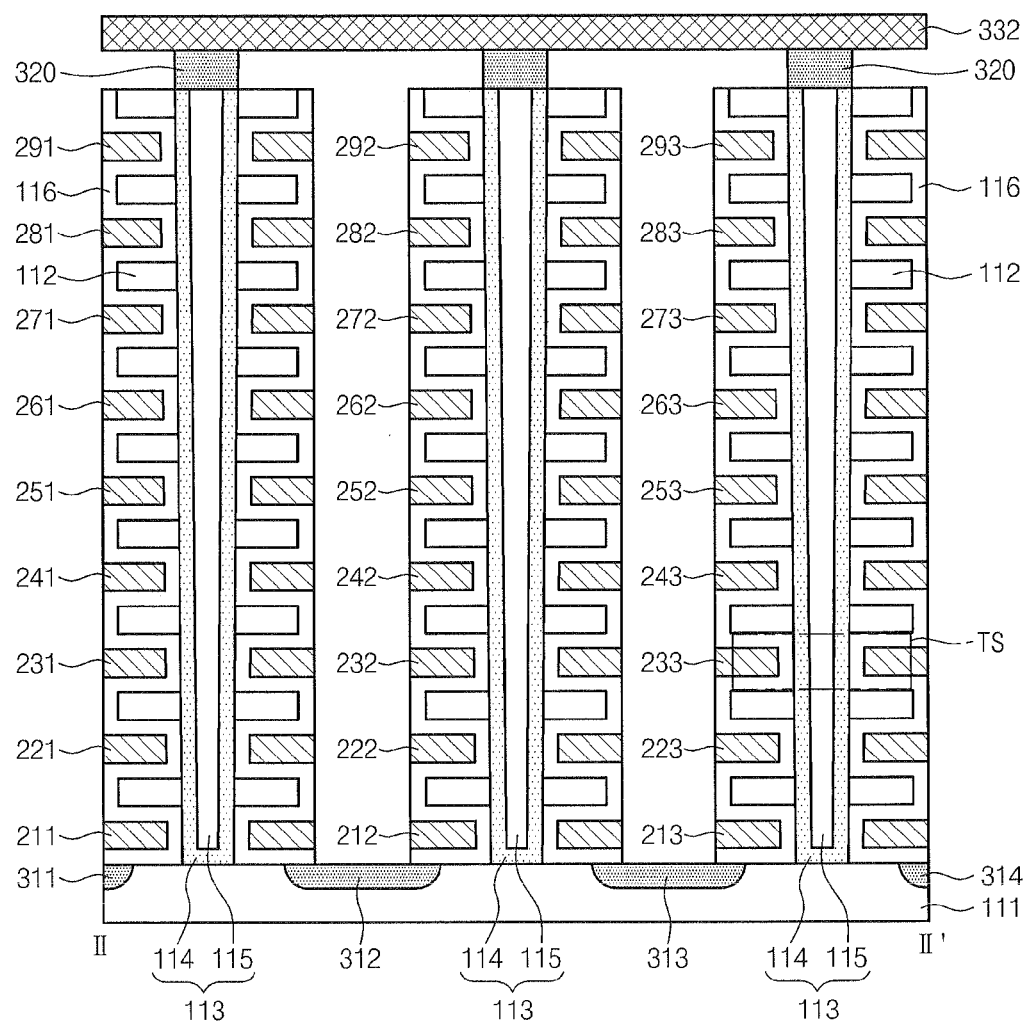
FIG. 16 is a sectional view taken along the line II-II' of the memory block of FIG. 15.

FIG. 15 is a perspective view illustrating one BLKb of memory blocks BLK1 to BLKz of the nonvolatile memory device 100b of FIG. 13 according to an embodiment of the inventive concept. FIG. 16 is a sectional view taken along the line II-II' of the memory block BLKb of FIG. 15. Referring to FIGS. 15 and 16, the memory block BLKb includes structures extending along the first to third directions.

A substrate 111 is provided. In an embodiment, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. Hereinafter, it is assumed that the substrate 111 has a p-type well (or a p-type packet well). However, the conductive type of the substrate 111 is not limited to the p-type.

A plurality of doping regions 311 to 314 extending along the first direction are provided on the substrate 111. For example, the plurality of doping regions 311 to 314 may have a second type (e.g., a second conductive type) different from the first type of the substrate 111. The first to fourth doping regions 311 to 314 may have an n-type. However, the conductive type of the first to fourth doping regions 311 to 314 is not limited to the n-type.

A plurality of insulation materials 112 extending along the first direction are sequentially provided along the second direction on a region of the substrate 111 between the first and second doping regions 311 and 312. For example, the plurality of insulation materials are provided along the second direction, being spaced by a specific distance. In an embodiment, the insulation materials 112 may include an insulation material such as an oxide layer.

A plurality of pillars 113 penetrating the insulation materials along the second direction are sequentially disposed along the first direction on a region of the substrate 111 between the first and second doping regions 311 and 312. In an embodiment, the plurality of pillars 113 penetrate the insulation materials 112 to contact the substrate 111.

In an embodiment, each pillar 113 may comprise a plurality of materials. For example, a channel layer 114 of each pillar 113 may include a silicon material having a first type. For example, the channel layer 114 of each pillar 113 may include a silicon material having the same type as the substrate 111. The channel layer 114 of each pillar 113 may include p-type silicon. However, the channel layer 114 of each pillar 113 is not limited to the p-type silicon.

An internal material 115 of each pillar 113 may comprise an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. In an embodiment, the insulation layer 116 provided on the exposed surface in the second direction of the last insulation material 112 may be removed.

In an embodiment, the thickness of the insulation layer 116 may be less than the half of the distance between the insulation materials 112. That is, a region where a material besides the insulation materials 112 and the insulation layer 116 may be disposed is provided between the insulation layer 116 provided on the bottom of a first insulation material among the insulation materials 112 and the insulation layer 116 provided on the top of a second insulation material 116 at the bottom of the first insulation material.

First conductive materials 211 to 291 are provided on the exposed surface of the insulation layer 116 in a region between the first and second doping regions 311 and 312. For example, the first conductive material 211 extending along the first direction is provided between the insulation material 112 adjacent to the substrate 111 and the substrate 111. The first conductive material 211 extending along the first direction is provided between the insulation layer 116 at the bottom of the insulation material 112 adjacent to the substrate 111 and the substrate 111.

A first conductive material extending along the first direction is provided between the insulation layer 116 at the top of the specific insulation material among the insulation materials 112 and the insulation layer at the bottom of the insulation material disposed on the top of the specific insulation material. That is, a plurality of first conductive materials 221 to 281 extending along the first direction are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as polysilicon.

Substantially the same structures as those on the first and second doping regions 311 and 312 may be provided in a region between the second and third doping regions 312 and 313. In the region between the second and third doping regions 312 and 313 are provided a plurality of insulation materials 112 extending along the first direction, a plurality of pillars 113 disposed sequentially along the first direction and penetrating the plurality of insulation materials 112 along the third direction, an insulation layer 116 provided on the exposed surfaces of the plurality of insulation materials 112 and the plurality of pillars 113, and a plurality of conductive materials 212 to 292 extending along the first direction.

In a region between the third and fourth doping regions 313 and 314, the same structures as those on the first and second doping regions 311 and 312 may be provided. In an embodiment, in the region between the third and fourth doping regions 313 and 314 are provided a plurality of insulation materials 112 extending along the first direction, a plurality of pillars 113 sequentially disposed along the first direction and penetrating the plurality of insulation materials 112 along the third direction, an insulation layer 116 provided on the exposed surfaces of the plurality of insulation materials 112 and the plurality of pillars 113, and a plurality of first conductive materials 213 to 293 extending along the first direction.

Drains 320 are provided on the plurality of pillars 113, respectively. In an embodiment, the drains 320 may include silicon materials doped with a second type. For example, the drains 320 may include silicon materials doped with an n-type. The drains 320 may include n-type silicon materials. However, the drains 320 are not limited to the n-type silicon materials.

In an embodiment, the width of each drain 320 may be greater than that of the pillar 113. For example, each drain 320 may be provided in a pad form on the top of the corresponding pillar 113. In an embodiment, each drain 320 may extend to a portion of the channel layer 114 of the corresponding pillar 113.

The second conductive materials 331 to 333 extending along the third direction are provided on the drains. The second conductive materials 331 to 333 are disposed along the first direction, being spaced by a specific distance. The second conductive materials 331 to 333 are respectively connected to the drains 320 in a corresponding region. In an embodiment, the drains 320 and the second conductive material 333 extending along the third direction may be connected through each contact plug. The second conductive materials 331 to 333 may include metal. The second conductive materials 331 to 333 may include conductive materials such as polysilicon.

The first conductive materials 211 to 291, 212 to 292, and 213 to 293 sequentially have the first to ninth heights from the substrate 111. That is, the first conductive materials 211 to 213 adjacent to the substrate 111 have the first height. The first conductive materials 291 to 293 adjacent to the second conductive materials 331 to 333 have the ninth height. As an order from the substrate 111 of a specific conductive material among the first conductive materials 211 to 291, 212 to 292, and 213 to 293 is increased, the height of the first conductive material is increased.

Referring to FIGS. 15 and 16, the pillars 113, the insulation layer 116, and the plurality of first conductive materials 211 to 291, 212 to 292, and 213 to 293 form a string. For example, each pillar 113, an adjacent region of the insulation layer 116, and an adjacent region of the first conductive materials 211 to 291, 212 to 292, and 213 to 293 form a NAND string NS. The NAND string NS includes a plurality of transistor structures TS. The transistor structure TS will be described in more detail with reference to FIGS. 17 through 20.

Figure 17:
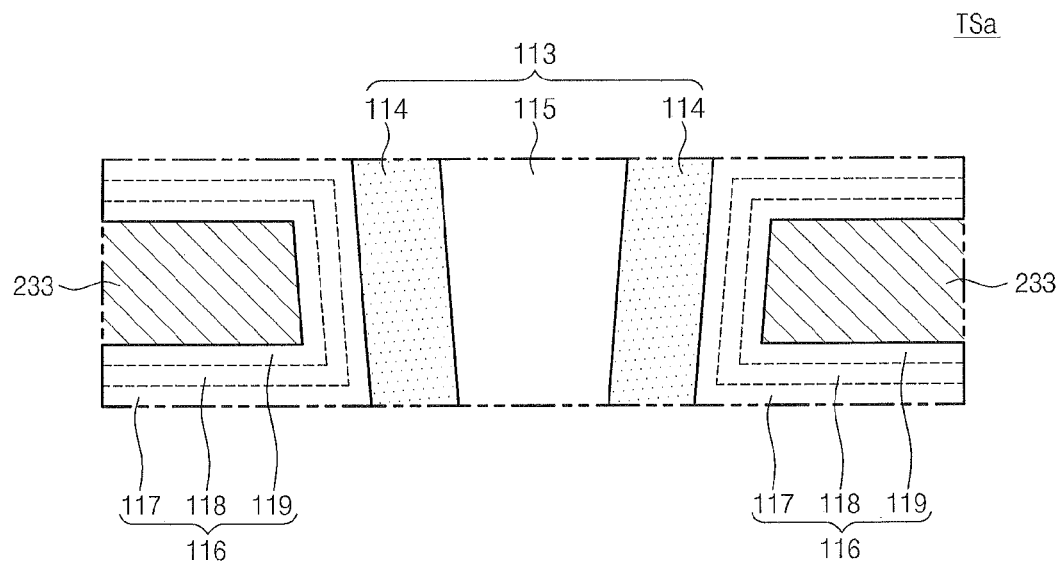
FIG. 17 is a sectional view illustrating a transistor structure according to an embodiment of the inventive concept.

FIG. 17 is a sectional view illustrating a transistor structure TSa according to an embodiment of the inventive concept. Referring to FIGS. 15 through 17, the insulation layer 116 includes first to third sub insulation layers 117, 118, and 119.

The channel layer 114 including the p-type silicon of the pillar 113 may operate as a body. The channel layer 114 including the p-type silicon of the pillar 113 operates as a body of the second direction.

The first sub insulation layer 117 adjacent to the pillar 113 may operate as a tunneling insulation layer. For example, the first sub insulation layer 117 adjacent to the pillar 113 may include a thermal oxide layer.

A second sub insulation layer 118 may operate as a charge storage layer. For example, the second sub insulation layer 118 may operate as a charge trapping layer. For example, the second sub insulation layer 118 may include a nitride layer or a metal oxide layer (e.g., an aluminum oxide layer, or a hafnium oxide layer).

A third sub insulation layer 119 adjacent to the first conductive material 233 may operate as a blocking insulation layer. In an embodiment, the third sub insulation layer 119 adjacent to the first conductive material 233 extending along the first direction may be formed of a single layer or a multi-layer structure. The third sub insulation layer 119 may be a high dielectric layer (e.g., an aluminum oxide layer, or a hafnium oxide layer) having a higher dielectric constant than those of the first and second sub insulation layers 117 and 118.

The first conductive material 233 may operate as a gate (or a control gate). That is, the first conductive material 233 operating as a gate (or a control gate), the third sub insulation layer 119 operating as a blocking insulation layer, the second sub insulation layer 118 operating as a charge storage layer, the first sub insulation layer 117 operating as a tunnel insulation layer, and the channel layer 114 of a p-type silicon operating as a body may operate as a transistor (or, a memory cell transistor).

The first to third sub insulation layers 117 to 119 may constitute an oxide-nitride-oxide (ONO).

In the memory block BLKb, one pillar 113 corresponds to one NAND string NS. For example, one pillar 113, the adjacent insulation layer 116, and the adjacent first conductive material form one NAND string NS.

The memory block BLKb includes a plurality of pillars 113. That is, the memory block BLKb includes a plurality of NAND strings NS. In more detail, the memory block BLKb extends along the second direction (or a direction perpendicular to the substrate) and includes a plurality of NAND strings NS provided along the first and third directions, being spaced by a specific distance.

Each NAND string NS includes a plurality of transistor structures TS stacked along the second direction. The plurality of transistor structures TS in each NAND string NS operate as a memory cell MC or a selection transistor. In each NAND string NS, at least one transistor structure TS may operate as a dummy memory cell DMC.

For example, in each NAND string NS, at least one transistor structure TS between the transistor structures TS operating as a memory cell MC and the substrate 111 operate as a ground selection transistor GST. In each NAND string, at least one transistor structure TS between the transistor structures TS operating as a memory cell MC and the second conductive materials 331 to 333 operates as a string selection transistor SST.

That is, the memory block BLKb is provided along a row (e.g., the first direction) and a column (e.g., the second direction) on the substrate 111, and includes a plurality of memory cells MC stacked in a direction (e.g., the third direction) intersecting the substrate 111. At least one selection transistor is provided between the memory cells MC and the substrate 111 and on the memory cells 111, respectively.

Gates (or control gates) correspond to the first conductive materials 211 to 291, 212 to 292, and 213 to 293 extending along the first direction. That is, it may be understood that the gates (or, control gates) form the word lines WL extending along the first direction and at least two selection lines SL (e.g., at least one string selection line SSL and at least one ground selection line GSL). The transistor structures TS provided at a specific height may operate as dummy memory cells. That is, the gates provided at the specific height extend along the first direction to form a dummy word line DWL.

The second conductive materials 331 to 333 extending along the third direction are connected to respective first ends of the NAND strings NS. In an embodiment, the second conductive materials 331 to 333 extending along the third direction operate as bit lines BL. That is, in one memory block BLKb, a plurality of NAND strings are connected to one bit line BL.

The second type doping regions 311 to 314 extending along the first direction are provided at respective second ends of the NAND strings NS. The second type doping regions 311 to 314 extending along the first direction operate as a common source line CSL.

The memory block BLKb includes a plurality of NAND strings NS extending along a direction (i.e., the second direction) intersecting the substrate 111 and operates as a NAND flash memory block (e.g., a charge trapping type) where a plurality of NAND strings are connected to one bit line BL in one memory block.

Figure 18:
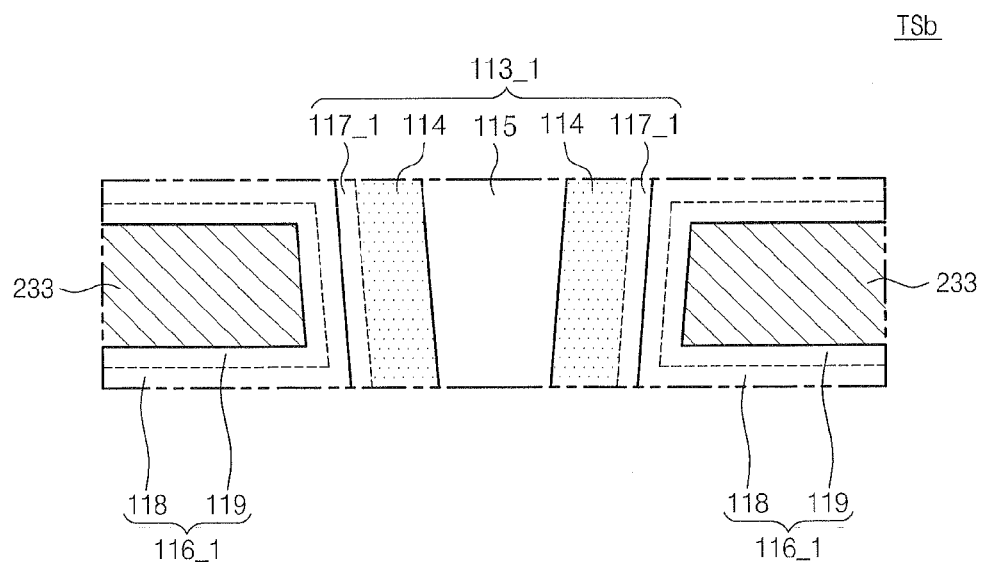
FIG. 18 is a sectional view illustrating a transistor structure according to an embodiment of the inventive concept.

FIG. 18 is a sectional view illustrating a transistor structure TSb according to an embodiment of the inventive concept. Referring to FIGS. 15, 16, and 18, a pillar 113_1 includes a channel layer 114, an internal material 115, and a first sub insulation layer 117_1.

The channel layer 114 may operate as a body of the second direction. The internal material 115 may include an insulation material. The first sub insulation layer 117_1 may operate as a tunneling insulation layer. The first sub insulation layer 117_1 that is a component of a pillar 113_1 may extend along a direction intersecting the substrate 111 between the substrate 111 and the drain 116. Exemplarily, the first sub insulation layer 117_1 may include the same material as the first sub insulation layer 117 described with reference to FIG. 17.

The insulation layer 116_1 includes a second sub insulation layer 118 and a third sub insulation layer 119. The second sub insulation layer 118 may operate as a charge trapping layer. The second insulation layer 118 may include substantially the same material as the second sub insulation layer 118 described with reference to FIG. 17.

The third sub insulation layer 119 may operate as a blocking insulation layer. The third sub insulation layer 119 may include substantially the same material as the third sub insulation layer 119 described with reference to FIG. 17.

Configurations of the pillar 113_1 and insulation layers 116_1 are different from the structure TSa of FIG. 17. However, the first to third sub insulation layers 117_1, 118, and 119 are provided between the first conductive material 233 and the channel layer 114. That is, as mentioned with reference to FIG. 17, the first conductive material 233, the first to third sub insulation layers 117_1, 118, and 119, and the channel layer 114 may operate as a transistor (or, a memory cell transistor).

Figure 19:
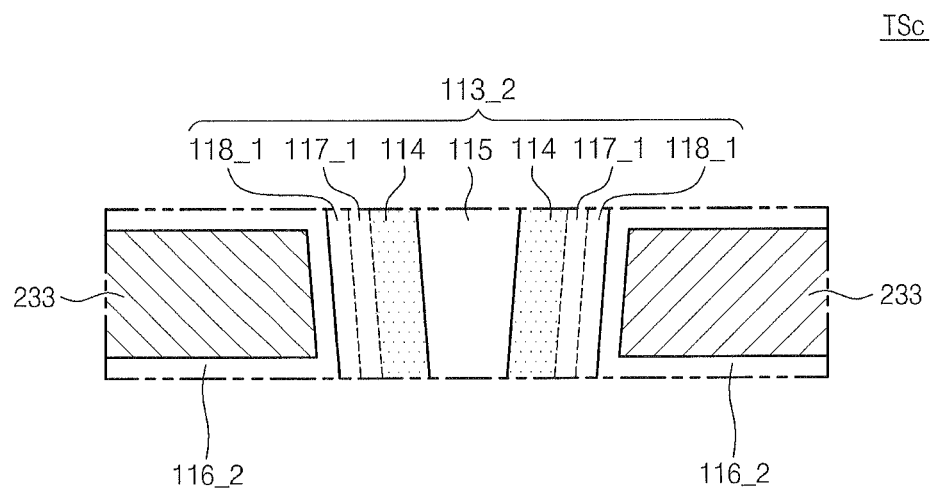
FIG. 19 is a sectional view illustrating a transistor structure according to an embodiment of the inventive concept.

FIG. 19 is a sectional view illustrating a transistor structure TSc according to an embodiment of the inventive concept. Referring to FIGS. 15, 16, and 19, a pillar 113_2 includes a channel layer 114, an internal material 115, a first sub insulation layer 117_1, and a second sub insulation layer 118_1.

The channel layer 114 may operate as a body of the second direction. The internal material 115 may include an insulation material. The first sub insulation layer 117_1 may operate as a tunneling insulation layer. The second sub insulation layer 118_1 may operate as a charge storage layer.

The first sub insulation layer 117_1 and the second insulation layer 118_1 which are components of the pillar 113_2 may extend along a direction intersecting the substrate 111 between the substrate 111 and the drain 116. The first sub insulation layer 117_1 may include substantially the same materials as the first sub insulation layer 117 described with reference to FIG. 17. The second sub insulation layer 118_1 may include substantially the same materials as the second sub insulation layer 118 described with reference to FIG. 17.

The insulation layer 116_2 may operate as a blocking insulation layer. The insulation layer 116_2 may include the same material as the third sub insulation layer 119 described with reference to FIG. 17.

Configurations of the pillar 113_2 and the insulation layer 116_2 are different from the transistor structure TSa of FIG. 17. However, the insulation layer 116_2 and the first and second sub insulation layers 117_1 and 118_1 are provided between the first conductive material 233 and the channel layer 114. That is, the first conductive material 233, the insulation layer 116_2, the first and second sub insulation layers 117_1 and 118_1, and the channel layer 114 operate as a transistor (or a memory cell transistor).

Figure 20:
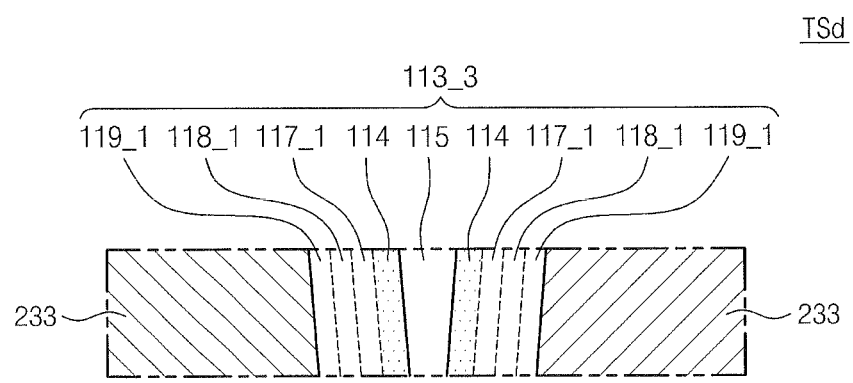
FIG. 20 is a sectional view illustrating a transistor structure according to an embodiment of the inventive concept.

FIG. 20 is a sectional view illustrating a transistor structure TSd according to an embodiment of the inventive concept. Referring to FIGS. 15, 16, and 20, a pillar 113_3 includes a channel layer 114, an internal material 115, a first sub insulation layer 117_1, a second sub insulation layer 118_1, and a third sub insulation layer 119_1. Compared to the transistor structure TSa of FIG. 17, the insulation layer 116 is removed. That is, the first conductive material 233 contacts the pillar 133_3.

The channel layer 114 may operate as a body of the second direction. The internal material 115 may include an insulation material. The first sub insulation layer 117_1 may operate as a tunneling insulation layer. The second sub insulation layer 118_1 may operate as a charge storage layer. The third sub insulation layer 119_1 may operate as a blocking insulation layer.

The first sub insulation layer 117_1, the second sub insulation layer 118_1, and the third sub insulation layer 119_1, which are components of the pillar 113_3, may extend along a direction intersecting the substrate 111 between the substrate 111 and the drain 116. The first sub insulation layer 117_1 may include substantially the same material as the first sub insulation layer 117 described with reference to FIG. 17. The second sub insulation layer 118_1 may include substantially the same material as the second sub insulation layer 118 described with reference to FIG. 17. The third sub insulation layer 119_1 may include substantially the same material as the third sub insulation layer 119 described with reference to FIG. 17.

Configurations of the pillar 113_3 and the insulation layer 116_3 are different from the transistor structure TSa of FIG. 17. However, the first to third sub insulation layers 117_1, 118_1, and 119_1 are provided between the first conductive material 233 and the channel layer 114. That is, the first conductive material 233, the first to third sub insulation layers 117_1, 118_1, and 119_1, and the channel layer 114 may operate as a transistor (or a memory cell transistor).

The pillar 113 represents one of the pillars 113, 113_1, 113_2, and 113_3. The insulation layer 116 represents one of the insulation layers 116, 116_2, and 116_3.

Referring to FIGS. 15 through 20, the first conductive materials 211 to 291, 212 to 292, and 213 to 293 are provided in nine layers. However, the conductive materials 211 to 291, 212 to 292, and 213 to 293 are not limited to the nine layers. For example, the first conductive materials may be provided in at least eight layers for forming memory cells and at least two layers for forming selection transistors. The first conductive materials may be provided in at least sixteen layers for forming memory cells and at least two layers for forming selection transistors. The first conductive materials may be provided in a plurality of layers for forming memory cells and at least two layers for forming selection transistors. For example, the first conductive materials may be provided in a layer for forming dummy memory cells.

Referring to FIGS. 15 through 20, three NAND strings NS are connected to one bit line BL. However, the inventive concept is not limited thereto. The m NAND strings NS may be connected to one bit line BL in the memory block BLKb. According to the number of NAND strings NS connected to one bit line BL, the number of the first conductive materials 211 to 291, 212 to 292, and 213 to 293 extending along the first direction and the number of the doping regions 311 to 314 operating as the common source line CSL may be adjusted.

As shown in FIG. 15 through 20, a sectional area according to the first and third directions of the pillar 113 may be reduced as being closer to the substrate 111. For example, due to the characteristics or error of a process, the sectional area according to the first and third directions may vary.

The pillar 113 can be formed by providing silicon material and insulating material in a hole formed by etching. As the depth of etching increases, the hole formed by etching may have a reduced area along the first and third directions. That is, the sectional area of the pillar 113 along the first and third direction may be reduced as being closer to the substrate 111.

Figure 21:
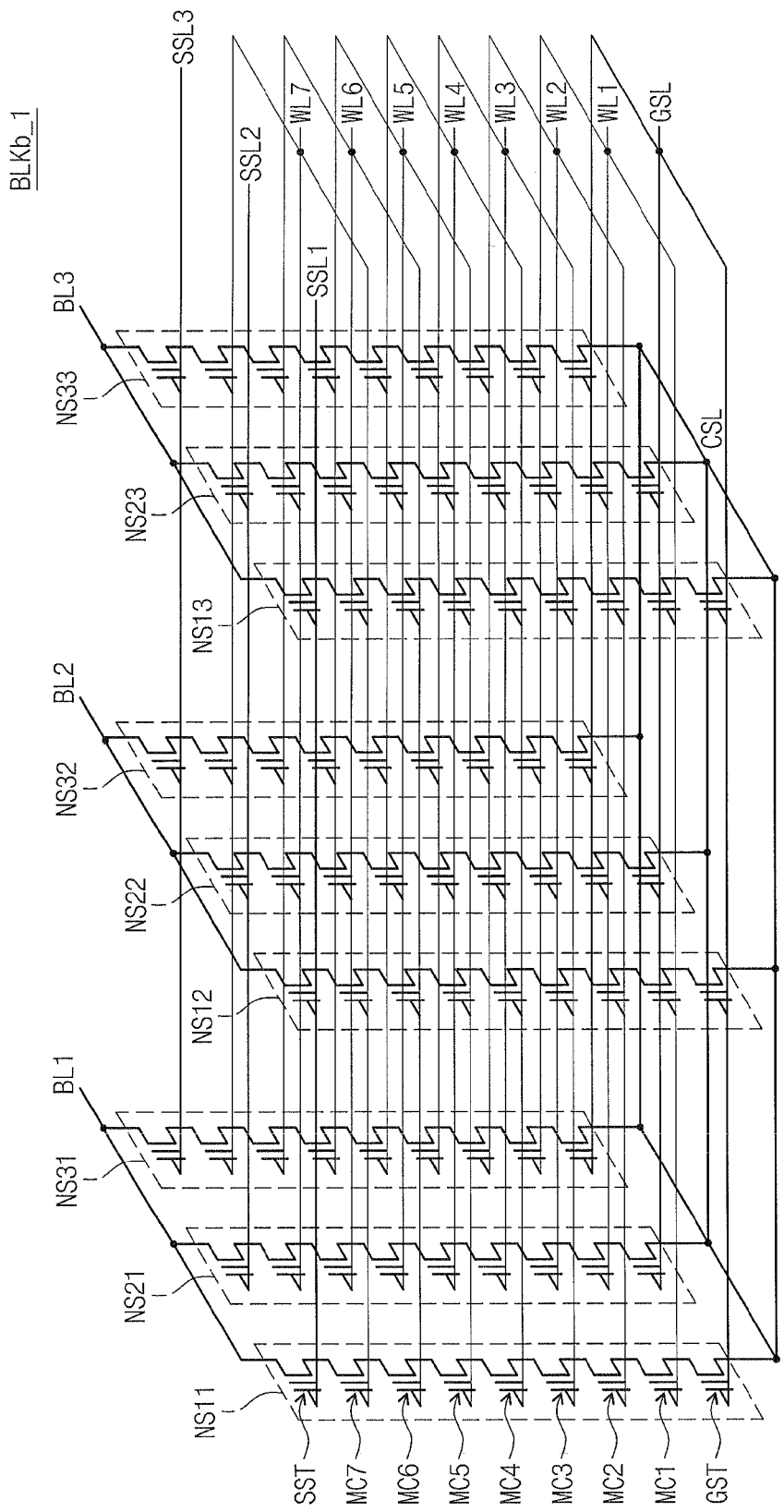
FIG. 21 is a circuit diagram of the memory block of FIG. 15 according to an embodiment of the inventive concept.

FIG. 21 is a circuit diagram BLKb_1 according to an embodiment of the inventive concept. Referring to FIGS. 15 through 21, NAND strings NS11 to NS31 are provided between the first bit line BL1 and the common source line CSL. NAND strings NS12, NS22, and NS32 are provided between the second bit line BL2 and the common source line CSL. NAND strings NS13, NS23, and NS33 are provided between the third bit line BL3 and the common source line CSL. The first to third bit lines BL1 to BL3 correspond to the second conductive materials 331 to 333 extending along the third direction.

The string selection transistor SST of each NAND string NS is connected to the corresponding bit line BL. The ground selection transistor GST of each NAND string NS is connected to the common source line CSL. Memory cells MC are provided between the string selection transistor SST and the ground selection transistor GST of each NAND string NS.

Hereinafter, the NAND strings NS are defined on a per-row basis, and on a per-column basis. The NAND strings NS connected to one bit line form one column. For example, the NAND strings NS11 to NS31 connected to the first bit line BL1 correspond to a first column. The NAND strings NS12 to NS32 connected to the second bit line BL2 correspond to a second column. The NAND strings NS13 to NS33 connected to the third bit line BL3 correspond to a third column.

The NAND strings NS connected to one string selection line SSL form one row. For example, the NAND strings NS11 to NS13 connected to the first string selection line SSL1 form a first row. The NAND strings NS21 to NS23 connected to the second string selection line SSL2 form a second row. The NAND strings NS31 to NS33 connected to the third string selection line SSL3 form a third row.

In each NAND string NS, a height is defined. In an embodiment, in each NAND string NS, the height of the ground selection transistor GST is defined as 1. The height of the memory cell MC1 adjacent to the ground selection transistor GST is defined as 2. The height of the string selection transistor SST is defined as 9. The height of the memory cell MC7 adjacent to the string selection transistor SST is defined as 8.

As an order from the ground selection transistor GST of the memory cell MC is increased, the height of the memory cell MC is increased. The first to seventh memory cells MC7 have the second to eighth heights, respectively.

The NAND strings NS of the same row share the ground selection line GSL. NAND strings NS of different rows share the ground selection line GSL. The first conductive materials 211 to 213 having the first height are connected to each other to form the ground selection line GSL.

The memory cells MC having the same height in the NAND strings NS of the same row share a word line WL. The word lines WL of the NAND strings NS having the same height and corresponding to a different row are commonly connected. That is, the memory cells MC having the same height share a word line WL.

The first conductive materials 221 to 223 having the second height are commonly connected to form a first word line WL1. The first conductive materials 231 to 233 having the third height are commonly connected to form a second word line WL2. The first conductive materials 241 to 243 having the fourth height are commonly connected to form a third word line WL3. The first conductive materials 251 to 253 having the fifth height are commonly connected to form a fourth word line WL4. The first conductive materials 261 to 263 having the sixth height are commonly connected to form a fifth word line WL5. The first conductive materials 271 to 273 having the seventh height are commonly connected to form a sixth word line WL6. The first conductive materials 281 to 283 having the eighth height are commonly connected to form a seventh word line WL7.

The NAND strings NS of the same row share the string selection line SSL. The NAND strings NS of a different row are respectively connected to the different string selection lines SSL1, SSL2, and SSL3. The first to third string selection lines SSL1 to SSL3 correspond to the first conductive materials 291 to 293 having the ninth height, respectively.

Hereinafter, the string selection transistors SST connected to the first string selection line SSL1 are defined as first string selection transistors SST1. The string selection transistors SST connected to the second string selection line SSL2 are defined as second string selection transistors SST2. The string selection transistors SST connected to the third string selection line SSL3 are defined as third string selection transistors SST3.

The common source line CSL is commonly connected to the NAND strings NS. For example, the first to fourth doping regions 311 to 314 are connected to each other to form a common source line CSL.

As shown in FIG. 21, the word lines WL having the same height are commonly connected. Accordingly, when the word line WL having a specific height is selected, all NAND strings NS connected to the selected word line WL are selected.

The NAND strings NS of a different row are connected to a different string selection line SSL. Accordingly, by selecting and non-selecting the string selection lines SSL1 to SSL3, the NAND strings NS of a unselected row among NAND strings NS connected to the same word line WL may be electrically separated from a corresponding bit line and the NAND strings NS of a selected row may be electrically connected to a corresponding bit line.

That is, by selecting and non-selecting the string selection lines SSL1 to SSL3, the row of the NAND strings NS may be selected. Then, by selecting the bit lines BL1 to BL3, a column of the NAND strings NS in the selected row may be selected.

In an embodiment, during program and read operations, a select voltage is applied to the selected word line of the selected row, and a non-select voltage is applied to the unselected word lines. For example, the select voltage may be a program voltage Vpgm or a select read voltage Vrd. That is, the program and read operations may be performed for each and every word line of a selected row of the NAND strings NS 11 to NS13, NS21 to NS23, and NS31 to NS33.

In an embodiment, the thicknesses of the insulation materials 112 provided between the first conducive materials (e.g., 211, 221, 231, 291, 292, and 293) operating as selection lines among the first conductive materials 211 to 291, 212 to 292, and 213 to 293 and the first conductive materials (e.g., 221 to 281, 222 to 282, and 223 to 283) operating as word lines may be greater than those of other insulation materials 112.

In FIGS. 15 to 21, the first conductive materials 211, 212, and 213 having the first height operate as the ground selection line GSL and the first conductive materials 291, 292, and 293 having the ninth height operate as the string selection lines SSL1, SSL2, and SSL3.

In an embodiment, the thicknesses of the insulation materials 112 provided between the first conductive materials 211, 212, and 213 having the first height and the second conductive materials 221, 222, and 223 having the second height may be greater than those of the insulation materials 112 provided between the first conductive materials 221, 222, and 223 having the second height and the conductive materials having the eighth height.

The thicknesses of the insulation materials 112 provided between the first conductive materials 281, 282, and 283 having the eighth height and the first conductive materials 291, 292, and 293 having the ninth height may be greater than those of the insulation materials 112 provided between the second conductive materials 221, 222, and 223 having the second height and the conductive materials having the eighth eight.

Figure 22:
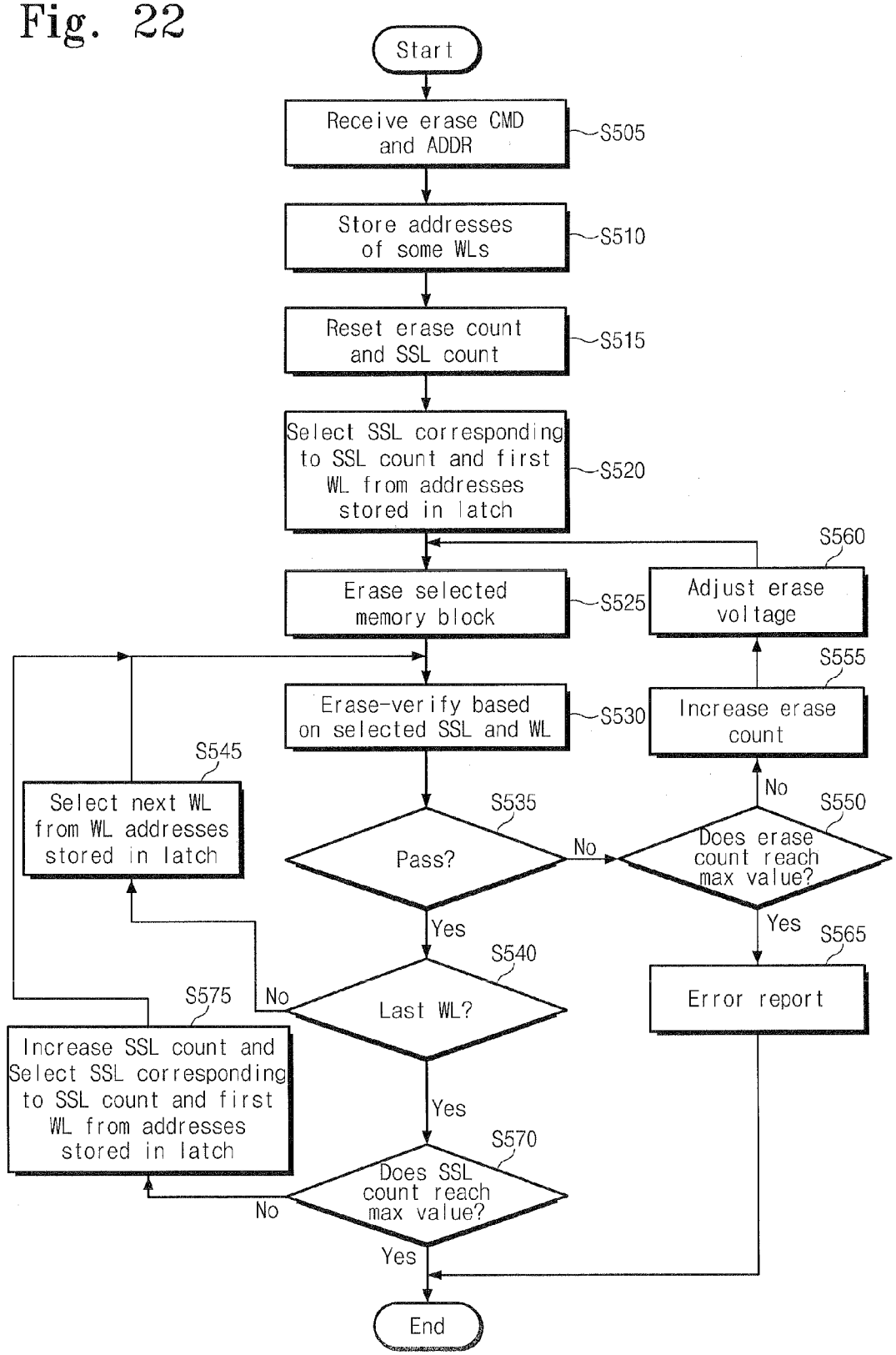
FIG. 22 is a flowchart illustrating a method of operating a nonvolatile memory device according to an embodiment of the inventive concept.

FIG. 22 is a flowchart illustrating a method of operating a nonvolatile memory device according to an embodiment of the inventive concept. Referring to FIGS. 13 through 22, in operation S505, an erase command and an address are received. For example, the received address corresponds to one of a plurality of blocks BLK1 to BLKz of the nonvolatile memory device 100b. A memory block (e.g., BLKb) corresponding to the received address among the plurality of memory blocks BLK1 to BLKz is selected. For example, the received address corresponds to at least two string selection lines SSL.

In operation S510, addresses of some of word lines are stored. For example, the addresses of some of the word lines of the selected memory block BLKb are stored in the word line address latch 177. For example, the addresses of some of the word lines corresponding to the received address are stored. For example, the addresses of some of the word lines of the selected memory block BLKa are stored in the word line address latch 177. For example, the addresses of some of the word lines are stored in the word line address latch 177 from the fuse unit 180.

In operation S515, an erase count and a SSL count are reset. For example, the erase count is reset to 1. The SSL count represents one of string selection lines SSL corresponding to the received address. For example, the SSL count may be reset to represent a first string selection line SSL1 of the selected memory block BLKb.

Operations S510 and S515 may be construed as initialization of erase operation. The initialization of operations S510 and S515 may be performed regardless of the order.

In operation S520, a string selection line corresponding to the SSL count is selected, and a first word line is selected from the addresses stored in the word line address latch 177. For example, the SSL count is converted into a string selection line address. A string selection line corresponding to the converted string selection line address may be selected. For example, a first word line among some of word lines corresponding to the addresses stored in the word line address latch 177 may be selected.

In operation S525, the selected memory block is erased. For example, the control logic 170b controls the address decoder 120, the read & write unit 130, and a voltage generating unit 160 to erase the selected Memory block BLKb.

In operation S530, based on the selected string selection line and the selected word line, erase-verification is performed. For example, the control logic 170c controls the address decoder 120, the read & write unit 130, and the voltage generating unit 160 to erase-verify a plurality of memory cells MC corresponding to the selected word line among word lines corresponding to the selected string selection line.

In operation S535, it is determined whether an erase-verification result is passed or not. If the selected word line is determined as being erase-passed, operation S540 is performed. For example, the control logic 170b determines erase-pass or erase-fail according to whether an output signal of the pass/fail check unit 140 is a pass signal or a fail signal.

In operation S540, it is determined whether the selected word line is the last word line or not. For example, it is determined whether the selected word line is the last word line among some of the word lines corresponding to addresses stored in the word line address latch 177. If the selected word line is not the last word line, operation S545 is performed. The next word line is selected from addresses stored in the word line address latch 177 in operation S545. Thereafter, the selected word line is erase-verified in operation S530. If the selected word line is the last word line, operation S570 is performed.

In operation S535, the selected word line is determined as being erase-failed, operation S550 is performed. In operation S540, it is determined whether the erase count reaches the maximum value or not. If the erase count does not reach the maximum value, the erase count is increased in operation S555. Subsequently, the erase voltage Vers is adjusted in operation S560. For example, the level of the erase voltage Vers may be increased. Thereafter, erase (operation S525) and erase-verification (operation S530 and operation S535) from the erase-failed word line are performed again.

In operation S550, when the erase count reaches the maximum value, an error report is generated. For example, the control logic 170b may generate an error report representing that an error occurs during an erase operation. The generated error report may be provided to a host of the nonvolatile memory device 100b.

In operation S570, it is determined whether the SSL count reaches the maximum value or not. For example, the maximum value of the SSL count may correspond to the last string selection line SSL3 of the selected memory block BLKb.

If the SSL count does not reach the maximum value, the SSL count is increased in operation S575, a string selection line corresponding to the increased SSL count is selected, and a first word line is selected from the addresses stored in the word line address latch 177. As an example, the increased SSL count is converted into a string selection line address. A string selection line corresponding to the converted string selection line address is selected. As an example, a first word line among word lines corresponding to the addresses stored in the word line address latch 177 is selected. Thereafter, in operation S530 and S535, erase-verification is again performed. When the SSL count reaches the maximum value, the erase operation is terminated.

In operations S525 to S560, erase-verification from the erase and erase-failed word line is repeated in the NAND strings corresponding to a selected string selection line (e.g., a string selection line corresponding to the SSL count) among the NAND strings NS of the selected memory block BLKb. In an embodiment, the erase-verification is performed in some of the word lines corresponding to the addressed received from the fuse unit 180. If the word lines are erase-passed in the selected string selection line, the next string selection line is selected in operation S575.

That is, the selected memory block BLKb is erase-verified on a per-word line basis and erase-verification resumes from the erase-failed word line. The erase-verification is performed in some of the word lines of the selected memory block BLKb.

Figures 23, 24:
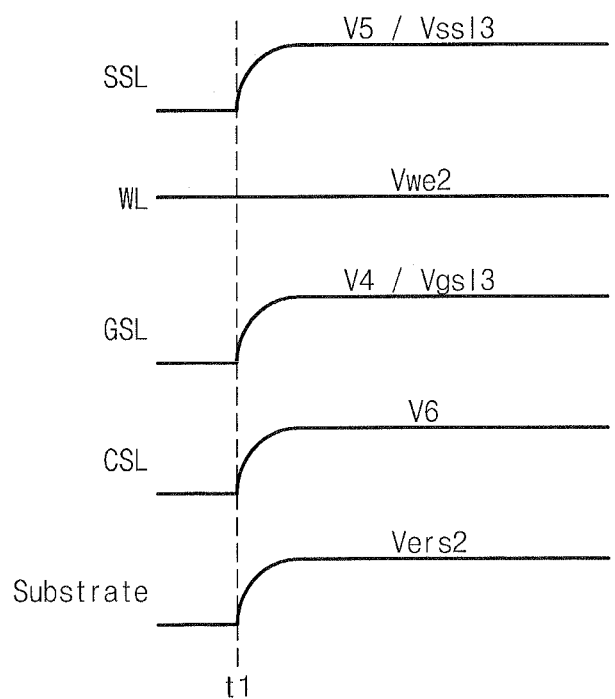
FIG. 23 is a table illustrating voltage conditions during an erase operation of the nonvolatile memory device of FIG. 13.
FIG. 24 is a timing diagram illustrating a voltage change according to voltage conditions of FIG. 13.

FIG. 23 is a table illustrating voltage conditions during an erase operation of the nonvolatile memory device 100c of FIG. 13. Referring to FIGS. 13, 21, and 23, the string selection lines SSL1 to SSL3 may float or may be driven by a third string selection line voltage Vssl3. A second word line erase voltage Vwe2 is applied to the word lines WL1 to WL7. The ground selection line GSL may float or may be driven by a third ground selection line voltage Vgsl3. The common source line CSL may float. A second erase voltage Vers2 is applied to the substrate 111.

Figure 25:
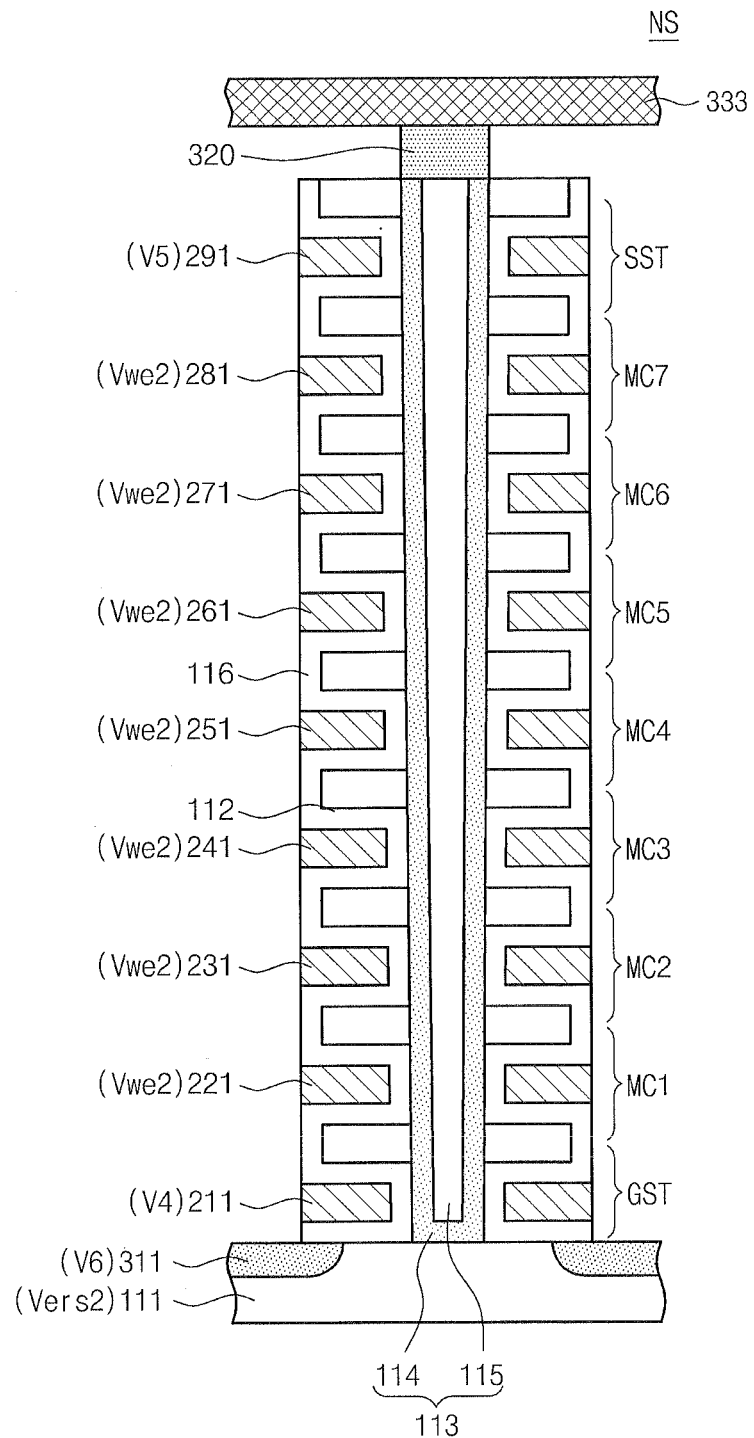
FIG. 25 is a sectional view of one NAND string of a memory block to which voltages according to FIGS. 23 and 24 are applied.

FIG. 24 is a timing diagram illustrating a voltage change according to voltage conditions of FIG. 23. FIG. 25 is a sectional view of one NAND string NS of the memory block BLKb to which voltages according to FIGS. 23 and 24 are applied. The sectional view of FIG. 25 may correspond to the NAND string NS13 of the first row and third column shown in an equivalent circuit BLKb_1 of the memory block BLKb.

Referring to FIGS. 23 through 25, a second erase voltage Vers2 is applied to the substrate 111 at the first timing t1. In an embodiment, the second erase voltage Vers2 may be a high voltage.

The substrate 111 may be doped with the same type as the channel layer 114 operating as a body of the second direction. Accordingly, the second erase voltage Vers2 is applied to the channel layer 114 of the NAND string NS.

The first conductive material 211 is affected by coupling from the channel layer 113. If the ground selection line GSL floats, as a voltage of the channel layer 114 is increased to the second erase voltage Vers2, a voltage of the first conductive material 211 operating as the ground selection line GSL is increased. In an embodiment, a voltage of the ground selection line GSL may be increased to a fourth voltage V4.

A voltage of the channel layer 114 operating as a body of the second direction is a second erase voltage Vers2, and a voltage of the first conductive material 211 operating as a gate (or a control gate) of the ground selection transistor GST is a fifth voltage V5. A difference between the second ease voltage Vers2 and the fifth voltage V5 may not be enough to cause Fowler-Nordheim tunneling. Accordingly, the ground selection transistor GST is erase-inhibited.

For convenience of description, it is described that the fourth voltage V4 and the third ground selection line voltage Vgsl3 have the same level. However, the fourth voltage V4 and the third ground selection line voltage Vgsl3 may be different.

The first conductive materials 221 to 282 having the respective second to eighth heights operate as the first to seventh word lines WL1 to WL7, respectively, and operate as gates (or control gates) of the first to seventh memory cells MC1 to MC7. At the first timing t1, a second word line eraser voltage Vwe2 is applied to the word lines WL1 to WL7. For example, the second word line erase voltage Vwe2 may be a low voltage. For example, the second word line erase voltage Vwe2 may be a ground voltage Vss.

A voltage of the channel layer 114 operating as a body of the second direction is a second erase voltage Vers2, and a voltage of the first conductive materials 221 to 241 operating as gates (or control gates) of the first to seventh memory cells MC1 to MC7 is a second word line erase voltage Vwe2. A difference between the second erase voltage Vers2 and the second word line erase voltage Vwe2 causes Fowler-Nordheim. For example, the second erase voltage Vers2 and the second word line ease voltage Vwe2 are set to cause Fowler-Nordheim. Accordingly, the first to seventh memory cells MC1 to MC7 of the memory block BLKb may be erased.

The first conductive material 291 having the ninth height operates as a string selection line SSL and operates as a gate (or a control gate) of the string selection transistor SST. At the first timing t1, the string selection line SSL may float and may be driven by the third string selection line voltage Vssl3.

The first conductive material 291 is affected by coupling from the channel layer 114. If the string selection line SSL floats, as a voltage of the channel layer 114 is increased to the second erase voltage Vers2, a voltage of the first conductive material 291 operating as the string selection line SSL is increased. A voltage of the string selection line SSL may be increased to the fifth voltage V5.

A voltage of the channel layer 114 operating as a body of the second direction is a second erase voltage Vers2, and a voltage of the first conductive material 291 operating as a gate (or a control gate) of the string selection transistor SST is a fifth voltage Vssl1. A difference between the second ease voltage Vers2 and the fifth voltage V5 may not be enough to cause Fowler-Nordheim tunneling. Accordingly, the string selection transistor SST is erase-prohibited.

If the string selection line SSL is driven by the third string selection line voltage Vssl3, the third string selection line voltage Vssl3 is set not to cause Fowler-Nordheim tunneling due to a difference with the second erase voltage Vers2. Accordingly, the string selection transistor SST is erase-prohibited.

For convenience of description, it is illustrated that the fifth voltage V5 and the third string selection line voltage Vssl3 have the same level. However, the fifth voltage V5 and the third string selection line voltage Vssl3 may be different.

The doping regions 311 operating as the common source line CSL form a p-n junction with the substrate 111. Accordingly, when a second erase voltage Vers2 is applied to the substrate 111, a voltage of the doping region 311 operating as a common source line CSL may also be increased. For example, a voltage of the common source line CSL may be increased to the sixth voltage V6.

FIG. 26 is a table illustrating voltage conditions during an erase-verification operation of the nonvolatile memory device 100c of FIG. 13. Referring to FIGS. 13, 21, and 26, a second bit line voltage Vbl2 is applied to the bit lines BL1 to BL3. For example, the second bit line voltage Vbl2 may be a power voltage Vcc.

A fourth string selection line voltage Vssl4 is applied to a selected string selection line. For example, the fourth string selection line voltage Vssl4 is a voltage for turning on the selected string selection transistor. For example, the fourth string selection line voltage Vssl4 may be a power voltage Vcc.

A fifth string selection line voltage Vssl5 is applied to an unselected string selection line. For example, the fifth string selection line voltage Vssl5 is a voltage for turning off the unselected string selection transistor. For example, the fifth string selection line voltage Vssl5 may be a ground voltage Vss.

A second erase verify voltage Vvfy2 is applied to the selected word line. For example, the second erase verify voltage Vvfy2 may be set to the upper limit of a threshold voltage required for memory cells in an erase state. For example, the second erase verify voltage Vvfy2 may be a ground voltage Vss.

A second non-selection word line voltage Vuwl2 is applied to the unselected word line. For example, the second non-selection word line voltage Vuwl2 may be a voltage for turning on the memory cells MC regardless of a logic state of the memory cells MC. For example, the second non-selection word line voltage Vuwl2 may be a non-selection read voltage Vread applied to unselected word lines during a read operation or a pass voltage Vpass applied to unselected word lines during a program operation.

A fourth ground selection line voltage Vgsl4 is applied to the ground selection line GSL. For example, the fourth ground selection line voltage Vgsl4 may be a voltage for turning on the ground selection transistor GST. For example, the fourth ground selection line voltage Vgsl4 may be a power voltage Vcc.

A second common source line voltage Vcsl2 is applied to the common source line CSL. For example, the second common source line voltage Vcsl2 may be a ground voltage Vss.

Figure 27:
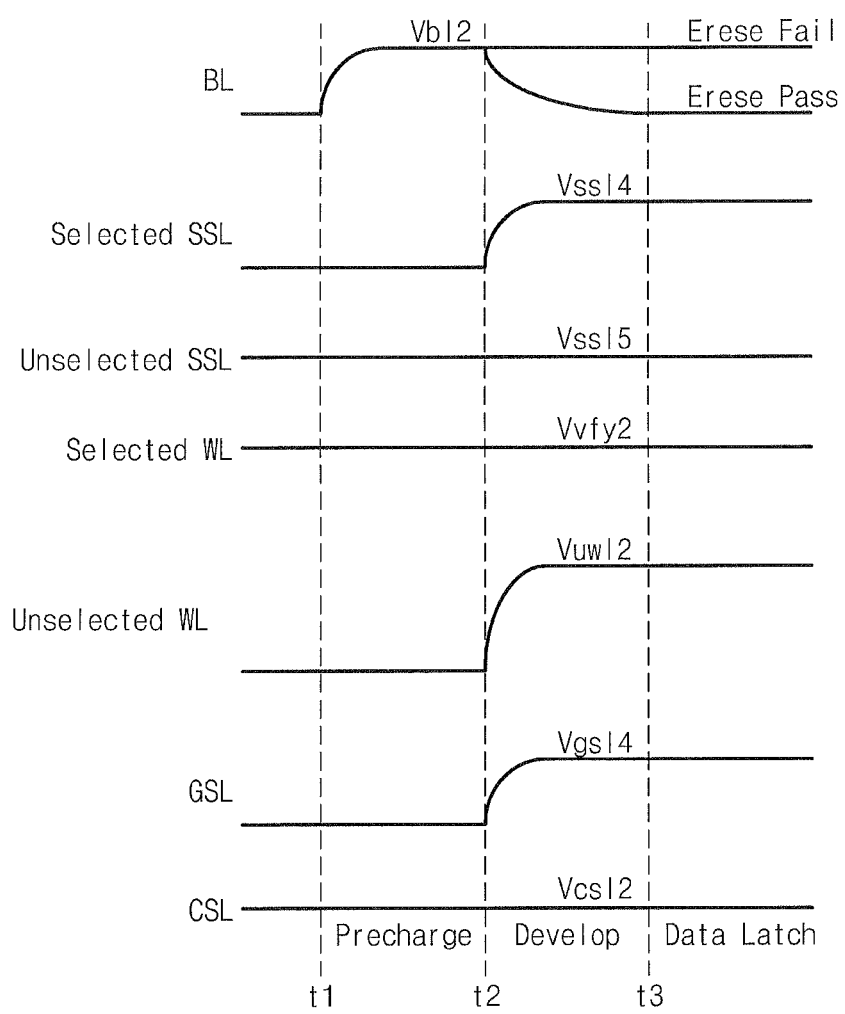
FIG. 27 is a timing diagram illustrating a voltage change according to voltage conditions of FIG. 26.
Figure 28:
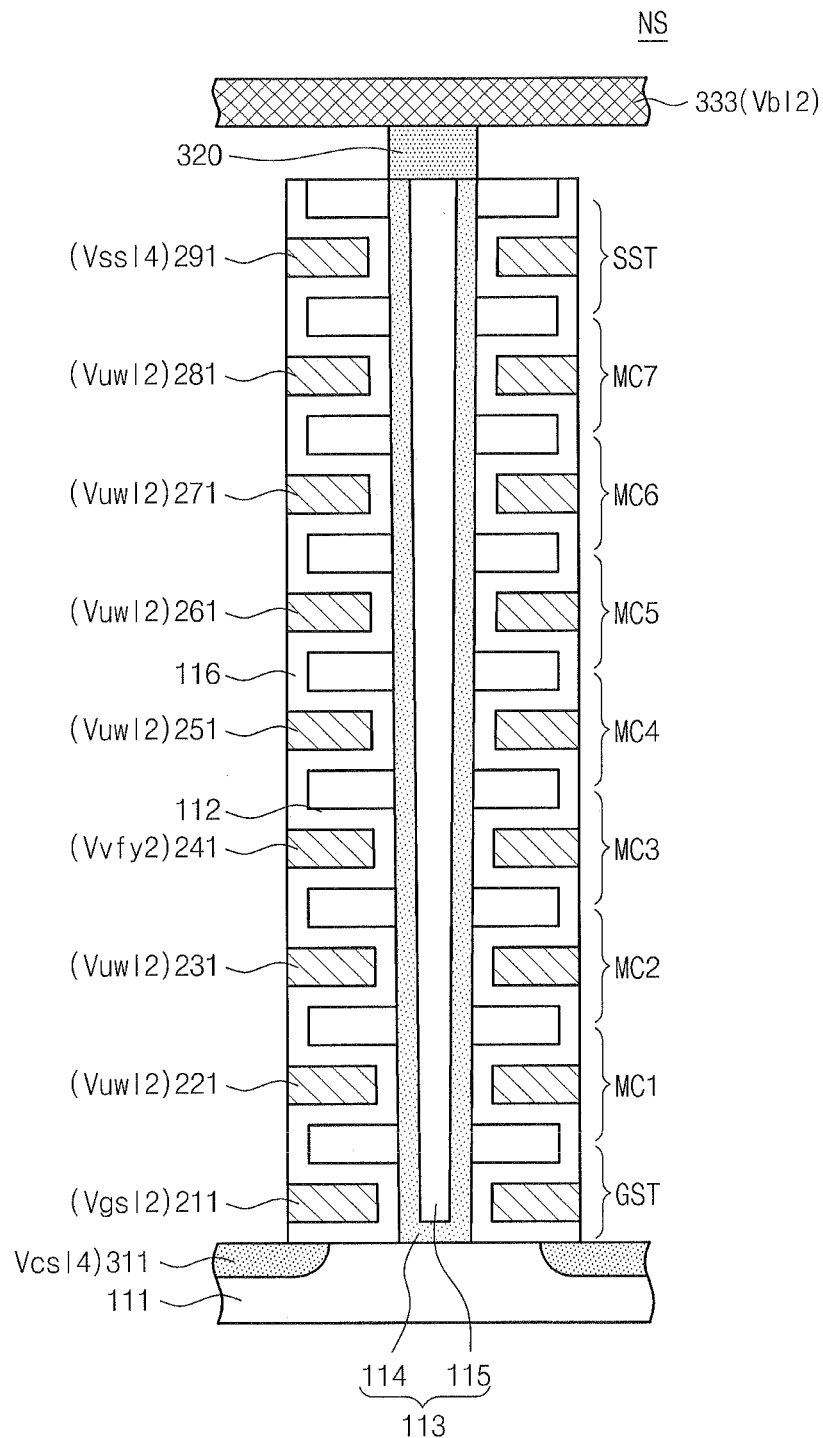
FIG. 28 is a sectional view of one NAND string of a memory block to which voltages according to FIGS. 26 and 27 are applied.

FIG. 27 is a timing diagram illustrating a voltage change according to voltage conditions of FIG. 26. FIG. 28 is a sectional view of one NAND string NS of the memory block BLKb to which voltages according to FIGS. 26 and 27 are applied. The sectional view of FIG. 28 may correspond to the NAND string NS13 of the first row and third column of the memory block BLKb_1.

Referring to FIGS. 13, 26, and 28, pre-charging is performed at the first timing t1. The second bit line voltage Vbl2 is applied to the bit lines BL1 to BL3. That is, a second bit line voltage Vbl2 is pre-charged to the second conductive material 333 operating as the third bit line BL3. Subsequently, the first to third bit lines BL1 to BL3 may float.

At the second timing t2, developing is performed. A fourth string selection line voltage Vssl4 is applied to the selected string selection line (e.g., SSL1). That is, the string selection transistors SST1 corresponding to the selected string selection line SSL1 are turned on. Accordingly, the NAND strings NS11 to NS13 of the first row are electrically connected to the bit lines BL1 to BL3.

A fifth string selection line voltage Vssl5 is applied to the unselected string selection lines (e.g., SSL2 and SSL3). That is, the string selection transistors SST2 and SST3 corresponding to the unselected string selection lines SSL2 and SSL3 may be turned off. Accordingly, the NAND strings NS21 to NS23 and NS31 to NS33 of the second and third rows are electrically separated from the bit lines BL1 to BL3.

A second non-selection word line voltage Vuwl2 is applied to the unselected word line (e.g., WL1, WL2, and WL4 to WL7). That is, the memory cells MC1, MC2, and MC4 to MC7 connected to the unselected word lines WL1, WL2, and WL4 to WL7 are turned on.

A second erase verify voltage Vvfy 2 is applied to the selected word line (e.g., WL3). In the NAND strings NS11 to NS13 of the first row, memory cells having a higher threshold voltage than the second erase verify voltage Vvfy2 among the memory cells MC3 connected to the selected word line WL3 may be turned off. In the NAND strings NS11 to NS13 of the first row, memory cells having a lower threshold voltage than the second erase verify voltage Vvfy2 among the memory cells MC3 connected to the selected word line WL3 may be turned on.

A fourth ground selection line voltage Vgsl4 is applied to the ground selection line GSL. Accordingly, the ground selection transistors GST are turned on and the NAND strings NS11 to NS13, NS21 to NS23, and NS31 to NS33 are electrically connected to the common source line CSL.

In the NAND strings NS11 to NS13 of the first row, when one of the memory cells MC connected to the selected word line WL3 is turned on, a channel is formed between a corresponding bit line BL and a common source line CSL. Accordingly, current flows from the corresponding bit line BL to the common source line, and a voltage of the corresponding bit line BL is decreased from the second bit line voltage Vbl2.

In the NAND strings NS11 to NS13 of the first row, if one of the memory cells MC3 connected to the selected word line WL3 is turned off, a channel is not formed between a corresponding bit line BL and a common source line CSL. Accordingly, no current flows from a corresponding bit line BL to a common source line CSL, and a voltage of a corresponding bit line BL is maintained as a second bit line voltage Vbl2.

Data latching is performed at the third timing t3. For example, according to a voltage of the bit lines BL1 to BL3, erase-pass and erase-fail may be determined.

For example, when a voltage of the first to third bit lines BL1 to BL3 is lower than the second bit line voltage Vbl2, i.e., when threshold voltages of the memory cells MC3 connected to the selected word line WL3 in the NAND strings NS11 to NS13 of the selected first row are lower than the second erase verify voltage Vvfy2, it is determined as being erase-passed.

When at least one voltage of the first to third bit lines BL1 to BL3 is a second bit line voltage Vbl2, i.e., at least one threshold voltage of the memory cells MC3 connected to the selected word line WL3 in the NAND strings NS11 to NS13 of the selected first row is higher than the second erase verify voltage Vvfy2, it is determined as being erase-failed.

In an embodiment, according to an error correction ability of a host of the nonvolatile memory device 100b or the nonvolatile memory device 100b, a determination criterion of erase-pass and erase-fail of the selected word line may vary. For example, if an error correction ability of a host of the nonvolatile memory device 100b or the nonvolatile memory device 100b is improved, even if at least one voltage applied to the bit lines BL is maintained as the second bit line voltage Vbl2, the selected word line may be determined as being erase-passed.

Figure 29:
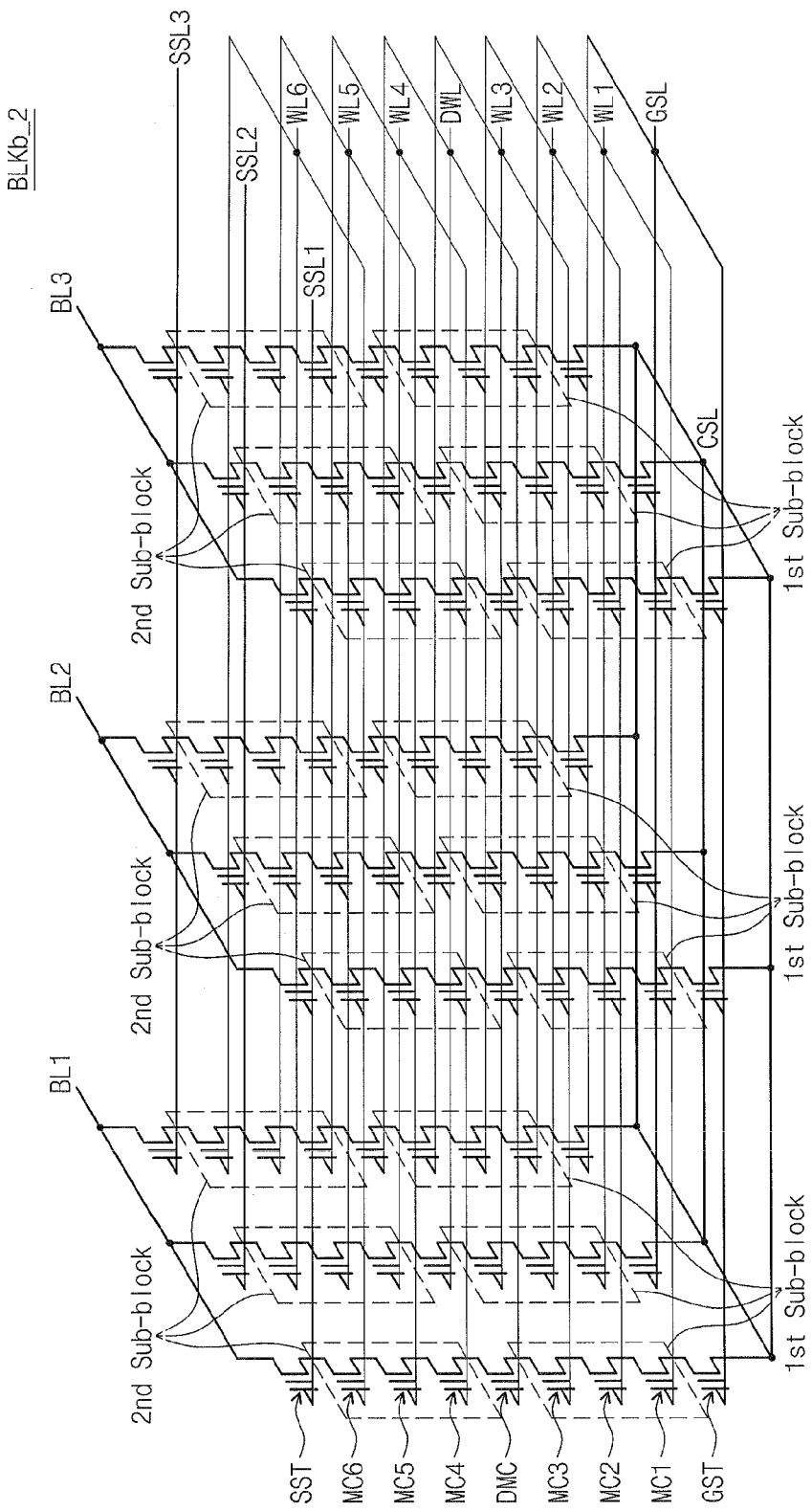
FIG. 29 is a circuit diagram of the memory block of FIG. 15 according to an embodiment of the inventive concept.

FIG. 29 is a circuit diagram BLKb_2 of the memory block BLKb of FIG. 15 according to an embodiment of the inventive concept. Referring to FIGS. 15, 16, and 29, the memory block BLKb_2 is divided into a plurality of sub blocks along the second direction. Between the sub blocks, dummy memory cells DMC and a dummy word line connected to the dummy memory cells DMC are provided.

First conductive lines 221 to 241, 222 to 242, and 223 to 243 having the second to fourth heights form first to third memory cells MC1 to MC3 to constitute a first sub block. First conductive lines 251, 252, and 253 having the fifth height form dummy memory cells DMC. First conductive lines 261 to 281, 262 to 282, and 263 to 283 having the sixth to eighth heights form forth to sixth memory cells MC4 to MC6 to constitute a second sub block.

The memory block BLKb_2 is erased by a sub block unit. That is, each sub block is independently erased.

The memory block BLKb_2 is erased by a sub block unit. Except that the memory block is erased by a sub block unit, the memory block BLKb_2 is erased and erase-verified as described with reference to FIGS. 14 and 22. For example, after erasing the memory cells MC of a sub block of the memory block BLKb_2, the erased memory cells MC is ease-verified by a word line unit. If erase-fail occurs, the selected sub block is erased, and erase-verification resumes from the erase-failed word line. The erase and erase-verification of the selected sub block are sequentially performed on rows of NAND strings.

The memory block BLK_2 is divided into two sub blocks. However, the number of sub blocks is not limited. One dummy word line DWL is provided between sub blocks of the memory block BLKb_2. However, the number of dummy word lines DWL between sub blocks is not limited.

FIG. 30 is a table illustrating voltage conditions applied to the circuit diagram BLKb_2 of the memory block BLK of FIG. 15 during an erase operation according to an embodiment of the inventive concept. Referring to FIGS. 29 and 30, string selection lines SSL1 to SSL3 may float or may be driven by a third string selection line voltage Vssl3 during an erase operation.

The word lines WL of an unselected sub block may float or may be driven by a third non-selection word line voltage Vuwl3. A second word line erase voltage Vwe2 is applied to the word lines WL of a selected sub block. For example, the second word line erase voltage Vwe2 may be a ground voltage Vss. A first dummy word line voltage Vdwl1 is applied to a dummy word line DWL. A ground selection line GSL may float or may be driven by a third ground selection line voltage Vgsl3. A common source line CSL may float. Moreover, a second erase voltage Vers2 is applied to the substrate 111.

For example, a first sub block is selected. During an erase operation, a second word line erase voltage Vwe2 may be applied to the word lines WL1 to WL3 of a first sub block. The word lines WL4 to WL6 of an unselected second sub block may float or may be driven by a third non-selection word line voltage Vuwl3.

Figure 31:
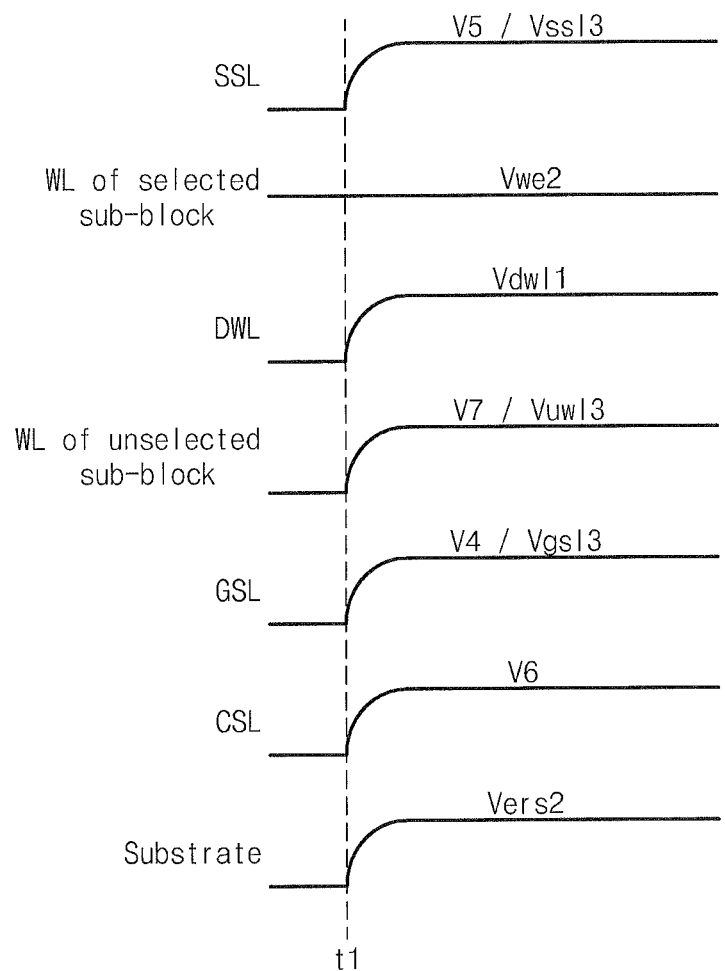
FIG. 31 is a timing diagram illustrating a voltage change according to the voltage conditions of FIG. 30.
Figure 32:
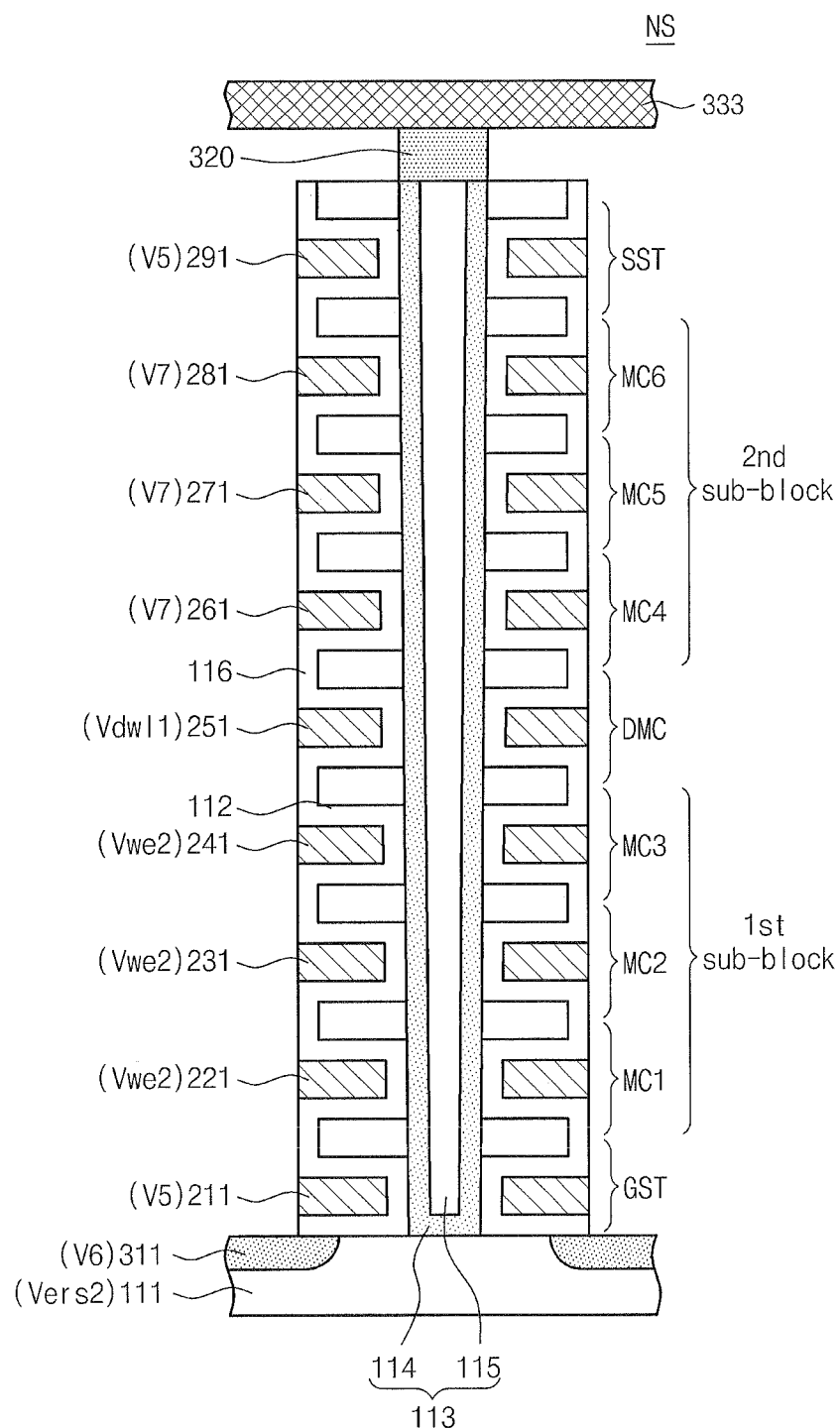
FIG. 32 is a sectional view of one NAND string of the memory block to which voltages according to FIGS. 30 and 31 are applied.

FIG. 31 is a timing diagram illustrating a voltage change according to the voltage conditions of FIG. 30. FIG. 32 is a sectional view of one NAND string NS of the memory block BLKb to which voltages according to FIGS. 30 and 31 are applied. The sectional view of FIG. 32 may correspond to the NAND string NS13 of the first row and third column shown in the memory block BLKb_1. In an embodiment, a first sub block is erased and a second sub block is erase-inhibited.

Referring to FIGS. 30 through 32, a second erase voltage Vers2 is applied to the substrate 111 at the first timing t1. The second erase voltage Vers2 may be a high voltage. The second erase voltage Vers2 is delivered to a channel layer 114 of a NAND string NS.

A ground selection line GSL may float or may be driven by a third ground selection line voltage Vgsl3. If the ground selection line GSL floats, a voltage of the ground selection line GSL is increased to a fourth voltage V4. Accordingly, as described with reference to FIGS. 23 through 25, a ground selection transistor GST is erase-inhibited.

A second word line erase voltage Vwe2 is applied to the word lines WL1 to WL3 of a selected sub block. That is, a second word line erase voltage Vwe2 is applied to the first to third word lines WL1 to WL3. Accordingly, as described with reference to FIGS. 23 through 25, the memory cells MC1 to MC3 of a selected sub block are erased.

The word lines WL4 to WL6 of an unselected sub block may float or may be driven by a third non-selection word line voltage Vuwl3. The word lines WL4 to WL6 of an unselected sub block are affected by coupling from the channel layer 14. If the word lines WL4 to WL6 of an unselected sub block float, as a voltage of the channel layer 114 is increased to the second erase voltage Vers2, a voltage of the word lines WL4 to WL6 of an unselected sub block is also increased. For example, a voltage of the word lines WL4 to WL6 of an unselected sub block is increased to a seventh voltage V7. A difference between the second ease voltage Vers2 and the seventh voltage V7 may not be enough to cause Fowler-Nordheim tunneling. Accordingly, the memory cells MC4 to MC6 of an unselected sub block are erase-inhibited.

A string selection line SSL may float or may be driven by a third string selection line voltage Vssl3. If the string selection line SSL floats, a voltage of the string selection line SSL is increased to a fifth voltage V5. Accordingly, as described with reference to FIGS. 23 through 25, the string selection transistor SST is erase-inhibited.

A first conductive material 251 having the fifth height operates as a dummy word line DWL, and operates as a gate (or a control gate) of a dummy memory cell DMC. A first dummy word line voltage Vdwl1 is applied to the dummy word line DWL. The level of the first dummy word line voltage Vdwl1 can be set not to cause Fowler-Nordheim by a voltage difference between the channel layer 114 and a gate (or a gate control) of a dummy memory cell DMC. That is, a dummy memory cell DMC is erase-inhibited.

The first dummy word line voltage Vdwl1 has a level between a second word line erase voltage Vwe2 and a second erase voltage Vers2. For example, the first dummy word line voltage Vdwl1 has a level between a second word line erase voltage Vwe2 and a seventh voltage V7. Dummy memory cells DMC, a dummy word line DWL, and a first dummy word line voltage Vdwl1 may reduce coupling between sub blocks.

A dummy word line DWL may float during an erase operation. A voltage of the dummy word line DWL may be increased by coupling due to a voltage rise of the channel layer 114. Accordingly, if the dummy word line DWL floats, dummy memory cells DMC may be erase-inhibited.

FIG. 33 is a table illustrating voltage conditions applied to a circuit diagram BLKb_2 of the memory block BLKb of FIG. 15 during erase-verification according to an embodiment of the inventive concept. Referring to FIGS. 15, 29, and 33, a second bit line voltage Vbl2 is applied to bit lines BL1 to BL3. For example, the second bit line voltage Vbl2 may be a power voltage Vcc.

A fourth string selection line voltage Vssl4 is applied to a selected one of string selection lines SSL1 to SSL3. The fourth string selection line voltage Vssl4 is a voltage for turning on selected string selection transistors. For example, the fourth string selection line voltage Vssl4 may be a power voltage Vcc.

A fifth string selection line voltage Vssl5 is applied to an unselected one of the string selection lines SSL1 to SSL3. The fifth string selection line voltage Vssl5 is a voltage for turning off selected string selection transistors. For example, the fifth string selection line voltage Vssl5 may may be a ground voltage Vss.

A second erase verify voltage Vvfy2 is applied to a selected word line (e.g., WL3) of a selected sub block. For example, the second erase verify voltage Vvfy2 is set as the upper limit of a threshold voltage required for memory cells in an erase state. For example, the second erase verify voltage Vvfy2 may be a ground voltage Vss.

A second non-selection word line voltage Vuwl2 is applied to unselected word lines (e.g., WL1 and WL2) of a selected sub block. That is, memory cells MC1 and MC2 connected to the unselected word lines WL1 and WL2 of the selected sub block are turned on.

The second non-selection word line voltage Vuwl2 is applied to a dummy word line DWL. That is, dummy memory cells DMC are turned on.

The second non-selection word line voltage Vuwl2 is applied to word lines WL4 to WL6 of an unselected sub block. For example, the second non-selection word line voltage Vuwl2 may be a voltage for turning on memory cells MC regardless of a logic state of the memory cells MC. For example, the second non-selection word line voltage Vuwl2 may be a non-selection read voltage Vread applied to the unselected word lines during a read operation or a pass voltage Vpass applied to the unselected word lines during a program operation. That is, the memory cells MC4 to MC6 of an unselected sub block may be turned on.

Figure 34:
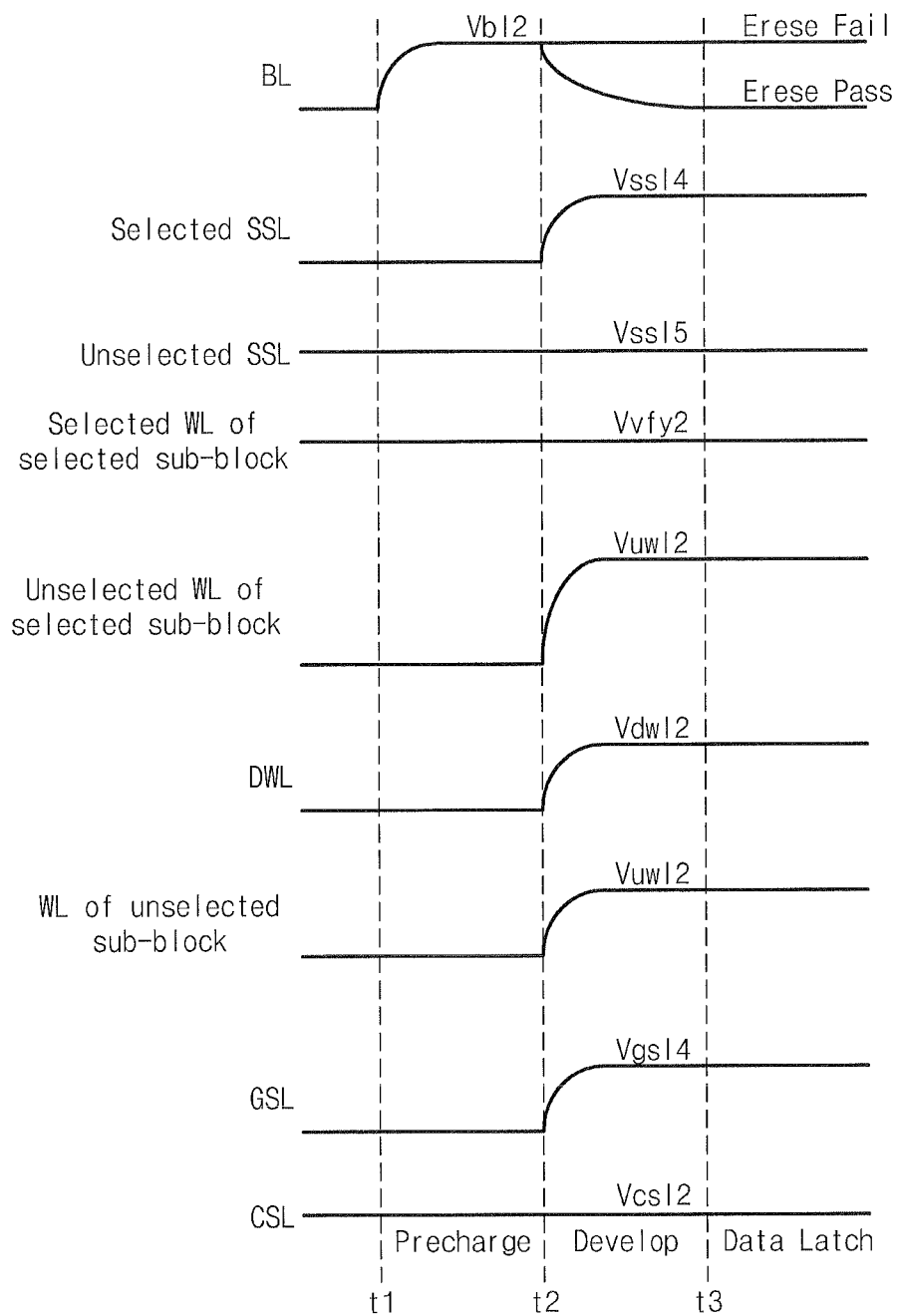
FIG. 34 is a timing diagram illustrating a voltage change according to voltage conditions of FIG. 33.
Figure 35:
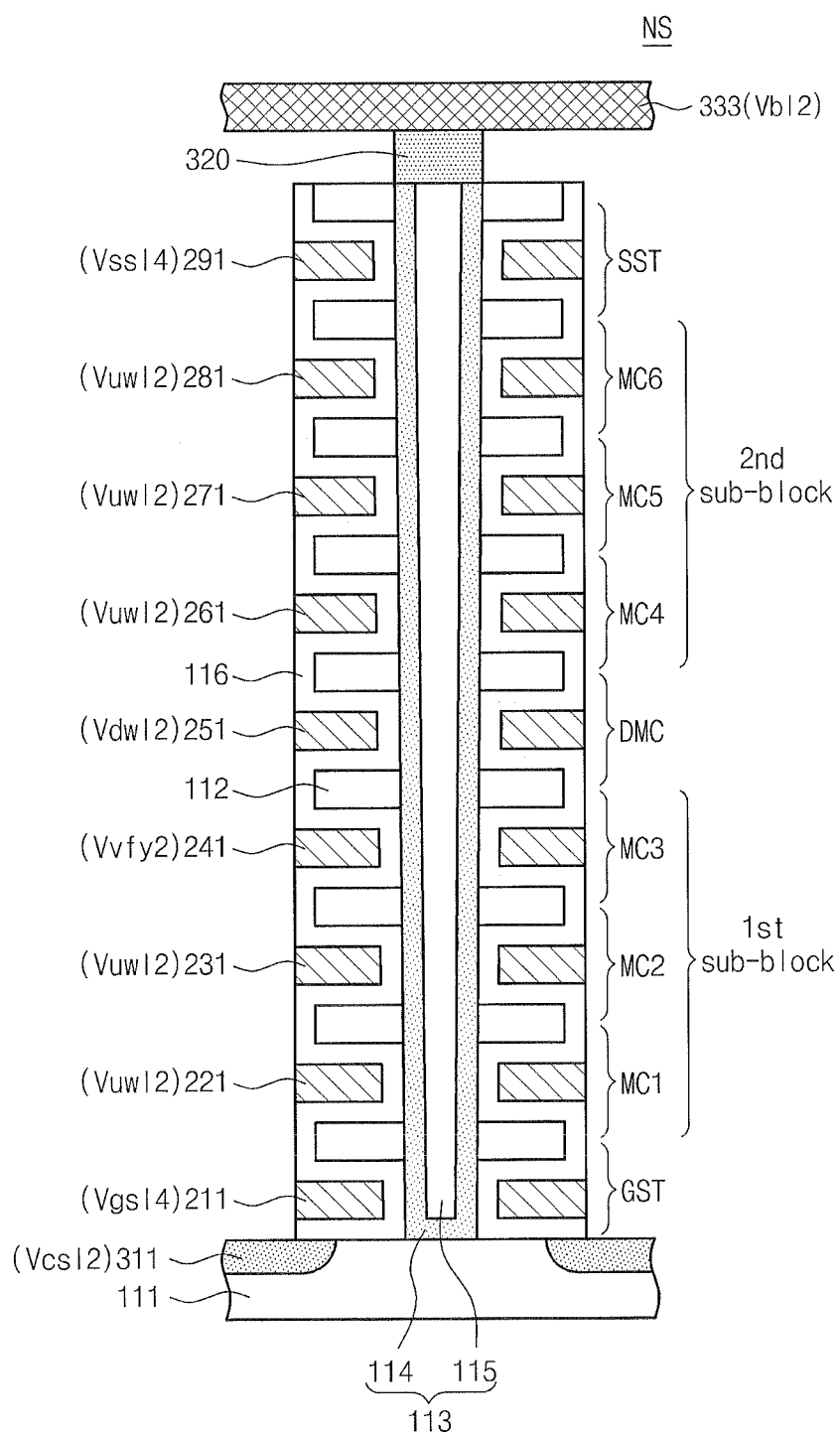
FIG. 35 is a sectional view of one NAND string of the memory block to which voltages according to FIGS. 33 and 34 are applied.

FIG. 34 is a timing diagram illustrating a voltage change according to voltage conditions of FIG. 33. FIG. 35 is a sectional view of one NAND string NS of the memory block BLKb to which voltages according to FIGS. 33 and 34 are applied. The sectional view of FIG. 35 may correspond to the NAND string NS13 of the first row and third column in the memory block BLKb_2.

Referring to FIGS. 33 through 35, pre-charging is performed at the first timing t1. A second bit line voltage Vbl2 is applied to bit lines BL1 to BL3. That is, the second bit line voltage Vbl2 is pre-charged to a second conductive material 333 operating as a third bit line BL3. Later, the first to third bit lines BL1 to BL3 may float.

Developing is performed at the second timing t2. A fourth string selection line voltage Vssl4 is applied to a selected string selection line (e.g., SSL1). That is, the string selection transistors SSTZ1 corresponding to the selected string selection line SSL1 are turned on. Accordingly, the NAND strings NS11 to NS13 of the first row may be electrically connected to the bit lines BL1 to BL3.

A fifth string selection line voltage Vssl5 is applied to unselected string selection lines (e.g., SSL2 and SSL3). That is, the string selection transistors SST2 and SST3 corresponding to the unselected string selection lines SSL2 and SSL3 are turned off. Accordingly, the NAND strings NS21 to NS23 and NS31 to NS33 of the second third rows are electrically separated from the bit lines BL1 to BL3.

A fourth ground selection line voltage Vgsl4 is applied to a ground selection line GSL. Accordingly, ground selection transistors GST are turned on and NAND strings NS11 to NS13, NS21 to NS23, and NS31 to NS33 are electrically connected to a common source line CSL.

A second non-selection word line voltage Vuwl2 is applied to the word lines WL4 to WL6 of an unselected sub block. That is, the memory cells MC4 to MC6 of an unselected sub block are turned on.

A second non-selection word line voltage Vuwl2 is applied to the unselected word lines WL1 and WL2 of a selected sub block. That is, memory cells MC1 and MC2 connected to the unselected word lines WL1 and WL2 of a selected sub block are turned on.

A second erase verify voltage Vvfy2 is applied to the selected word line WL3 of a selected sub block. That is, memory cells MC connected to the selected word line WL3 of a selected sub block may be turned on or turned off according to a threshold voltage.

In the NAND strings NS11 to NS13 of a selected row, if one of the memory cells MC3 connected to the selected word line WL3 is turned on, a channel is formed between a corresponding bit line BL and a common source line CSL. Accordingly, current flows from a corresponding bit line BL to a common source line CSL, and a voltage of a corresponding bit line BL is lowered from the second bit line voltage Vbl2.

In the NAND strings NS11 to NS13 of a selected row, if one of the memory cells MC3 connected to the selected word line WL3 is turned off, no channel is formed between a corresponding bit line BL and a common source line CSL. Accordingly, no current flows from a corresponding bit line BL to a common source line CSL, and a voltage of a corresponding bit line BL is maintained as the second bit line voltage Vbl2.

Data latch is performed at the third timing t3. For example, according to a voltage of the bit lines BL1 to BL3, erase-pass and erase-fail may be determined.

For example, if a voltage of the first to third bit lines BL1 to BL3 is lower than the second bit line voltage Vbl2, that is, if threshold voltages of the memory cells MC3 connected to a selected word line WL3 in the NAND strings NS11 to NS13 of the selected first row are lower than the second erase verify voltage Vvfy2, it is determined as being erase-passed.

When at least one voltage applied to the first to third bit lines BL1 to BL3 is a second bit line voltage Vbl2, that is, at least one threshold voltage applied to memory cells MC3 connected to the selected word line WL3 in the NAND strings NS11 to NS13 of the selected first row is higher than the second erase verify voltage Vvfy2, it is determined as being erase-failed.

According to error correction ability of the nonvolatile memory device 100c or a host of the nonvolatile memory device 100c, a determination criterion of the erase-pass and erase-fail about the selected word line may vary. For example, if the error correction ability of the nonvolatile memory device 100c or a host of the nonvolatile memory device 100c is improved, the selected word line may be determined as being erase-passed even if at least one voltage of the bit lines BL maintains the second bit line voltage Vbl2.

Figure 36:
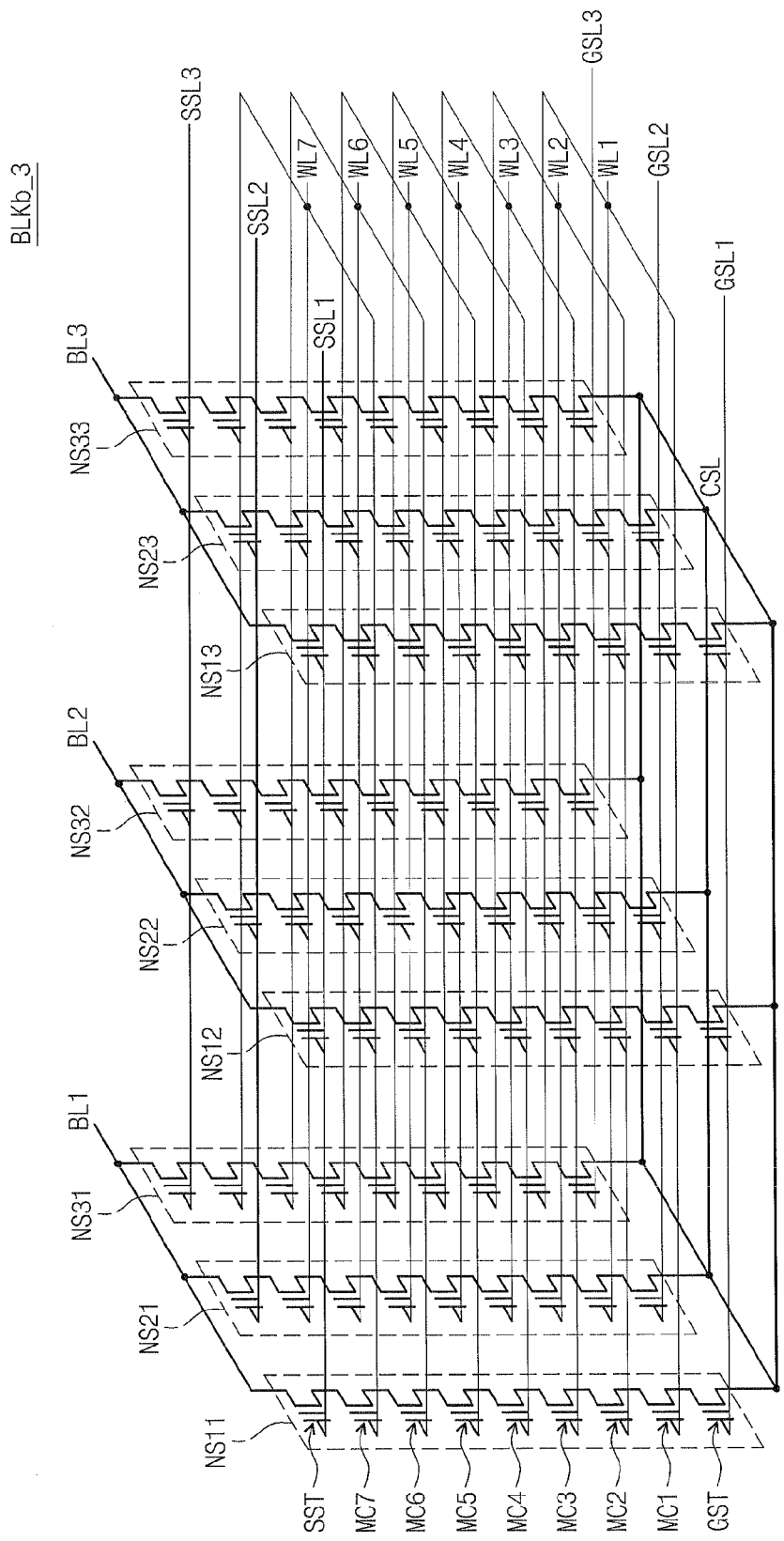
FIG. 36 is a circuit diagram of the memory block of FIG. 15 according to an embodiment of the inventive concept.

FIG. 36 is a circuit diagram BLKb_3 of the memory block BLKb of FIG. 15 according to an embodiment of the inventive concept. Referring to FIGS. 15 and 36, the NAND strings NS of the same row share a ground selection line GSL1, GSL2, or GSL3. The NAND strings NS of a different row are connected to different ground selection lines GSL1, GSL2, and GSL3, respectively.

The memory cells MC having the same height share a word line. The memory cells MC having different heights are connected to different word lines, respectively. That is, the first to seventh memory cells MC1 to MC7 are connected to the first to seventh word lines, respectively.

The NAND strings NS of the same row share a string selection line SSL. The NAND strings NS of a different row are connected to different selection lines SSL1, SSL2, and SSL3, respectively.

Except that a plurality of ground selection lines GSL1 to GSL3 are provided, the memory block BLKb_3 is erased and erase-verified as described with reference to FIGS. 14 and 22. For example, after the memory cells MC1 to MC7 of the selected memory block BLKb are erased, the selected memory block is erase-verified on a per-word line basis. If erase-fail occurs, the selected memory block BLKb is erased again, and erase-verification resumes from the erase-failed word line. The erase and erase-verification are sequentially performed on the rows of the selected memory block BLKb.

Except that a plurality of ground selection lines GSL1 to GSL3 are provided, the memory block BLKb_3 is erased and erase-verified as described with reference to FIGS. 23 and 25. For example, the string selection lines SSL1 to SSL3 may float or may be driven by a third ground selection line voltage Vgsl3. The ground selection lines GSL1 to GSL3 may float or may be driven by a third ground selection line voltage Vgsl3. A second word line erase voltage Vwe2 is applied to the word lines WL1 to WL7, and a second erase voltage Vers2 is applied to the substrate 111.

FIG. 37 is a table illustrating voltage conditions applied to an equivalent circuit BLK_3 of the memory block BLKb of FIG. 15 during erase-verification. Except that a fourth ground selection line voltage Vgsl4 is applied to a selected ground selection line among the ground selection lines GSL1 to GSL4 and a fifth ground selection line voltage Vgsl5 is applied to the unselected ground selection line, voltage conditions during erase-verification are identical to voltage conditions of FIG. 26.

A fourth ground selection line voltage Vgsl4 is a voltage for turning on a ground selection transistor GST. For example, the fourth ground selection line voltage Vgsl4 is a power voltage Vcc.

A fifth ground selection line voltage Vgsl5 is a voltage for turning off a ground selection transistor GST. For example, the fifth ground selection line voltage Vgsl5 is a ground voltage Vss.

Figure 38:
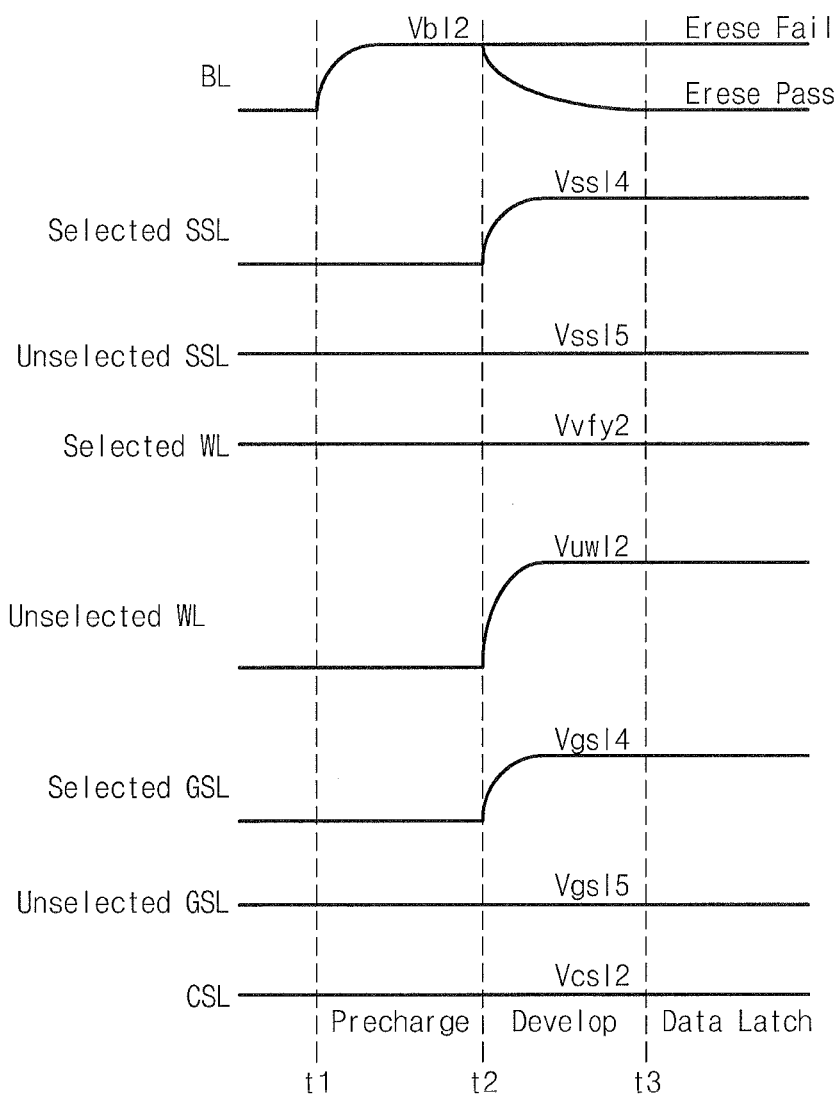
FIG. 38 is a timing diagram illustrating a voltage change according to voltage conditions of FIG. 37.

FIG. 38 is a timing diagram illustrating a voltage change according to voltage conditions of FIG. 37. Compared to the timing diagram described with reference to FIG. 27, during develop at the second timing t2, a fourth ground selection line voltage Vgsl4 is applied to an unselected ground selection line and a fifth ground selection line voltage Vgsl5 is applied to an unselected ground selection line. That is, a row of the NAND strings NS corresponding to a selected ground selection line is electrically connected to the common source line CSL, and rows of the NAND strings NS corresponding to an unselected ground selection line are electrically separated from the common source line CSL.

Figure 39:
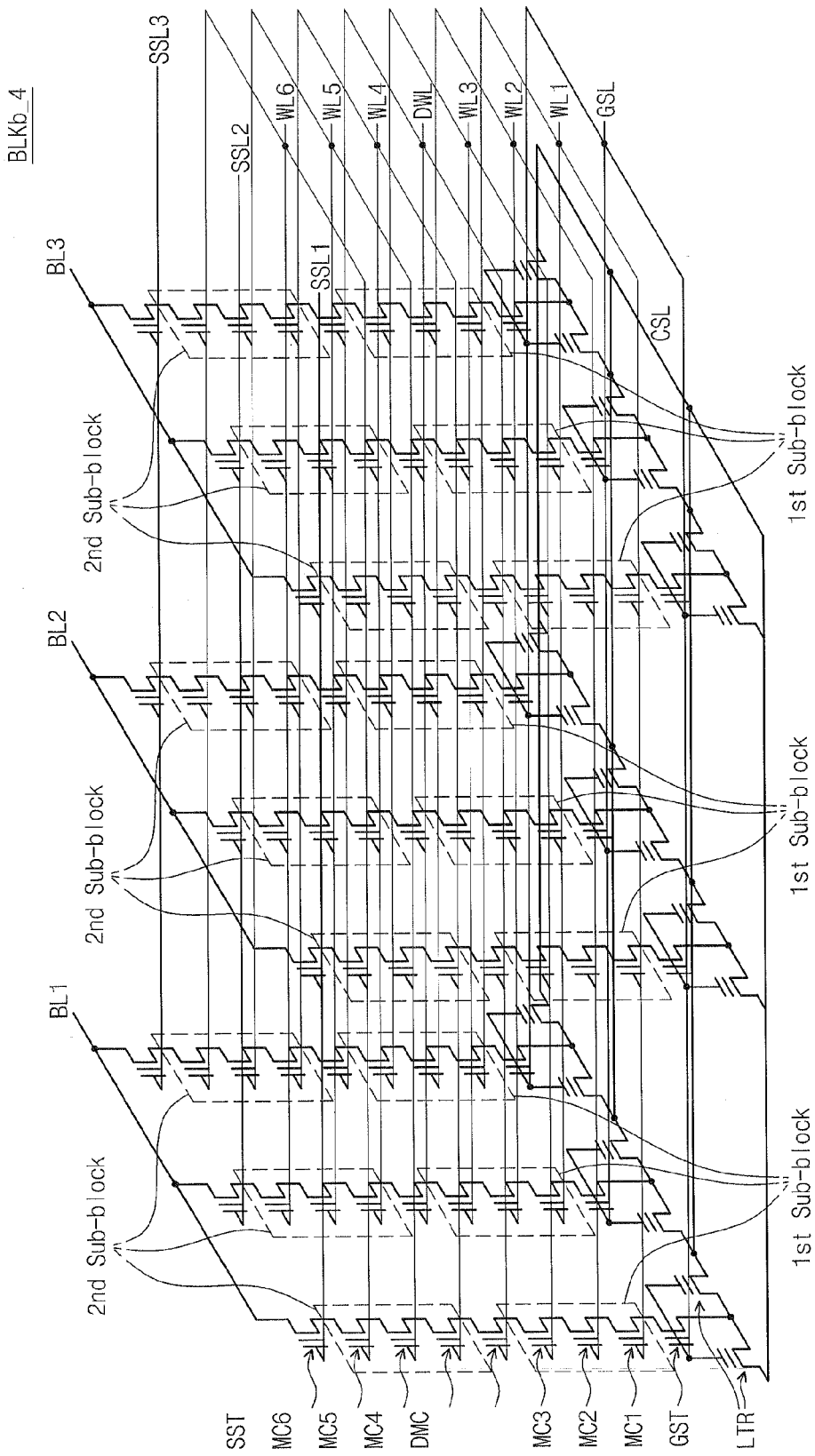
FIG. 39 is a circuit diagram of the memory block of FIG. 15 according to an embodiment of the inventive concept.

FIG. 39 is a circuit diagram BLKb_4 of the memory block BLKb of FIG. 15 according to an embodiment of the inventive concept. Compared to the equivalent circuit BLKb_1 of FIG. 21, lateral transistors STR are additionally provided at each NAND string NS of the memory block BLKb_4.

In each NAND string NS, the lateral transistors LTR are connected between a ground selection transistor GST and a common source line CSL. Gates (or control gates) of the lateral transistors LTR and a gate (or a control gate) of the ground selection transistor GST are connected to the ground selection line GSL.

As described with reference to FIGS. 15 through 20, the first conductive materials 211, 212, and 213 having the first height correspond to the first to third ground selection lines GSL1 to GSL3, respectively.

When a specific voltage is applied to the first conductive materials 211, 212, and 213 having the first height, a channel is formed in a region of the channel layer 114 adjacent to the first conductive materials 211, 212, and 213. That is, a channel is formed in the ground selection transistors GST. Additionally, a specific voltage is applied to the first conductive materials 211, 212, and 213, channels are formed in a region of the substrate 111 adjacent to the first conductive materials 211, 212, and 213. For example, in the case of the NAND strings NS21 to NS23 provided between the second third doping regions 312 and 313, channels may be formed between the second third doping regions 312 and 313.

As described with reference to FIGS. 15 through 20, the first to fourth doping regions 311 to 314 are commonly connected to form a common source line CSL. Channels of the common source line CSL and memory cells MC1 to MC7 are electrically connected through channels (e.g., horizontal channels) generated in the substrate 111 by a voltage of the ground selection line GSL and channels (e.g., a vertical channel) generated in the channel layer 114.

That is, transistors vertical and parallel to a substrate driven by the ground selection line GSL are provided between the common source line CSL and the first memory cells MC1. The transistors vertical to the substrate may be regarded as a ground selection transistor GST, and the transistors parallel to the substrate may be regarded as lateral transistors LTR.

Figure 40:
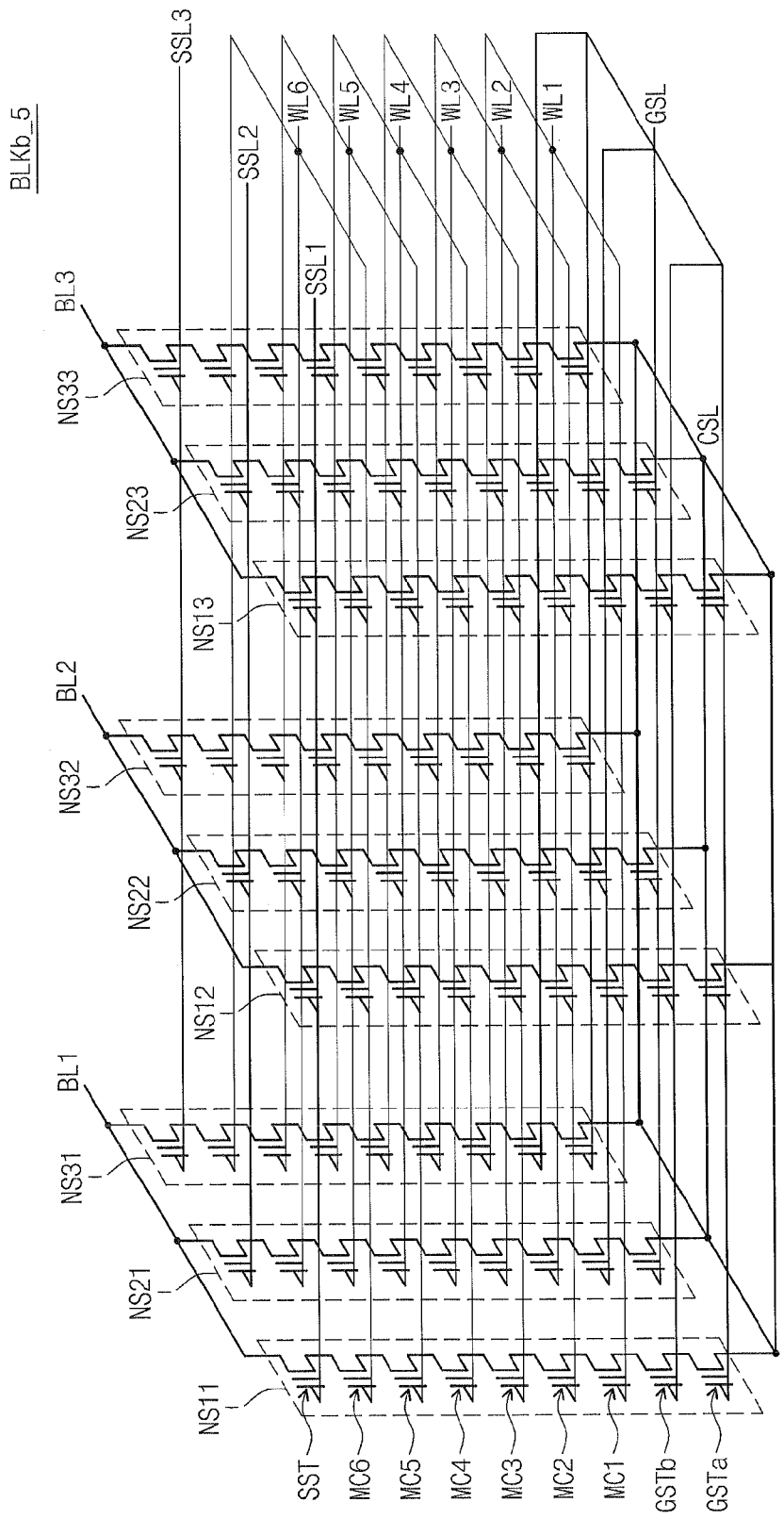
FIG. 40 is a circuit diagram of the memory block of FIG. 15 according to an embodiment of the inventive concept.

FIG. 40 is a circuit diagram BLKb_5 of the memory block BLKb of FIG. 15 according to an embodiment of the inventive concept. Compared to the equivalent circuit BLKb_1 of FIG. 21, two ground selection transistors GSTa and GSTb are provided between memory cells MC1 to MC6 and a common source line CSL in each NAND string NS.

First conductive lines 211, 212, and 213 having the first height form ground selection transistors GSTa and first conductive lines 221, 222, and 223 having the second height form b ground selection transistors GSTb.

In the NAND strings of the same row, the ground selection transistors GSTa and GSTb share one ground selection line GSL. In the NAND strings of different rows, the ground selection transistors GSTa and GSTb share one ground selection line GSL. That is, the ground selection transistors GSTa and GSTb are commonly connected to one ground selection line GSL.

Each NAND string NS provides two ground selection transistors GSTa and GSTb. That is, first conductive materials of two layers (e.g., first and second heights) among the first conductive materials 211 to 291, 212 to 292, and 213 to 293 form the ground selection transistors GSTa and GSTb. However, the number of the ground selection transistors provided to each NAND string NS is not limited. For example, more than three ground selection transistors may be provided in each NAND string NS.

Figure 41:
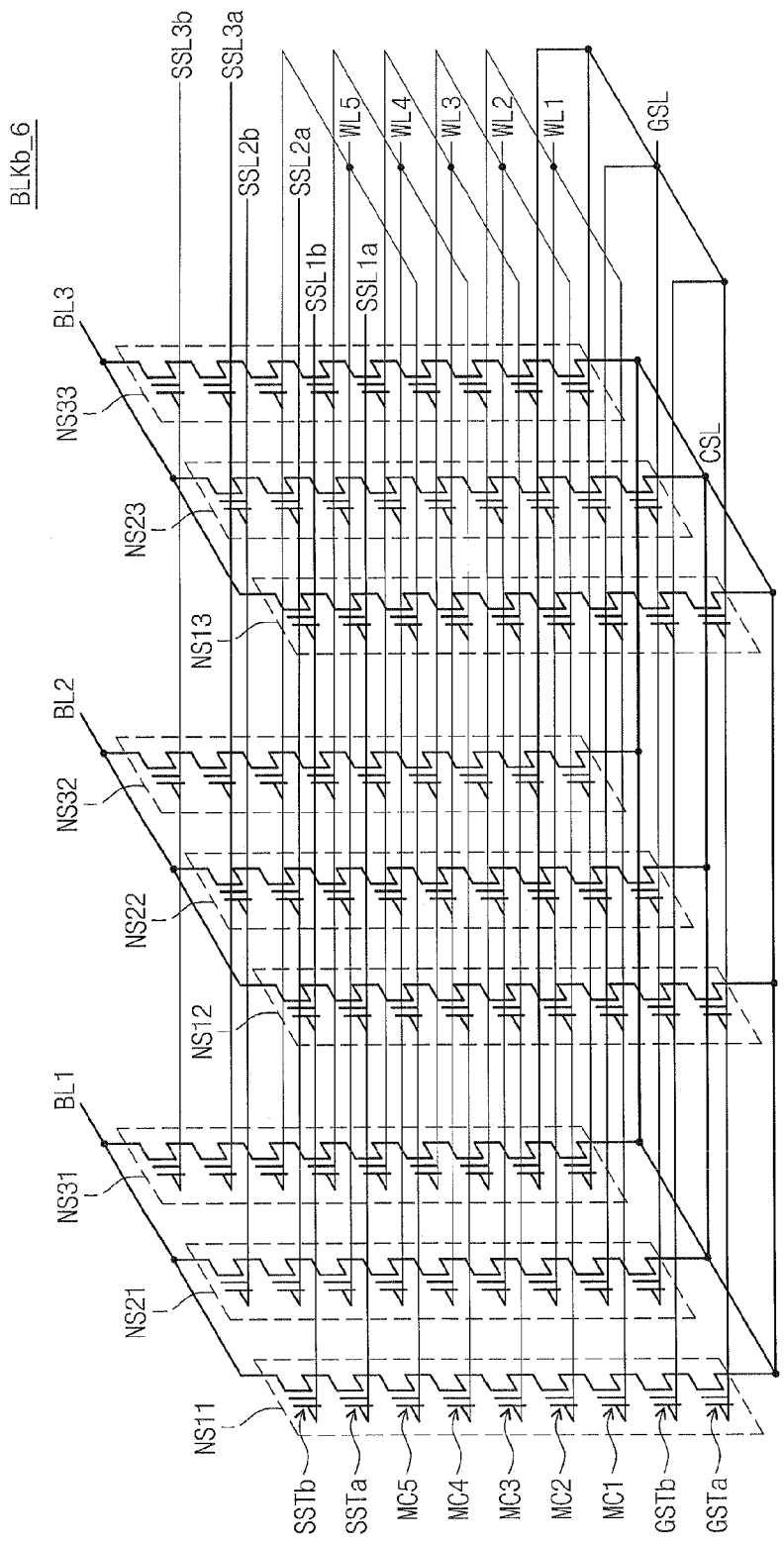
FIG. 41 is a circuit diagram of the memory block of FIG. 15 according to an embodiment of the inventive concept.

FIG. 41 is a circuit diagram BLKb_6 of the memory block BLKb of FIG. 15 according to an embodiment of the inventive concept. Compared to the equivalent circuit BLKb_5 of FIG. 40, two string selection transistors SSTa and SSTb are provided between the memory cells MCa to MC5 and the bit line BL in each NAND string NS.

First conductive lines 281, 282, and 283 having the eighth height form string selection transistors SSTa and first conductive lines 291, 292, and 293 having the ninth height form b string selection transistors SSTb.

In NAND strings of the same row, the string selection transistors SSTa and SSTb having the same height share one string selection line SSL. The string selection transistors SSTa and SSTb having a different height are connected to different string selection lines, respectively.

In the NAND strings NS11 to NS13 of the first row, the string selection transistors SSTa share a 1a string selection line SSL1a. The b string selection transistors SSTb share a 1b string selection line SSL1b.

In the NAND strings NS21 to NS23 of the second row, the string selection transistors SSTa share a 2a string selection line SSL2a. The b string selection transistors SSTb share a 2b string selection line SSL2b.

In the NAND strings NS31 to NS33 of the third row, the string selection transistors SSTa share a 3a string selection line SSL3a. The b string selection transistors SSTb share a 3b string selection line SSL3b.

Each NAND string NS provides two string selection transistors SSTa and SSTb. That is, first conductive materials of two layers (e.g., eighth and ninth heights) among the first conductive materials 211 to 291, 212 to 292, and 213 to 293 form the string selection transistors SSTa and SSTb. However, the number of the string selection transistors provided to each NAND string NS is not limited. For example, more than three string selection transistors may be provided in each NAND string NS.

Figure 42:
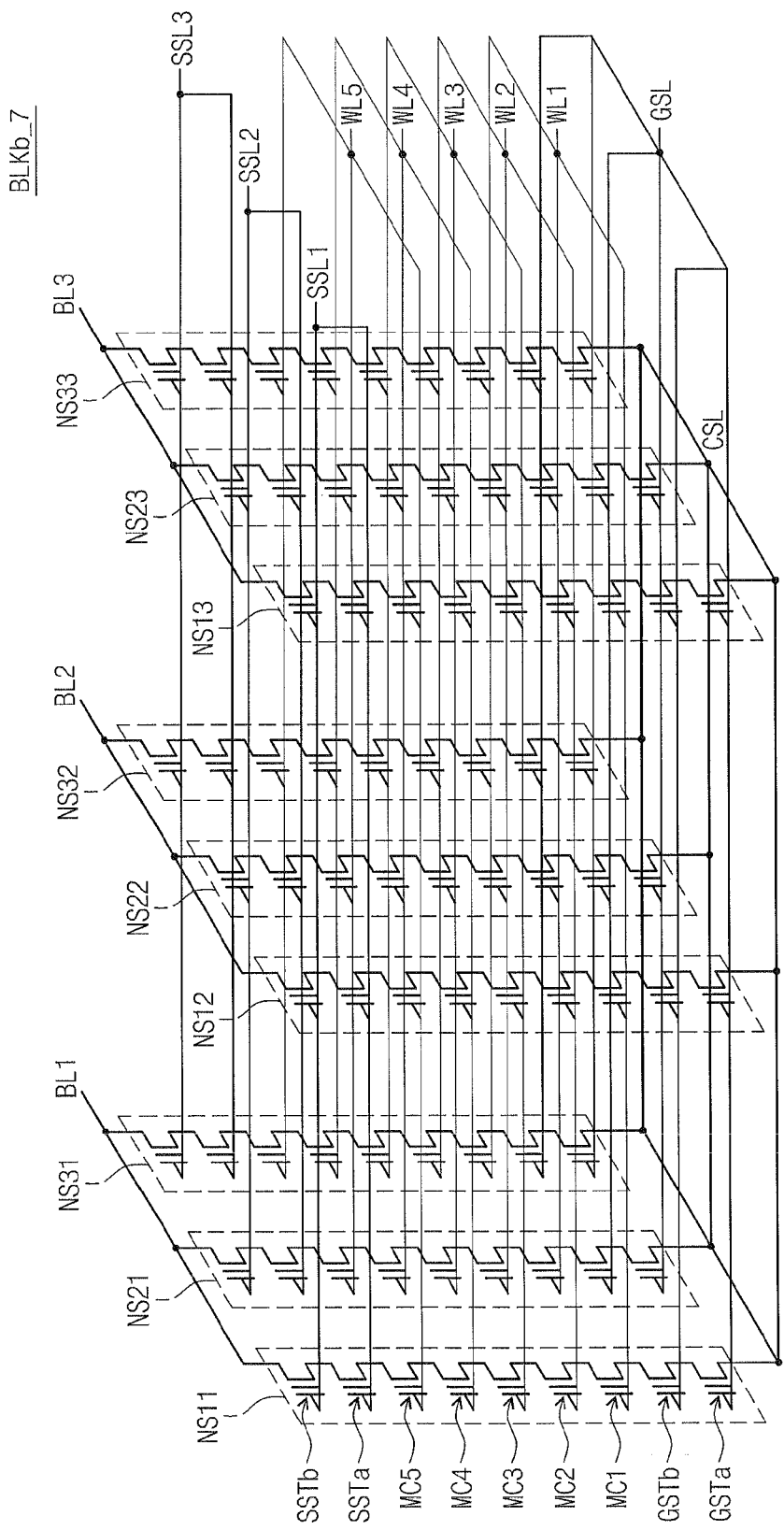
FIG. 42 is a circuit diagram of the memory block of FIG. 15 according to an embodiment of the inventive concept.

FIG. 42 is a circuit diagram BLKb_7 of the memory block BLKb of FIG. 15 according to an embodiment of the inventive concept. Compared to the equivalent circuit BLKb_6 of FIG. 41, the string selection transistors SSTa and SSTb of the NAND strings NS of the same row share a string selection line SSL.

As described with reference to FIG. 41, the number of string selection transistors provided in each NAND string NS is not limited.

Figure 43:
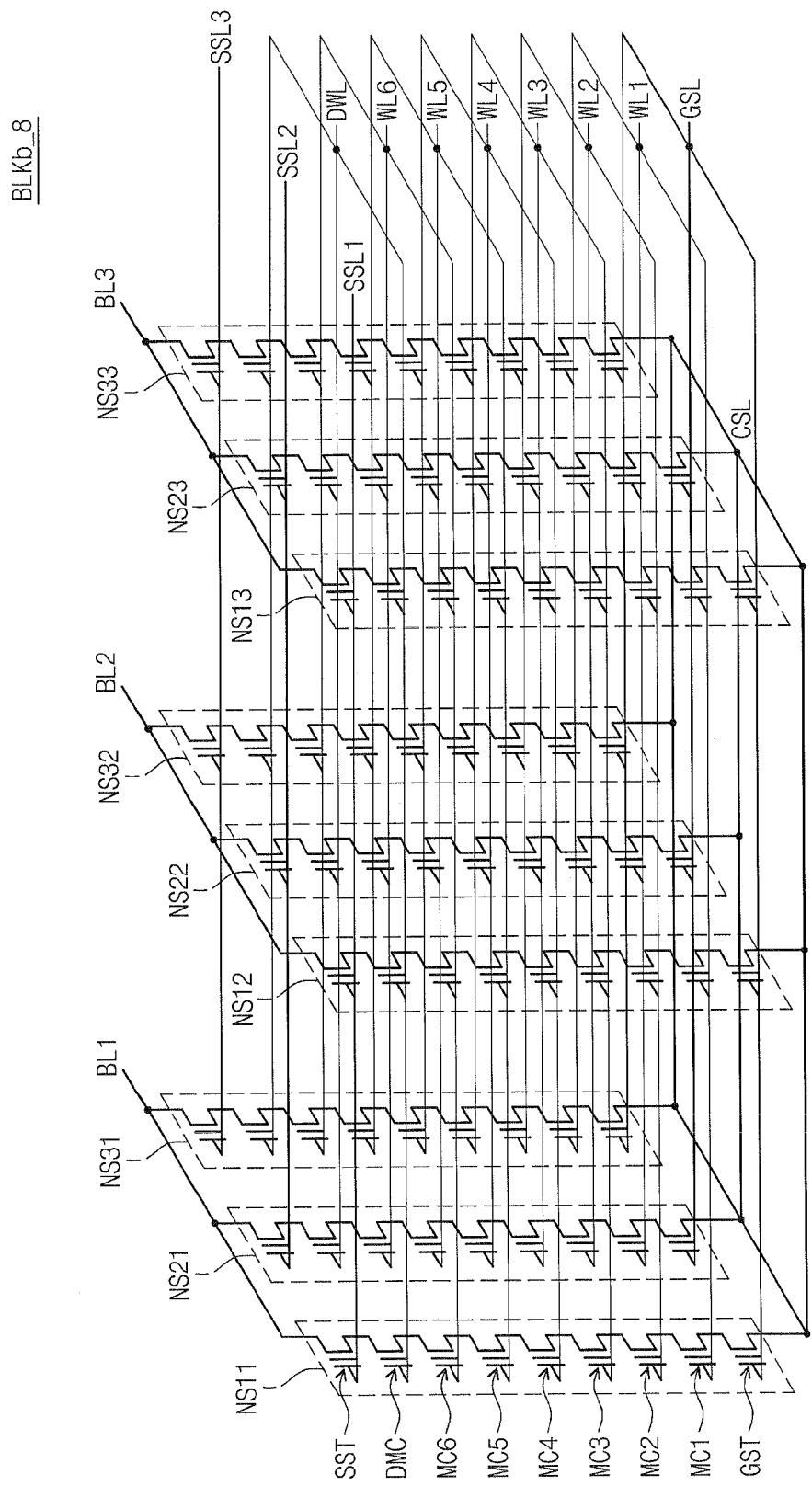
FIG. 43 is a circuit diagram of the memory block of FIG. 15 according to an embodiment of the inventive concept.

FIG. 43 is a circuit diagram BLKb_8 of the memory block BLKb of FIG. 15 according to an embodiment of the inventive concept. Compared to the equivalent circuit BLKb_1 of FIG. 21, a dummy memory cell DMC is provided between the string selection transistor SST and the memory cells MC1 to MC6 in each NAND string.

First conductive lines 281, 282, and 283 having the eighth height form dummy memory cells DMC. The dummy memory cells DMC are commonly connected to a dummy word line DWL. A dummy word line DWL is provided between the string selection lines SSL1 to SSL3 and the word lines WL1 to WL6.

One dummy memory cell DMC is provided between the memory cells MC1 to MC6 and the string selection transistors SST in each NAND string NS. However, the number of dummy memory cell MC provided between the memory cells MC1 to MC6 and the string selection transistor SST in each NAND string NS is not limited. For example, in each NAND string NS, more than two dummy memory cells may be provided between the memory cells MC1 to MC6 and the string selection transistor SST in each NAND string NS.

Figure 44:
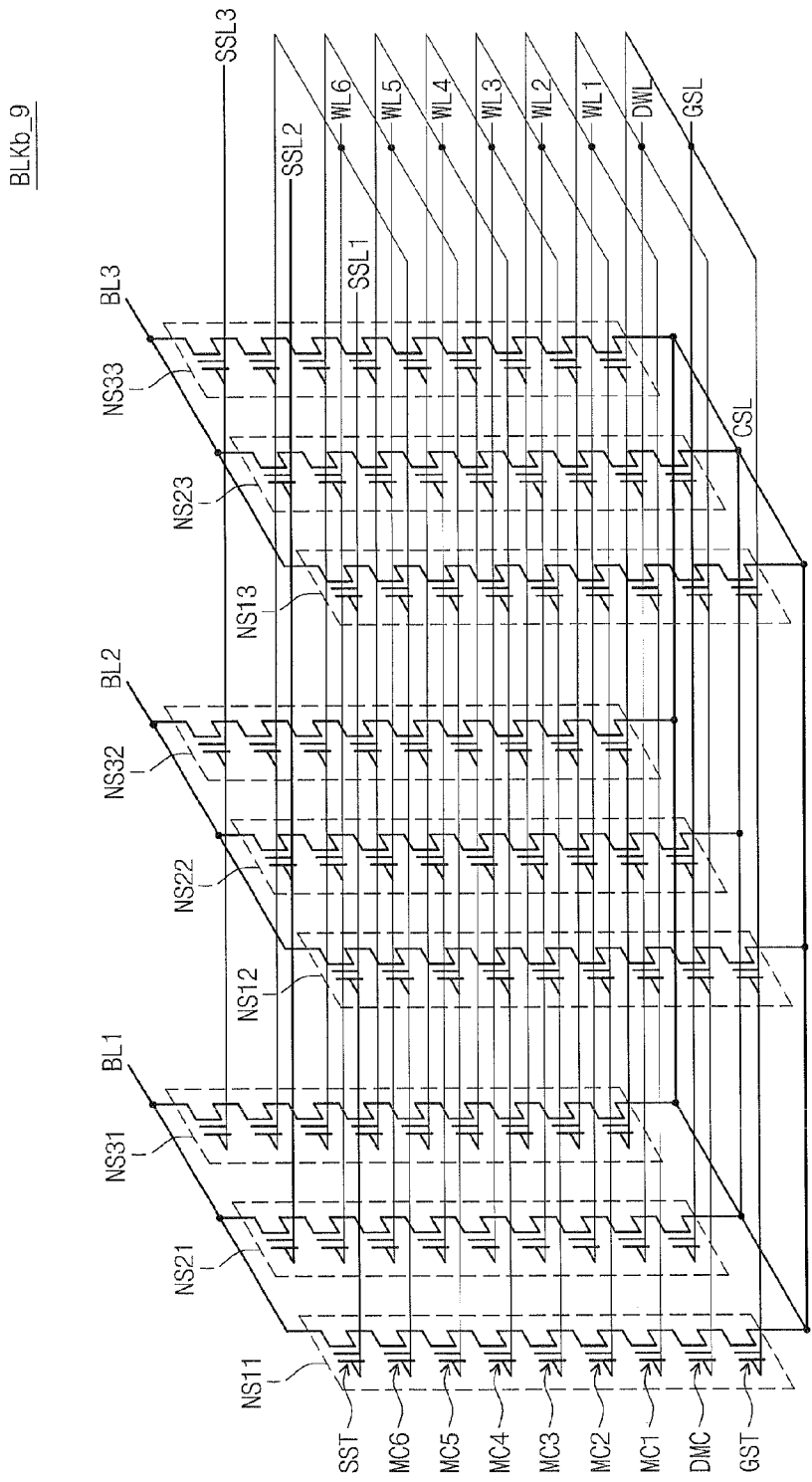
FIG. 44 is a circuit diagram of the memory block of FIG. 15 according to an embodiment of the inventive concept.

FIG. 44 is a circuit diagram BLKb_9 of the memory block BLKb of FIG. 15 according to an embodiment of the inventive concept. Compared to the equivalent circuit BLK_1 of FIG. 21, a dummy memory cell DMC is provided between the ground selection transistor GST and the memory cells MC1 to MC6 in each NAND string.

The first conducive lines 221, 222, and 223 having the second height form dummy memory cells DMC. The dummy memory cells DMC are commonly connected to the dummy word line DWL. That is, a dummy word line DWL is provided between the ground selection line GSL and the word lines WL1 to WL6.

One dummy memory cell DMC is provided between the memory cells MC1 to MC6 and the string selection transistor GST in each NAND string NS. However, the number of dummy memory cells MC provided between the memory cells MC1 to MC6 and the ground selection transistor GST in each NAND string NS is not limited. For example, in each NAND string NS, more than two dummy memory cells may be provided between the memory cells MC1 to MC6 and the ground selection transistor GST in each NAND string NS.

Figure 45:
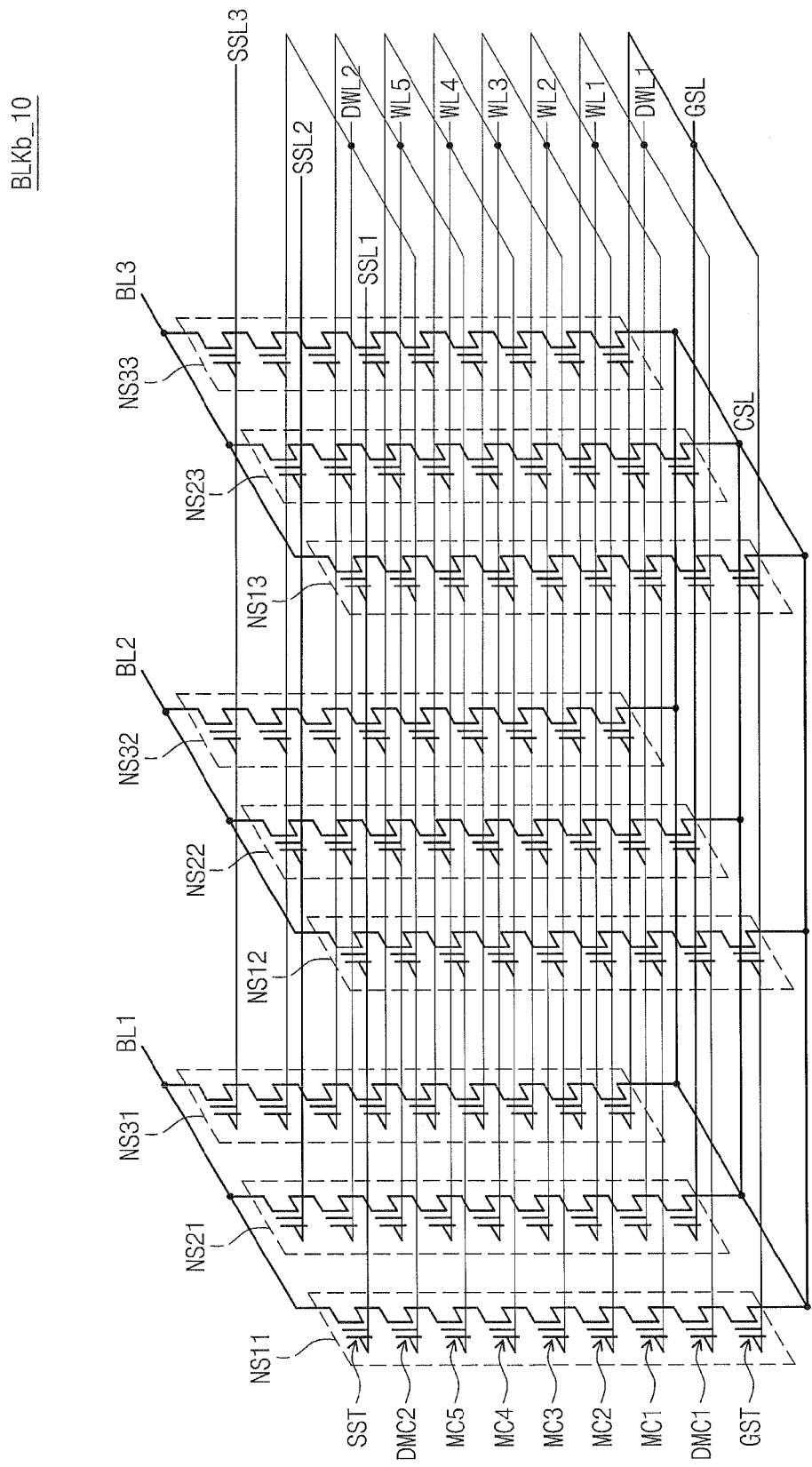
FIG. 45 is a circuit diagram of the memory block of FIG. 15 according to an embodiment of the inventive concept.

FIG. 45 is a circuit diagram BLKb_10 of the memory block BLKb of FIG. 15 according to an embodiment of the inventive concept. Compared to the equivalent circuit BLKb_1 of FIG. 21, a first dummy memory cell DMC1 is provided between the ground selection transistor GST and the memory cells MC1 to MC5 in each NAND string.

The first conducive lines 221, 222, and 223 having the second height form first dummy memory cells DMC1. The first dummy memory cells DMC1 are commonly connected to a first dummy word line DWL1. That is, the first dummy word line DWL1 is provided between the ground selection line GSL and the word lines WL1 to WL5.

A second dummy memory cell DMC2 is provided between the string selection transistor SST and the memory cells MC1 to MC5 in each NAND string NS.

The first conducive lines 281, 282, and 283 having the eighth height form second dummy memory cells DMC2. The second dummy memory cells DMC2 are commonly connected to a second dummy word line DWL2. That is, the first dummy word line DWL1 is provided between the string selection lines SSL1 to SSL3 and the word lines WL1 to WL5.

Each dummy memory cell DMC is provided between the memory cells MC1 to MC5 and between the memory cells MC1 to MC5 and the string selection transistor SST in each NAND string NS. However, the number of dummy memory cells MC provided between the memory cells MC1 to MC5 and the ground selection transistor GST in each NAND string NS is not limited. In each NAND string NS, the number of dummy memory cells DMC provided between the memory cells MC1 to MC5 and the string selection transistor SST is not limited.

For example, in each NAND string NS, more than two dummy memory cells may be provided between the memory cells MC1 to MC5 and the ground selection transistor GST. In each NAND string NS, more than two dummy memory cells may be provided between the memory cells MC1 to MC5 and the string selection transistor SST.

In the equivalent circuits according to the first to tenth embodiments of the memory block BLKb, the memory block BLKb is erased, and then erase-verified on a per-word line basis. If erase-fail occurs, the memory block BLKb is erased again, then erase-verification resumes from the erase-failed word line. The erase and erase-verification are performed for each row of the NAND strings NS.

At least two of the equivalent circuits according to the first to tenth embodiments of the memory block BLKb may be combined.

Figure 46:
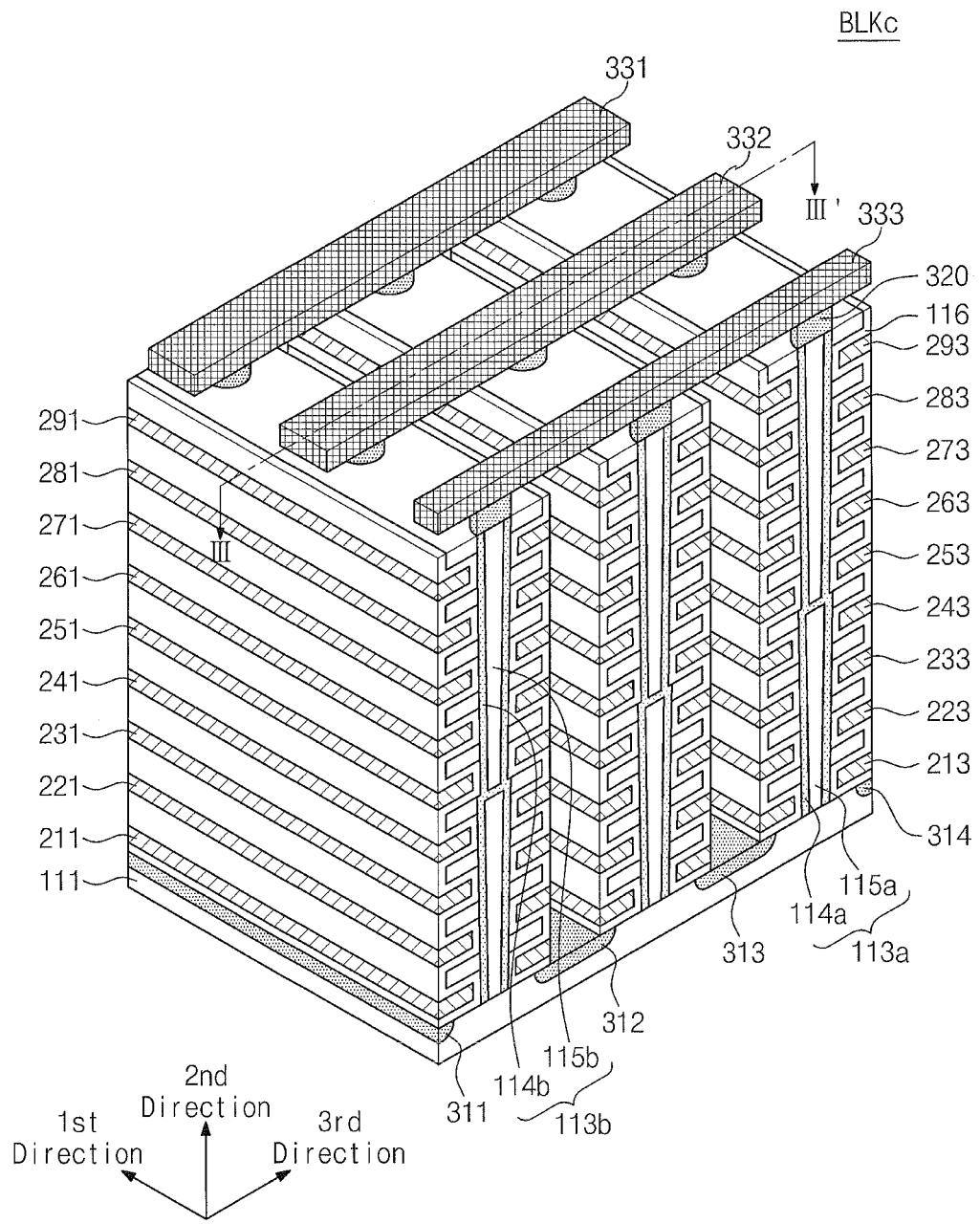
FIG. 46 is a perspective view illustrating a memory block in the nonvolatile memory device of FIG. 13 according to an embodiment of the inventive concept.
Figure 47:
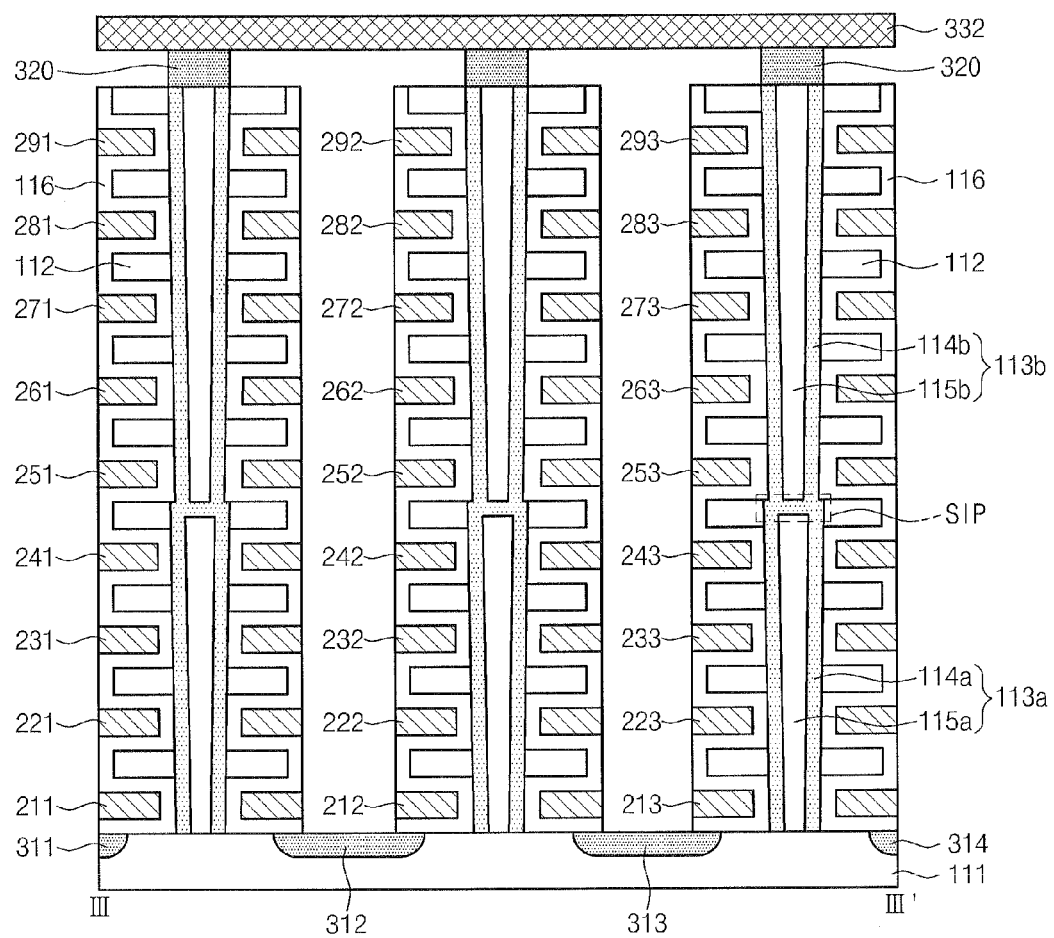
FIG. 47 is a sectional view taken along the line of the memory block of FIG. 46 according to an embodiment of the inventive concept.

FIG. 46 is a perspective view illustrating one of the memory blocks BLK1 to BLKz in the nonvolatile memory device 100b of FIG. 13 according to an embodiment of the inventive concept. FIG. 47 is a sectional view taken along the line of FIG. 46.

Compared to the memory block BLKb described with reference to FIGS. 15 and 16, one pillar of the memory block BLKc includes a first sub pillar 113a and a second sub pillar 113b. Except that the pillar 113 of the memory block BLKb is replaced with the first and second sub pillars 113a and 113b, the memory block BLKc has the same structure as the memory block BLKb.

Figure 49:
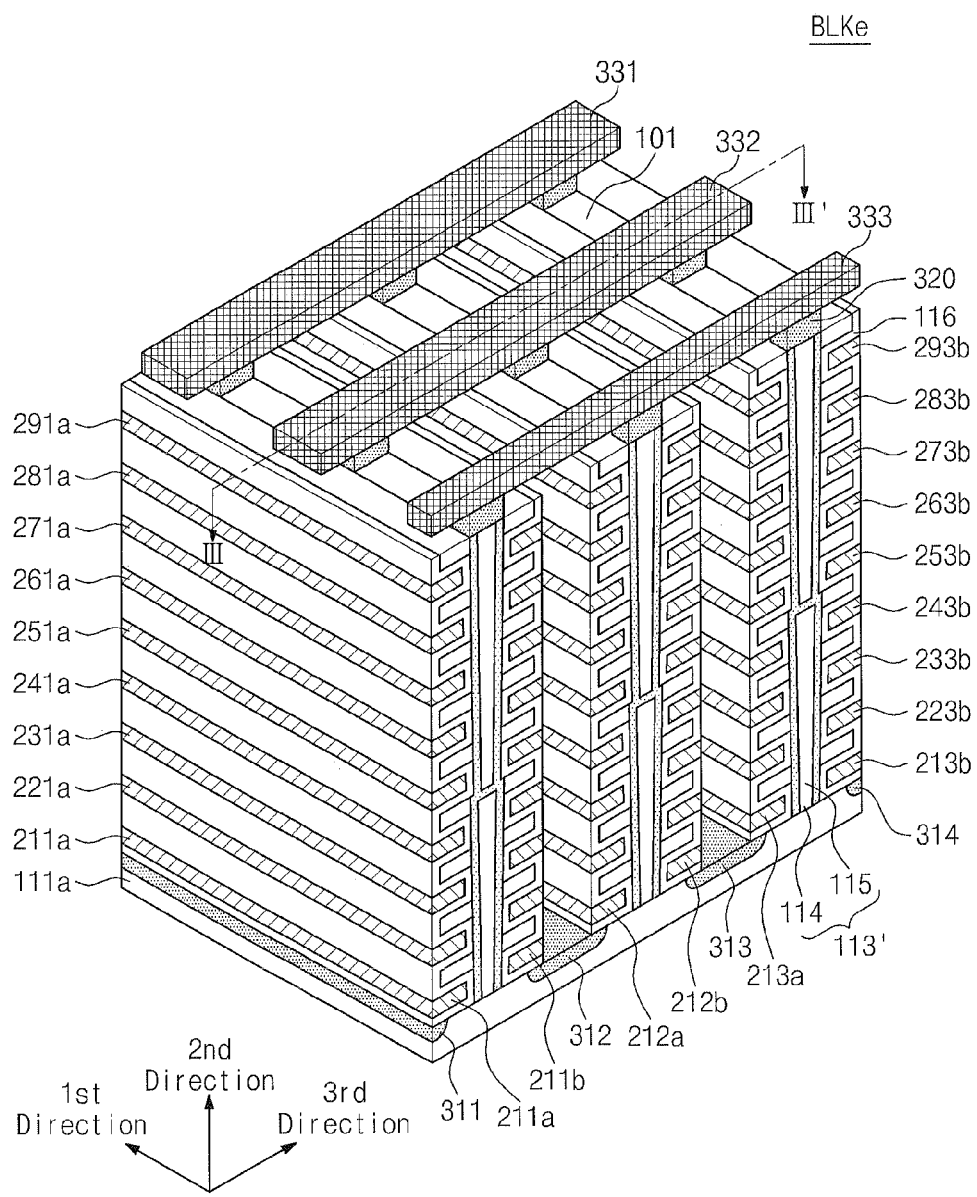
FIG. 49 is a perspective view illustrating a memory block in the nonvolatile memory device of FIG. 13 according to an embodiment of the inventive concept.

Referring to FIGS. 46 and 49, the first sub pillar 113a is provided on the substrate 111. Exemplarily, a channel layer 114a of the first sub pillar 113a includes a silicon material having a p-type. The channel layer 114a of the first sub pillar 113a operates as a body of the second direction. An internal material 115a of the first sub pillar 113b comprises an internal material 115b.

The channel layer 114a of the first sub pillar 113a is connected to the channel layer 114b of the second sub pillar 113b. For example, as shown in FIGS. 32 and 33, the channel layer 114a of the first sub pillar 113a is connected to the channel layer 114b of the second sub pillar 113b through a silicon pad SIP.

First conductive materials 251, 252, and 253 having the height corresponding to the silicon pad SIP (i.e., the fifth height) may form a dummy word line DWL and a dummy memory cell DMC. For example, if the memory block BLKb is divided into a plurality of sub blocks along the second direction, it may be divided into sub blocks based on the height corresponding to the silicon pad SIP.

An equivalent circuit of the memory block BLKc may correspond to one of the equivalent circuits BLKb_1, BLKb_2, and BLKb_3 described with reference to FIGS. 21, 29, and 36. An equivalent circuit of the memory block BLKc may correspond to one of the equivalent circuits BLKb_4 to BLKb_10 described with reference to FIGS. 39 through 45.

Figure 48:
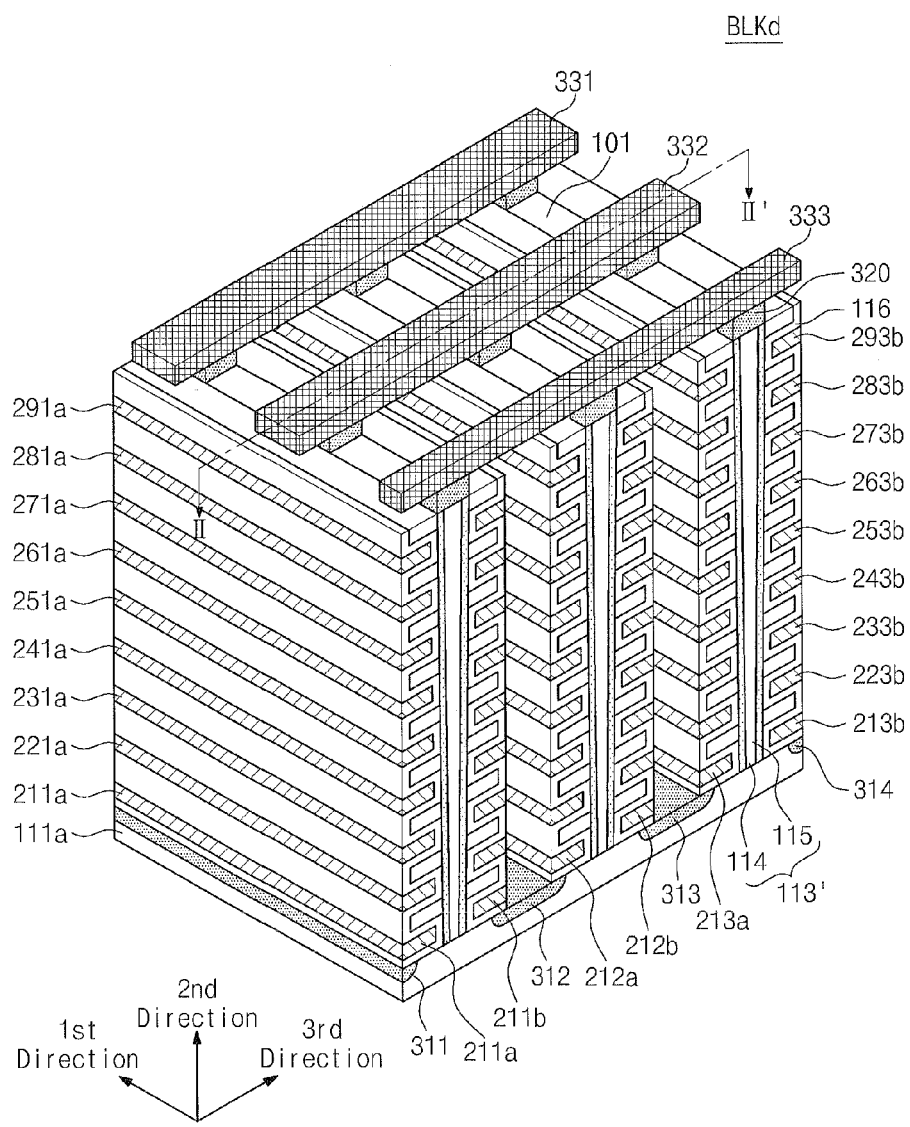
FIG. 48 is a perspective view illustrating a memory block of the nonvolatile memory device of FIG. 13 according to an embodiment of the inventive concept.

FIG. 48 is a perspective view illustrating one of the memory blocks BLK1 to BLKz of the nonvolatile memory device 100b of FIG. 13 according to an embodiment of the inventive concept. The sectional view taken along the line II-II' of FIG. 48 is identical to the sectional view of FIG. 16.

Compared to the memory block BLKb described with reference to FIGS. 15 and 16, pillars 113' are provided in a square column in the memory block BLKd. Additionally, insulation materials 101 are provided between the pillars 113' spaced along the first direction by a specific distance. Exemplarily, the insulation materials 101 extend along the second direction to contact the substrate 111.

The first conductive materials 211 to 291, 212 to 292, and 213 to 293 described with reference to FIG. 15 are separated into first portions 211a to 291a, 212a to 292a, and 213a to 293a and second portions 211b to 291b, 212b to 292b, and 213b to 293b in a region having the insulation materials 101.

In a region on the first and second doping regions 311 and 312, each pillar 133' forms the first portions 211a to 291a of the first conductive materials, the insulation layer 116, and one NAND string NS, and also the second portions 211b to 291b of the first conductive materials, the insulation layer 116, and another NAND string NS.

In a region on the second and third doping regions 312 and 313, each pillar 133' forms the first portions 212a to 292a of the first conductive materials, the insulation layer 116, and one NAND string NS, and also the second portions 212b to 292b of the first conductive materials, the insulation layer 116, and another NAND string NS.

In a region on the third and fourth doping regions 313 and 314, each pillar 133' forms the first portions 213a to 293a of the first conductive materials, the insulation layer 116, and one NAND string NS, and also the second portions 213b to 293b of the first conductive materials, the insulation layer 116, and another NAND string NS.

That is, by separating the first and second portions 211a to 291a and 211b to 291b of the first conductive materials provided at both sides of each pillar 113' using the insulation material 101, each pillar 113' may form two NAND strings NS.

As described with reference to FIGS. 15 and 16, the first portions 211a to 291a and the second portions 211b to 291b, 212b to 292b, and 213b to 293b of the first conductive materials may correspond to the ground selection lines GSL, word lines WL, and string selection lines SST. The word lines WL having the same height may be commonly connected.

Except for the number of rows in the NAND strings NS, an equivalent circuit of the memory block BLKd may correspond to one of the equivalent circuits BLKb_1, BLKb_2, and BLKb_3 described with reference to FIGS. 21, 29, and 36. For example, the number of rows in the NAND strings NS of an equivalent circuit of the memory block BLKd may be two times that of rows in the NAND strings NS of the equivalent circuits BLKb_1, BLKb_2, and BLKb_3 described with reference to FIGS. 21, 29, and 36.

Except for the number of rows in the NAND strings NS, an equivalent circuit of the memory block BLKd may correspond to one of the equivalent circuits BLKb_4 to BLKb_10 described with reference to FIGS. 39 through 45. For example, the number of rows in the NAND strings NS of an equivalent circuit of the memory block BLKd may be two times that of rows in the NAND strings NS of the equivalent circuits BLKb_4 to BLKb_10 described with reference to FIGS. 39 through 45.

FIG. 49 is a perspective view illustrating one of the memory blocks BLK1 to BLKz in the nonvolatile memory device 100c of FIG. 13 according to an embodiment of the inventive concept. The sectional view taken along the line of FIG. 49 is identical to that of FIG. 47. Except that one pillar of the memory block BLKe includes a first sub pillar 113a and a second sub pillar 113b, the memory block BLKe is identical to the memory block BLKd described with reference to FIG. 48.

As mentioned with reference to FIGS. 46 and 47, one pillar 113' in the memory block BLKe includes a first sub pillar 113a and a second sub pillar 113b. Except that the first and second sub pillars 113a and 113b have a structure of a square pillar shape, the first sub pillar 113a and the second sub pillar 113b have the same structures as those of the first and second sub pillars 113a and 113b described with reference to FIGS. 46 and 47.

As mentioned with reference to FIG. 48, one pillar 113' forms two NAND stings NS. The first portions 211a to 291a and the second portions 211b to 291b, 212b to 292b, and 213b to 293b of the first conductive materials may correspond to the ground selection lines GSL, word lines WL, and string selection lines SST. The word lines WL having the same height may be commonly connected.

Except for the number of rows in the NAND strings NS, an equivalent circuit of the memory block BLKe may correspond to one of the equivalent circuits BLKb_1, BLKb_2, and BLKb_3 described with reference to FIGS. 21, 29, and 36. For example, the number of rows in the NAND strings NS of an equivalent circuit of the memory block BLKe may be two times that of rows in the NAND strings NS of the equivalent circuits BLKb_1, BLKb_2, and BLKb_3 described with reference to FIGS. 21, 29, and 36.

Except for the number of rows in the NAND strings NS, an equivalent circuit of the memory block BLKe may correspond to one of the equivalent circuits BLKb_4 to BLKb_10 described with reference to FIGS. 39 through 45. For example, the number of rows in the NAND strings NS of an equivalent circuit of the memory block BLKe may be two times that of rows in the NAND strings NS of the equivalent circuits BLKb_4 to BLKb_1 described with reference to FIGS. 39 through 45.

Figure 53:
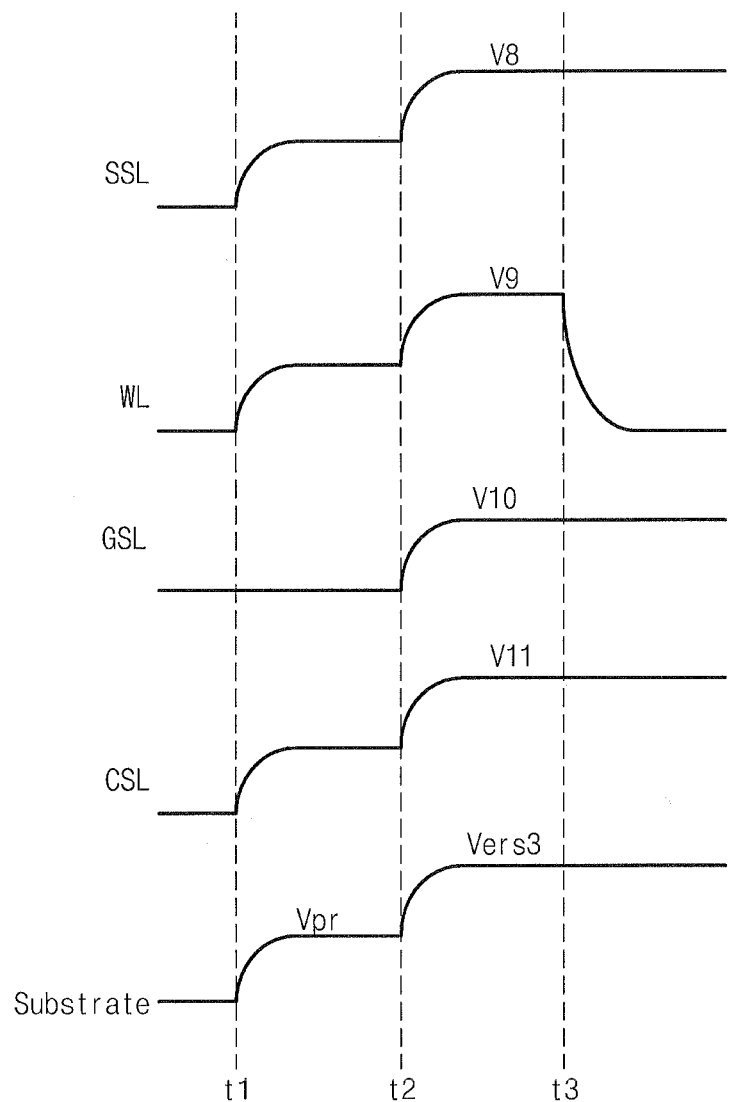
FIG. 53 is a timing diagram illustrating a voltage change of the memory block of FIGS. 50 and 51 according to the voltage conditions of FIG. 52.

FIG. 53 is a perspective view illustrating one of the memory blocks BLK1 to BLKz in the nonvolatile memory device 100b of FIG. 13 according to an embodiment of the inventive concept. FIG. 51 is a sectional view taken along the line IV-IV' of FIG. 50. Except that an n-type doping region 315 forming a common source line CSL is provided in a plate shape, the memory block BLKf may have the same structure as that of the memory block BLKa described with reference to FIGS. 15 and 16. In an embodiment, the n-type doping region 315 may be provided as an n-type well.

An equivalent circuit of the memory block BLKf may correspond to one of the equivalent circuits BLKb_1, BLKb_2, and BLKb_3 described with reference to FIGS. 21, 29, and 36. An equivalent circuit of the memory block BLKdc may correspond to one of the equivalent circuits BLKb_4 to BLKb_10 described with reference to FIGS. 39 through 45.

Figure 50:
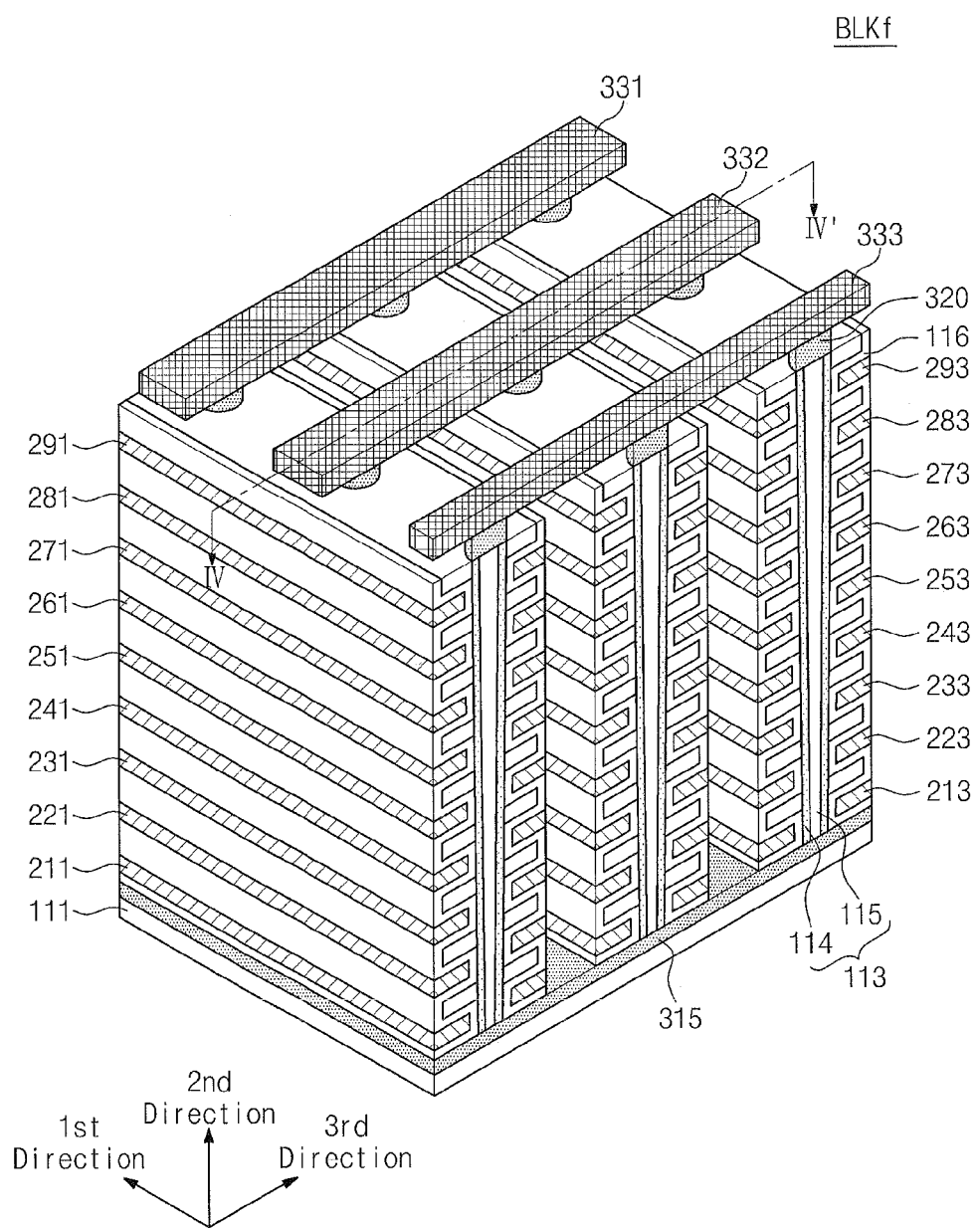
FIG. 50 is a perspective view of a memory block in the nonvolatile memory device of FIG. 13 according to an embodiment of the inventive concept.
Figure 51:
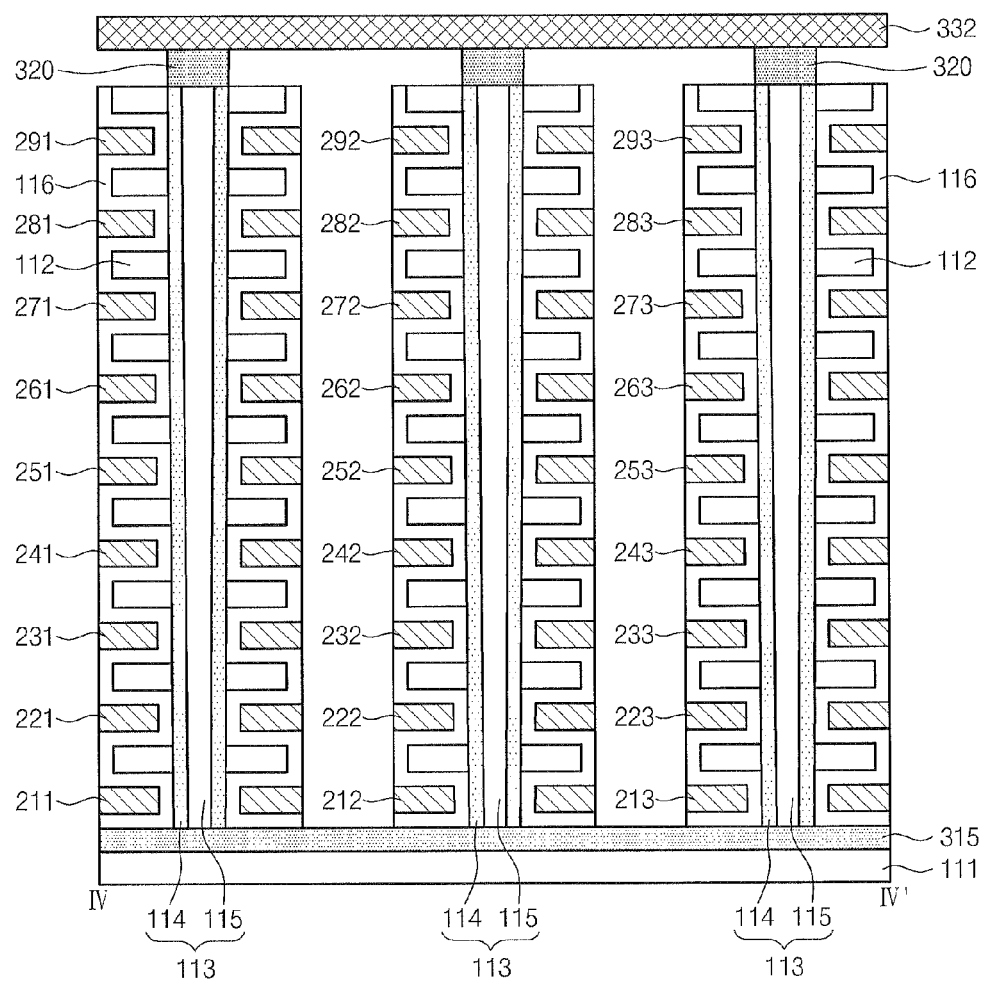
FIG. 51 is a sectional view taken along the line IV-IV' of FIG. 50 according to an embodiment of the inventive concept.

FIG. 52 is a table illustrating voltage conditions during an erase operation of the memory block BLKf of FIGS. 50 and 51 according to an embodiment of the inventive concept. The table of FIG. 52 may illustrate voltage conditions when an equivalent circuit of the memory block BLKf corresponds to the equivalent circuit BLK_1 described with reference to FIG. 21.

Referring to FIGS. 21, and 50 through 52, the string selection lines SSL1 to SSL3 float during an erase operation. After the word lines WL1 to WL7 float, they are driven by the third word line erase voltage Vwe3. After the ground selection line GSL is driven by a ground voltage Vss, they float. The common source line CSL floats. Then, the substrate 111 is driven by a pre voltage Vpr and then is driven by a third erase voltage Vers3.

Figure 54:
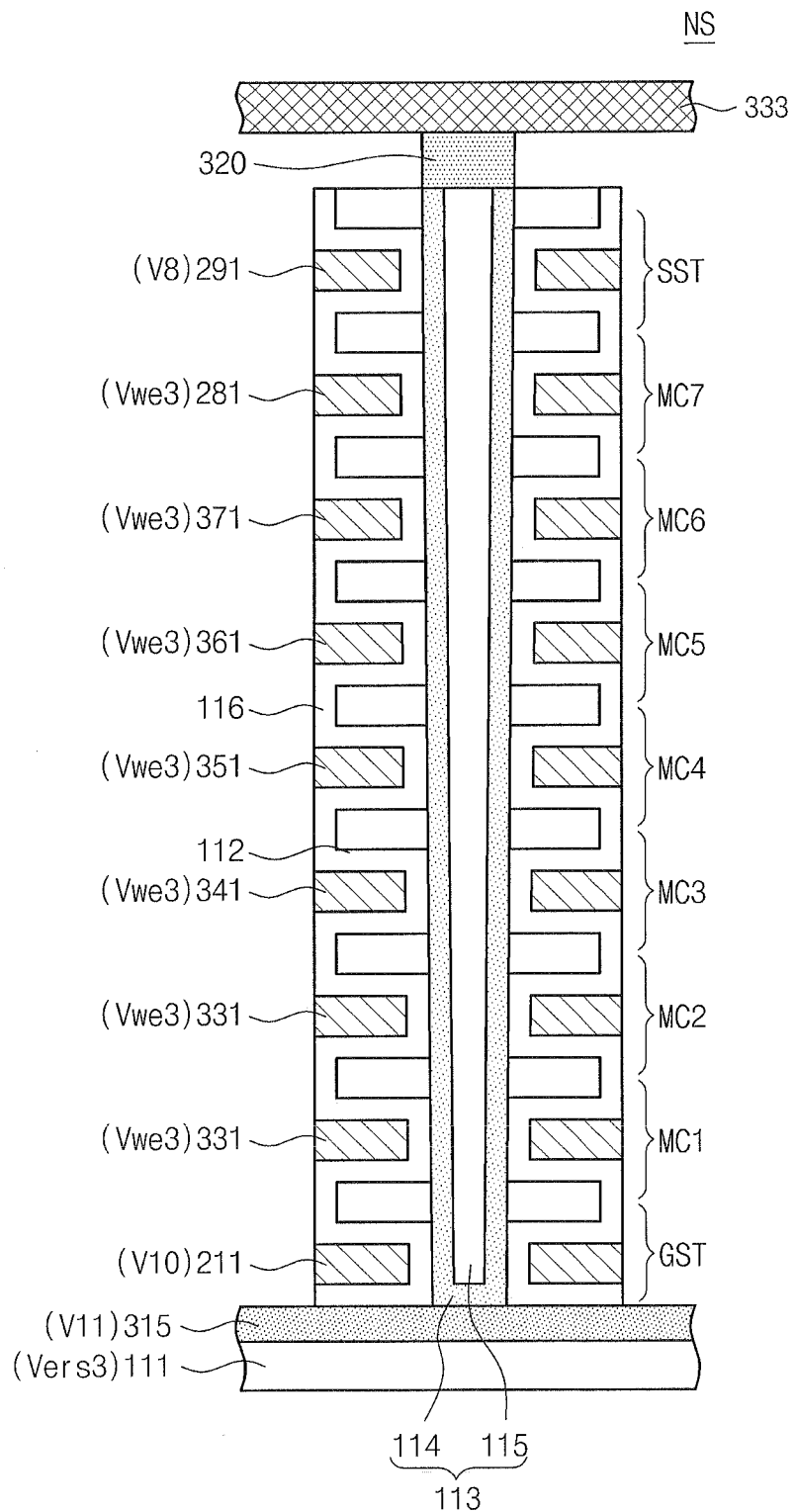
FIG. 54 is a sectional view of one NAND string in the memory block to which the voltages according to FIGS. 52 and 53 are applied.

FIG. 53 is a timing diagram illustrating a voltage change of the memory block BLKf of FIGS. 50 and 51 according to the voltage conditions of FIG. 52. FIG. 54 is a sectional view of one NAND string NS in the memory block BLKf to which the voltages according to FIGS. 52 and 53 are applied. Exemplarily, a sectional view corresponding to the NAND string NS13 of the first row and third column in the memory block BLKf is shown.

Referring to FIGS. 21, and 50 through 54, a pre voltage Vpr is applied to the substrate 111 at the first timing t1. Exemplarily, the substrate 111 includes a p-type silicon material, and the doping region 315 includes an n-type silicon material. Since the substrate 111 and the doping region 315 form a forward bias condition, the pre voltage Vpr is delivered to the doping region 315 through the substrate 111. For example, the pre voltage Vpr may be a high voltage.

A ground voltage Vss is applied to the ground selection line GSL. A ground voltage is applied to a gate (or a control gate) of the ground selection transistor GST and a pre voltage Vpr is applied to its source. Since the pre voltage Vpr is a high voltage, thermal electrons occur in the ground selection transistor GST. For example, thermal electrons are generated by a gate induced drai leakage (GIDL) in the ground selection transistor GST. The generated thermal electrons are delivered from the doping region 315 to the channel layer 114 operating as a body of the second direction. Accordingly, a voltage of the channel layer 114 is increased.

The word lines WL1 to WL7 float. Therefore, a voltage of the word lines WL1 to WL7 is increased due to coupling caused by a voltage rise of the channel layer 114.

The string selection lines SSL1 to SSL3 float. Therefore, a voltage of the string selection lines SSL1 to SSL3 is increased due to coupling caused by a voltage rise of the channel layer 114.

At the timing t2, a third erase voltage Vers3 is applied to the substrate 111. The third erase voltage Vers3 is delivered to the doping region 315. For example, a voltage of the doping region 315 (i.e., the common source line CSL) is increased to the eleventh voltage V11.

The ground selection line GSL floats. Therefore, due to coupling according to a voltage rise of the channel layer 114, a voltage of the ground selection line GSL is increased. For example, a voltage of the ground selection line GSL is increased to the tenth voltage V10.

Due to a difference between the third erase voltage Vers3 and the tenth voltage V10, thermal electrons occur in the ground selection transistor GST. For example, thermal electrons may occur by the GIDL in the ground selection transistor GST. By implanting the generated thermal electrons in the channel layer 114, a voltage of the channel layer 114 is increased.

The word lines WL1 to WL7 may float. Accordingly, a voltage of the word lines WL1 to WL7 is increased due to coupling caused by a voltage rise of the channel layer 114. For example, a voltage of the word lines WL1 to WL7 is increased to the ninth voltage V9.

The string selection lines SSL1 to SSL3 float. Accordingly, a voltage of the string selection lines SSL1 to SSL3 is increased due to coupling caused by a voltage rise of the channel layer 114. For example, a voltage of the string selection lines SSL1 to SSL3 is increased to the eighth voltage V8.

At the third timing t3, a third word line erase voltage Vwe3 is applied to the word lines WL1 to WL7. For example, the third word line erase voltage Vwe3 is a low voltage. For example, the second word line erase voltage Vwe3 is a ground voltage Vss. At this point, a voltage of the channel layer 114 is a high voltage. Accordingly, Fowler-Nordheim tunneling occurs in memory cells in the selected sub block. By the F-N tunneling, the memory cells MC1 to MC7 of the memory block BLKf are erased.

A voltage of the ground selection line GSL has a level of the tenth voltage V10. Exemplarily, the tenth voltage V10 may be a voltage generated by coupling caused by a voltage rise of the channel layer 114. For example, the tenth voltage V10 is a high voltage. Exemplarily, in order to prevent F-N tunneling in the ground selection transistors GST, the level of the tenth voltage V10 is set. For example, by adjusting the timing of when the ground selection line GSL, the level of the tenth voltage V10 may be adjusted. Accordingly, the ground selection transistor GST is erase-inhibited.

A voltage of the string selection lines SSL1 to SSL3 has a level of the eighth voltage V8. Exemplarily, the eighth voltage V8 may be a voltage generated by coupling caused by a voltage rise of the channel layer 114. For example, the eighth voltage V8 is a high voltage. Exemplarily, the eighth voltage V8 prevents F-N tunneling in the string selection transistor SST. Accordingly, the string selection transistor SST is erase-inhibited.

When an equivalent circuit of the memory block BLKf corresponds to the equivalent circuit BLKb_1 described with reference to FIG. 24, erase-verification of the memory block BLKf is performed in the same manner as that described with reference to FIGS. 29 through 31.

FIG. 55 is a table illustrating voltage conditions according to a second embodiment during an erase operation of the memory block BLKf of FIGS. 50 and 51. The table of FIG. 55 may illustrate voltage conditions when an equivalent circuit of the memory block BLKf corresponds to the equivalent circuit BLKb_2 described with reference to FIG. 29. Exemplarily, it is assumed that a first sub block is selected and a second sub block is unselected.

Referring to FIGS. 29, 50, 51, and 55, the string selection lines SSL1 to SSL3 float during an erase operation. The word lines WL4 to WL6 of the unselected sub block float. The word lines WL1 to WL3 of a selected sub block float and then are driven by the third word line erase voltage Vwe3. The second dummy word line voltage Vdwl2 is applied to the dummy word line DWL. The ground selection line GSL is driven by a ground voltage Vss and then floats. The common source line CSL floats. Then, the substrate 111 is driven by a pre voltage Vpr and then is driven by a second erase voltage Vers2.

Figure 56:
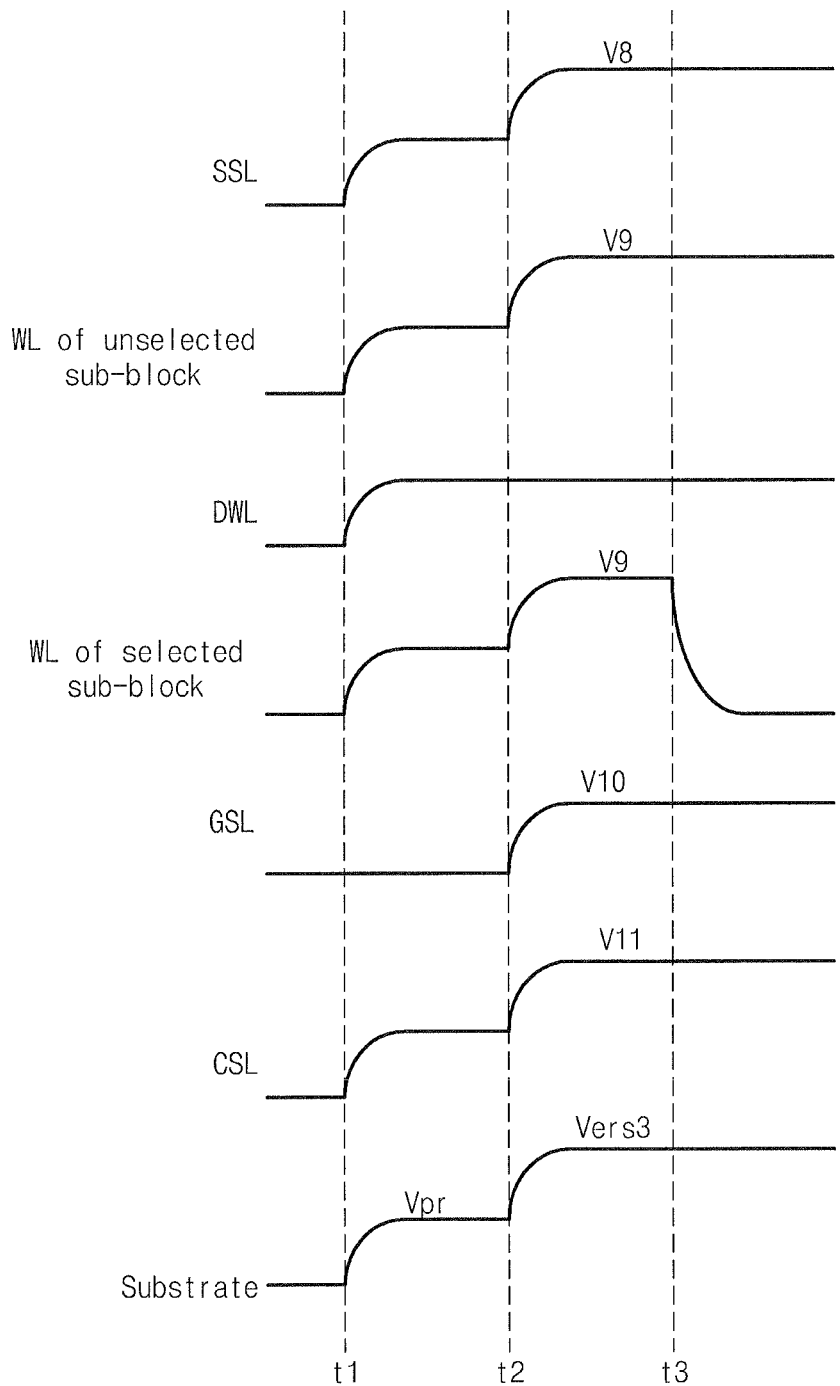
FIG. 56 is a timing diagram illustrating a voltage change of the memory block of FIGS. 50 and 51 according to voltage conditions of FIG. 55.
Figure 57:
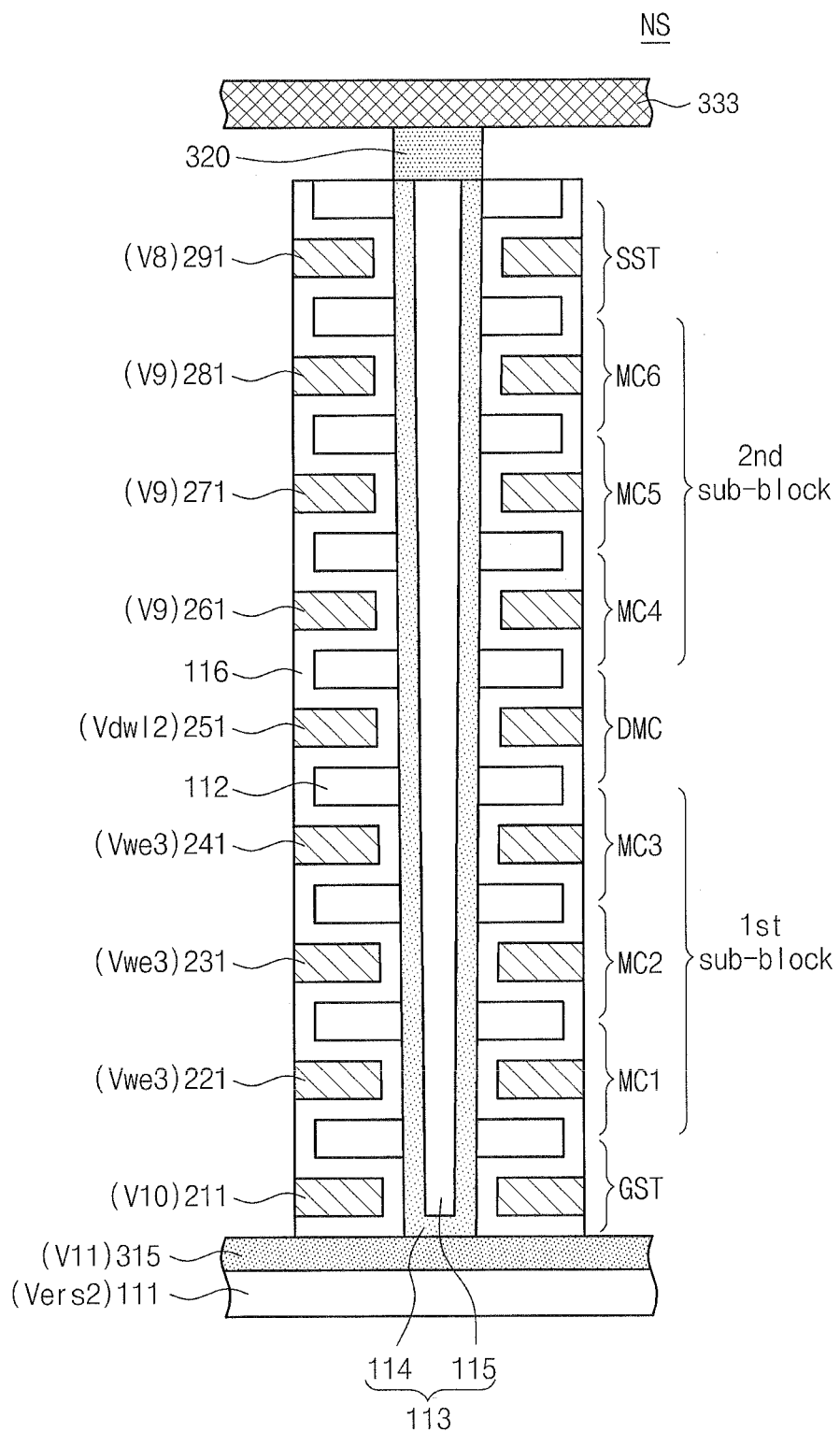
FIG. 57 is a sectional view of one NAND string of the memory block to which voltages according to FIGS. 55 and 56 are applied.

FIG. 56 is a timing diagram illustrating a voltage change of the memory block BLKf of FIGS. 50 and 51 according to voltage conditions of FIG. 55. FIG. 57 is a sectional view of one NAND string NS of the memory block BLKf to which voltages according to FIGS. 55 and 56 are applied. A sectional view corresponding to the first row and third column of the memory block BLKf is shown.

Referring to FIGS. 29, 50, 51, and 55 through 57, a pre voltage Vpr is applied to the substrate 111 at the first timing t1. The pre voltage Vpr is delivered to the doping region 315 through the substrate 111. For example, the pre voltage Vpr may be a high voltage.

A ground voltage Vss is applied to the ground selection line GSL. Due to a voltage difference between a pre voltage Vpr and a ground voltage Vss, thermal electrons occur from the ground selection transistor GST. The generated thermal electrons are delivered from the doping region 315 to the channel layer 114. Accordingly, a voltage of the channel layer 114 is increased.

The word lines WL1 to WL3 of the selected sub block and the word lines WL4 to WL6 of the unselected sub block float. Accordingly, voltages of the word lines WL1 to WL3 of the selected sub block and the word lines WL4 to WL6 of the unselected sub block are increased due to coupling caused by a voltage rise of the channel layer 114.

A second dummy word line voltage Vdwl2 is applied to the dummy word line DWL.

The string selection lines SSL1 to SSL3 float. Accordingly, voltages of the string selection lines SSL1 to SSL3 are increased due to coupling caused by a voltage rise of the channel layer 114.

At the second timing t2, a third erase voltage Vers3 is applied to the substrate 111. The third erase voltage Vers3 is delivered to the doping region 315. For example, a voltage of the doping region 315 (i.e., the common source line CSL) is increased to the eleventh voltage V11.

The ground selection line GSL floats. Accordingly, due to coupling caused by a voltage rise, a voltage of the ground selection line GSL may be increased. For example, a voltage of the ground selection line GSL is increased to the tenth voltage V10.

Due to a difference between the third erase voltage Vers3 and the tenth voltage V10, thermal electrons are generated in the ground selection transistor GST. By implanting the generated thermal electrons into the channel layer 114, a voltage of the channel layer 114 is increased.

The word lines WL1 to WL3 of a selected sub block and the word lines WL4 to WL6 of an unselected sub block float. Accordingly, voltages of the word lines WL1 to WL3 of a selected sub block and the word lines WL4 to WL6 of an unselected sub block are increased due to coupling caused by a voltage rise of the channel layer 114. For example, voltages of the word lines WL1 to WL3 of a selected sub block and the word lines WL4 to WL6 of an unselected sub block are increased to the ninth voltage V9.

The string selection lines SSL1 to SSL3 float. Accordingly, voltages of the string selection lines SSL1 to SSL3 are increased due to coupling caused by a voltage rise of the channel layer 114. For example, voltages of the string selection lines SSL1 to SSL3 are increased to the eighth voltage V8.

At the third timing t3, a third word line erase voltage Vwe3 is applied to the word lines WL1 to WL3 of a selected sub block. For example, the third word line erase voltage Vwe3 is a low voltage. For example, the third word line erase voltage Vwe3 is a ground voltage. At this point, a voltage of the channel layer 114 is a high voltage. Accordingly, Fowler-Nordheim tunneling occurs in memory cells of the selected sub block. Due to the F-N tunneling, the memory cells MC1 to MC3 of a selected sub block are erased.

Voltages of the word lines WL4 to WL6 of an unselected sub block have a level of the ninth voltage V9. Exemplarily, the ninth voltage V9 is a voltage generated by coupling caused by a voltage rise of the channel layer 114. For example, the ninth voltage V9 is a high voltage. Exemplarily, the ninth voltage V9 prevents F-N tunneling in the memory cells MC4 to MC6 of an unselected sub block. Accordingly, the memory cells MC4 to MC6 of an unselected sub block are erase-inhibited.

A voltage of the ground selection line GSL has a level of the tenth voltage V10. Accordingly, the ground selection transistor GST is erase-inhibited.

A voltage of the string selection line SSL has a level of the eighth voltage. Accordingly, the string selection transistor SST is erase-inhibited.

At the second to third timings t2 to t3, a voltage of the dummy word line DWL is maintained as a second dummy word line voltage Vdwl2. In an embodiment, a level of the second dummy word line voltage Vdwl2 is set to prevent F-N tunneling in a dummy memory cell DMC. Accordingly, the dummy memory cell DMC is erase-inhibited.

In an embodiment, the second dummy word line voltage Vdwl2 has a level between the third erase voltage Vers3 and the third word line erase voltage Vwe3. For example, the second dummy word line voltage Vdwl2 has a level between the ninth voltage V9 and the third word line erase voltage Vwe3.

The dummy word line DWL may float during an erase operation. A voltage of the dummy word line DWL may be increased due to coupling caused by a voltage rise of the channel layer 114. Accordingly, if the dummy word line DWL floats, the dummy memory cells DMC are erase-inhibited.

In the above-mentioned embodiment, it is described that the word lines WL4 to WL6 of an unselected sub block float. However, an erase inhibit voltage may be applied to the word lines WL4 to WL6 of an unselected sub block. The level of an erase inhibit voltage may be set to prevent F-N tunneling in the memory cells MC4 to MC6 in an unselected sub block.

If an equivalent circuit of the memory block BLKf corresponds to the equivalent circuit BLKb_2 described with reference to FIG. 29, erase-verification of the memory block BLKf is performed in the same manner described with reference to FIGS. 33 to 35.

Figure 58:
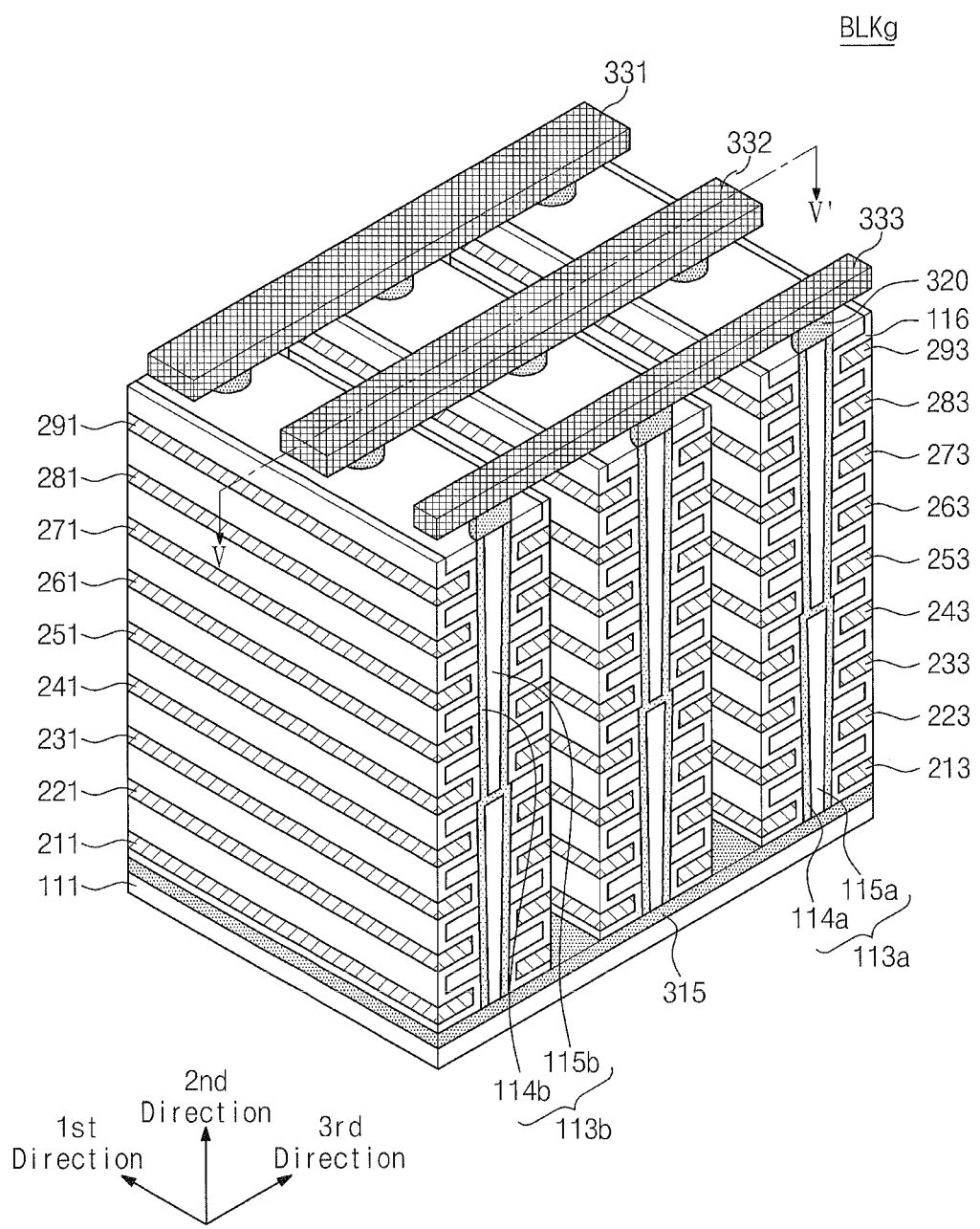
FIG. 58 is a perspective view illustrating a memory block in the nonvolatile memory device of FIG. 13 according to an embodiment of the inventive concept.
Figure 59:
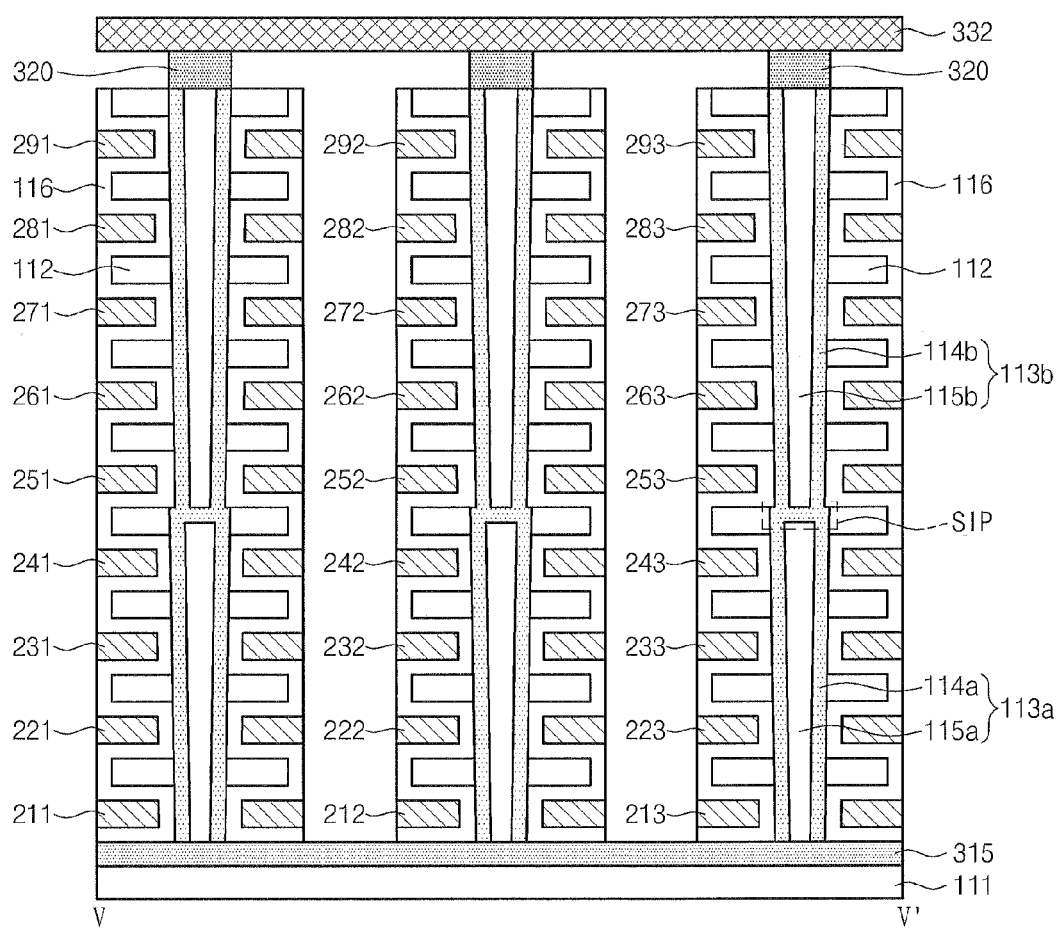
FIG. 59 is a sectional view taken along the line V-V' of FIG. 58.

FIG. 58 is a perspective view illustrating one of the memory blocks BLK1 to BLKz in the nonvolatile memory device 100b of FIG. 13 according to an embodiment of the inventive concept. FIG. 59 is a sectional view taken along the line V-V' of FIG. 58. Except that one pillar of a memory block BLKg includes a first sub pillar 113a and a second sub pillar 113b, the memory block BLKg may have the same structure as the memory block BLKf described with reference to FIGS. 50 and 51.

As described with reference to FIGS. 46 and 47, one pillar of the memory block BLKg includes a first sub pillar 113a and a second sub pillar 113b. The first sub pillar 113a and the second sub pillar 113b may have the same structure as the first sub pillar 113a and the second sub pillar 113b described with reference to FIGS. 46 and 47.

As described with reference to FIGS. 50 and 51, an n-type doping region 315 forming a common source line CSL is provided in a plate shape.

An equivalent circuit of the memory block BLKg may correspond to one of the equivalent circuits BLKb_1, BLKb_2, and BLKb_3 described with reference to FIGS. 21, 29, and 36. An equivalent circuit of the memory block BLKg may correspond to one of the equivalent circuits BLKb_4 to BLKb_10 described with reference to FIGS. 39 through 45.

In the memory blocks BLKb to BLKg described with reference to FIGS. 15, 16, 46 through 51, 58, and 59, after the forming of the pillars 113 or 113a and 113b, the first conductive materials 211 to 291, 212 to 292, and 213 to 293 may be formed. That is, the first conductive materials 211 to 291, 212 to 292, and 213 to 293 may include an un-etchable metal material.

Figure 60:
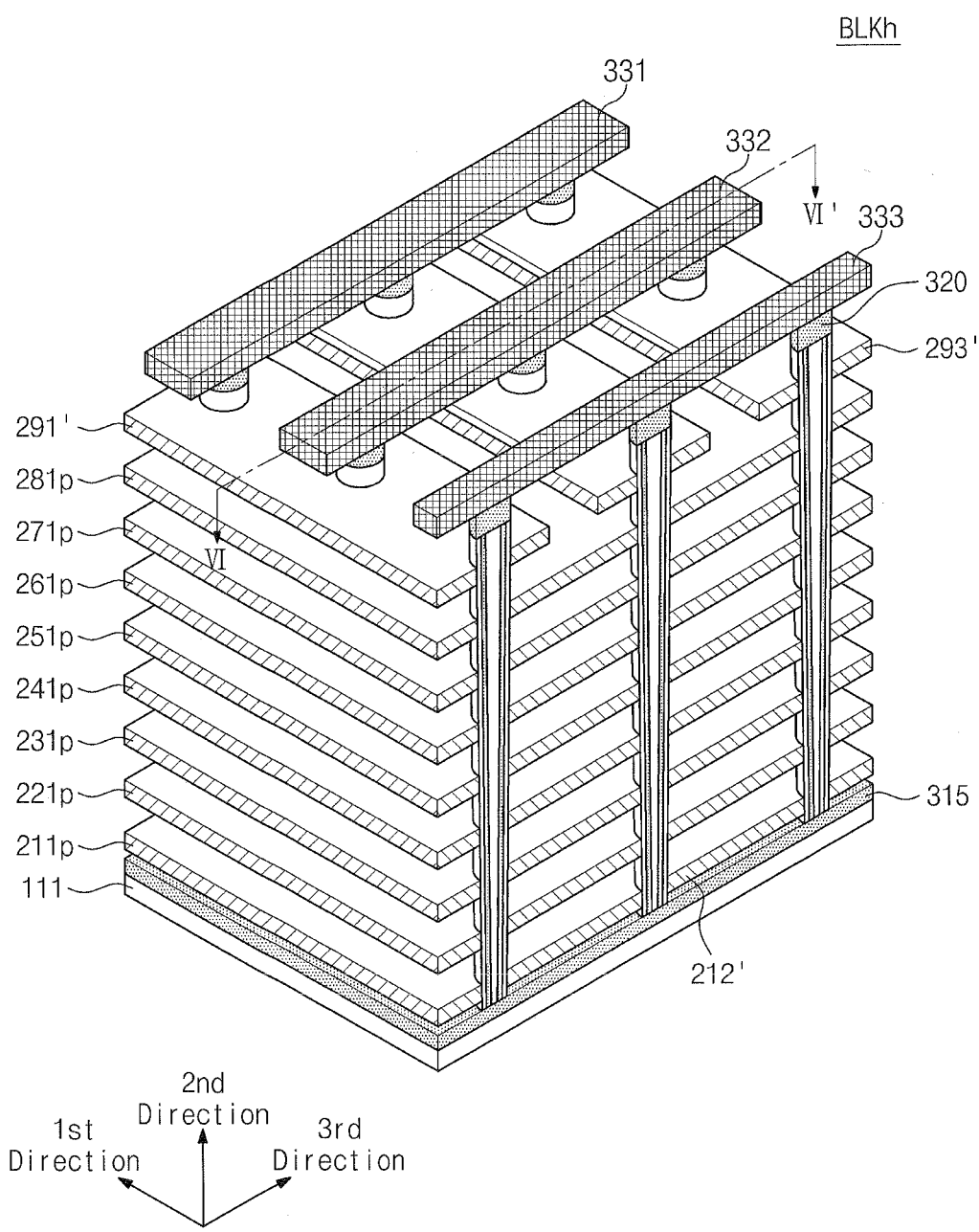
FIG. 60 is a perspective view of a memory block in the nonvolatile memory device of FIG. 13 according to an embodiment of the inventive concept.
Figure 61:
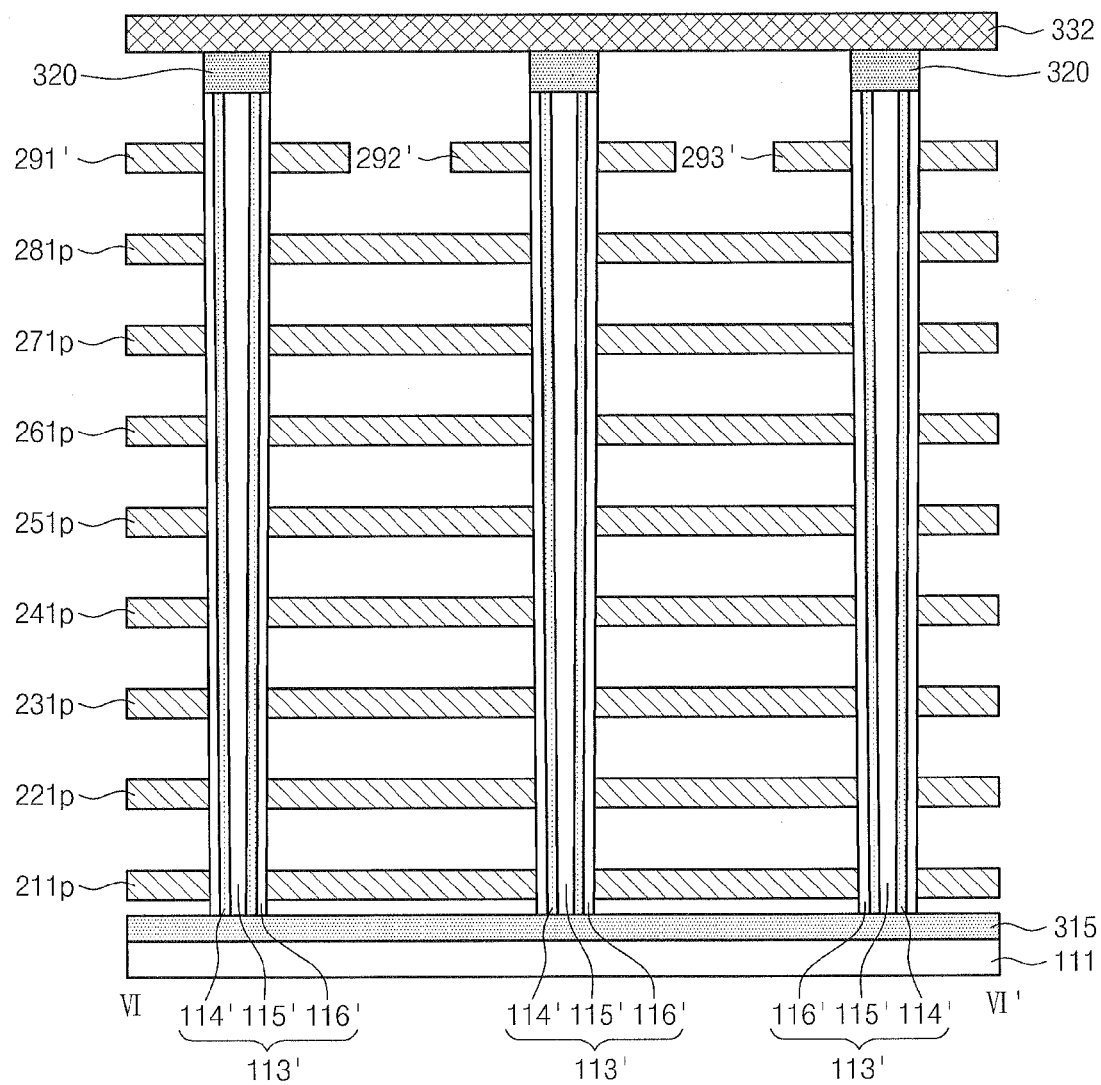
FIG. 61 is a sectional view taken along the line VI-VI' of FIG. 60 according to an embodiment of the inventive concept.

FIG. 60 is a perspective view illustrating one of the memory blocks BLK1 to BLKz in the nonvolatile memory device 100b of FIG. 13 according to an embodiment of the inventive concept. FIG. 61 is a sectional view taken along the line VI-VI' of FIG. 60. Referring to FIGS. 60 and 61, an n-type doping region 315 forming a common source line CSL is provided in a plate form as described with reference to FIGS. 50 and 51.

Compared to the memory block BLKb described with reference to FIGS. 15 and 16, the first conductive materials 211p to 281p having the first to eighth heights are provided in a plate form. The first conductive materials 291' to 293' having the ninth height extend along the first direction and are spaced by a specific distance along the third direction.

The pillar 113' includes an insulation layer 116', a channel layer 114', and an internal material 115'.

The insulation layer 116' of each pillar 113' is configured to store data like the insulation layer 116 described with reference to FIGS. 17 through 20. For example, the insulation layer 116' may include a tunneling insulation layer, a charge storage layer, and a blocking insulation layer. A channel layer 114' of the pillar 113' includes p-type silicon. The channel layer 114' of the pillar 113' operates as a body of the second direction. The internal material 115' of the pillar 113' includes an insulation material.

An equivalent circuit of the memory block BLKh may correspond to one of the equivalent circuits BLKb_1, BLKb_2, and BLKb_3 described with reference to FIGS. 21 and 29. An equivalent circuit of the memory block BLKh may correspond to one of the equivalent circuits BLKb_4 to BLKb_10 described with reference to FIGS. 39 through 45.

Figure 62:
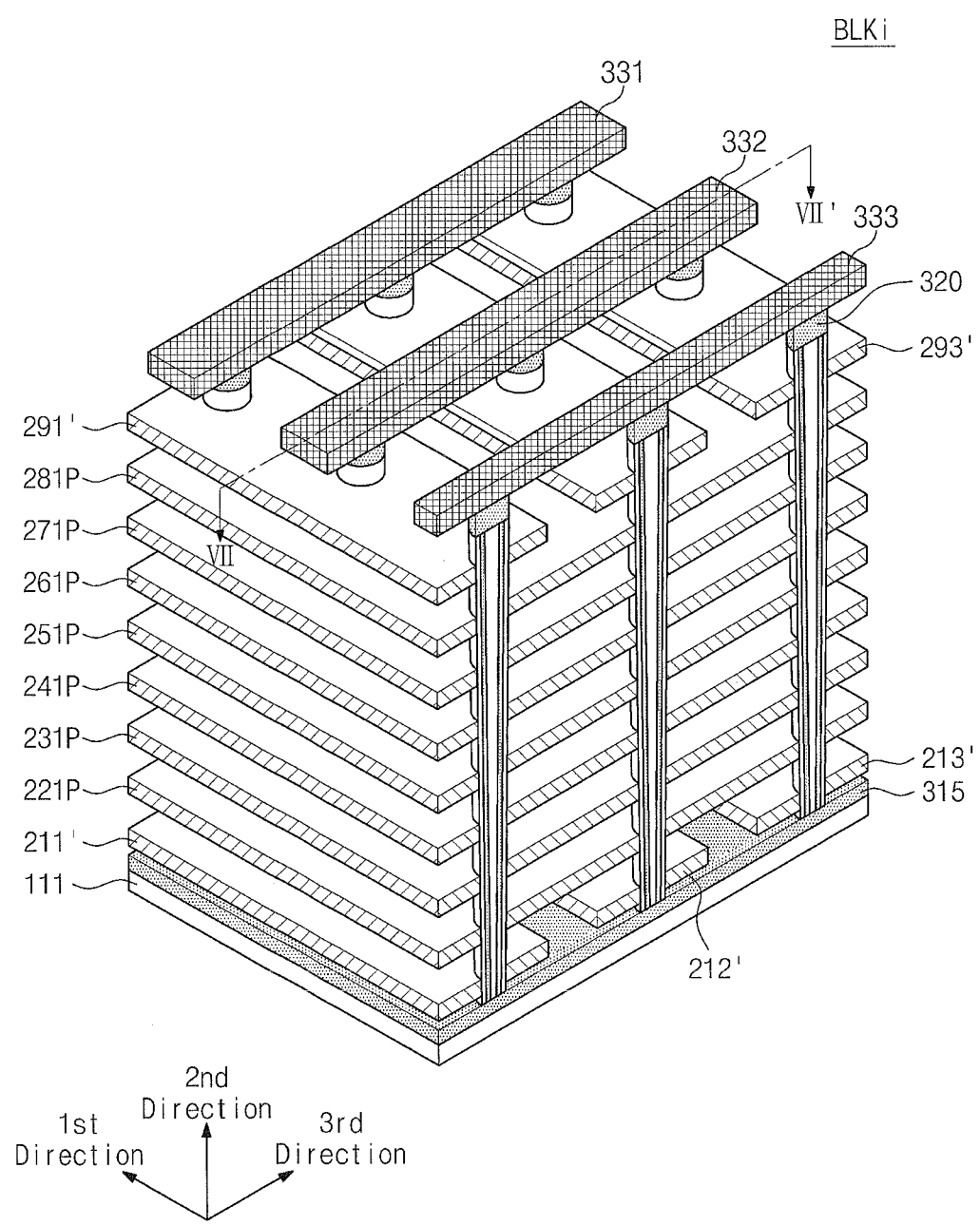
FIG. 62 is a perspective view illustrating a memory block in the nonvolatile memory device of FIG. 13 according to an embodiment of the inventive concept.
Figure 63:
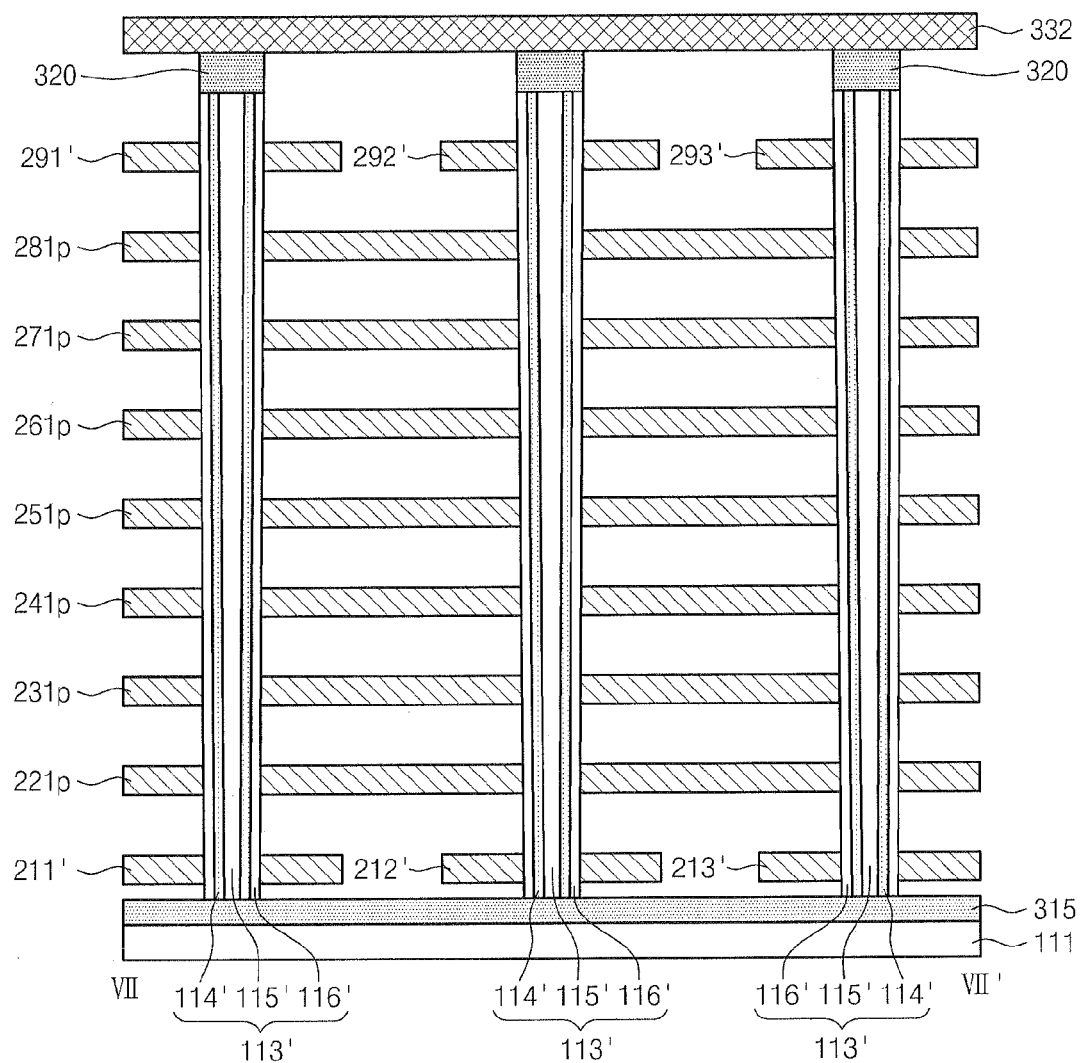
FIG. 63 is a sectional view taken along the line VII-VII' of FIG. 62.

FIG. 62 is a perspective view illustrating one of the memory blocks BLK1 to BLKz in the nonvolatile memory device 100b of FIG. 13 according to an embodiment of the inventive concept. FIG. 63 is a sectional view taken along the line of FIG. 62. Compared to the memory block BLKh described with reference to FIGS. 60 and 61, first conductive materials 211' to 213' having the first height of the memory block BLKi are spaced by a specific distance along the third direction. An equivalent circuit of the memory block BLKi corresponds to the equivalent circuit BLKb_3 described with reference to FIG. 36.

Figure 64:
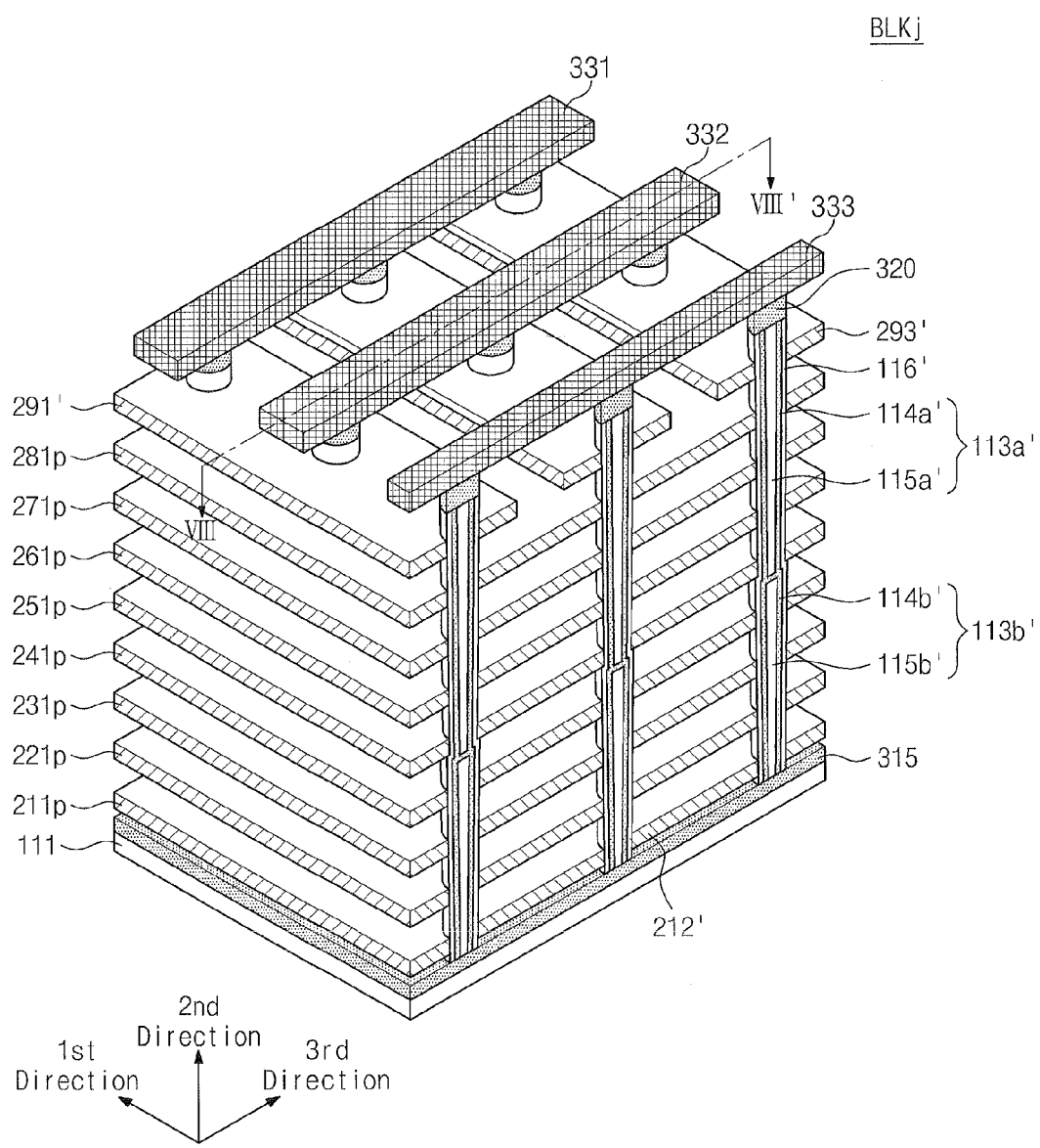
FIG. 64 is a perspective view illustrating a memory block in the nonvolatile memory device of FIG. 13 according to an embodiment of the inventive concept.
Figure 65:
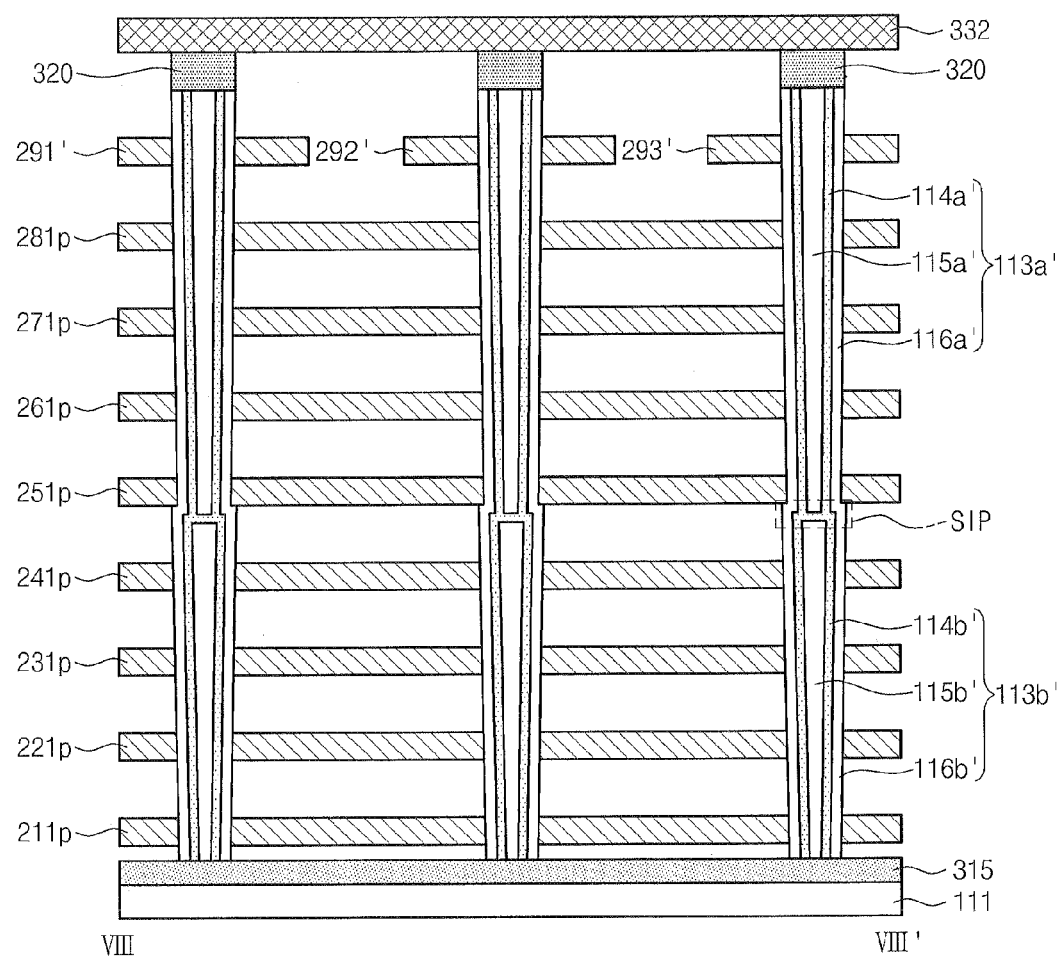
FIG. 65 is a sectional view taken along the line VIII-VIII' of FIG. 64.

FIG. 64 is a perspective view illustrating one of the memory blocks BLK1 to BLKz in the nonvolatile memory device 100b of FIG. 13 according to an embodiment of the inventive concept. FIG. 65 is a sectional view taken along the line VIII-VIII' of FIG. 64. Except that one pillar of a memory block BLKj includes a first sub pillar 113a and a second sub pillar 113b, the memory block BLKj may have the same structure as that of the memory block BLKh described with reference to FIGS. 60 and 61.

One pillar of the memory block BLKj includes a first sub pillar 113a', and a second sub pillar 113b'. The first sub pillar 113a' includes an insulation layer 116a', a channel layer 114a', and an internal material 115a'. The second sub pillar 113b' includes an insulation layer 116b', a channel layer 114b', and an internal material 115b'.

In an embodiment, the channel layer 114a' of the first sub pillar 113a' is connected to the channel layer 114b' of the second sub pillar 113b'. For example, as shown in FIGS. 50 and 51, the channel layer 114a' of the first sub pillar 113a' and the channel layer 114b' of the second sub pillar 113b' are connected through a silicon pad SIP having a p-type.

In an embodiment, the first conductive material having a height corresponding to the silicon pad SIP (i.e., the fifth height) may form a dummy word line DWL and dummy memory cells DMC.

An equivalent circuit of the memory block BLKj may correspond to one of the equivalent circuits BLKb_1, BLKb_2, and BLKb_3 described with reference to FIGS. 21 and 29. An equivalent circuit of the memory block BLKj may correspond to one of the equivalent circuits BLKb_4 to BLKb_10 described with reference to FIGS. 39 through 45.

Figure 66:
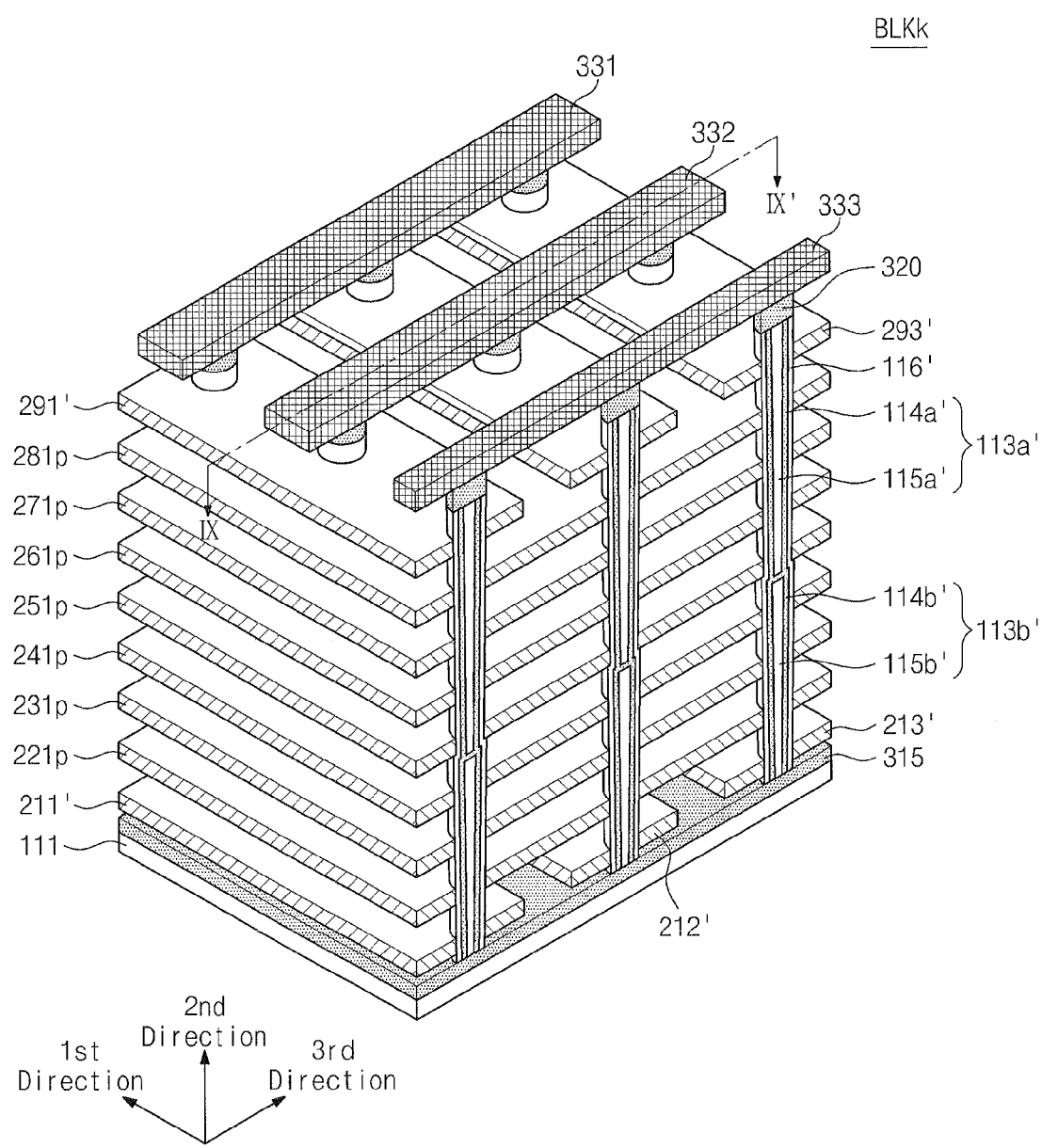
FIG. 66 is a perspective view illustrating a memory block in the nonvolatile memory device of FIG. 13 according to an embodiment of the inventive concept.
Figure 67:
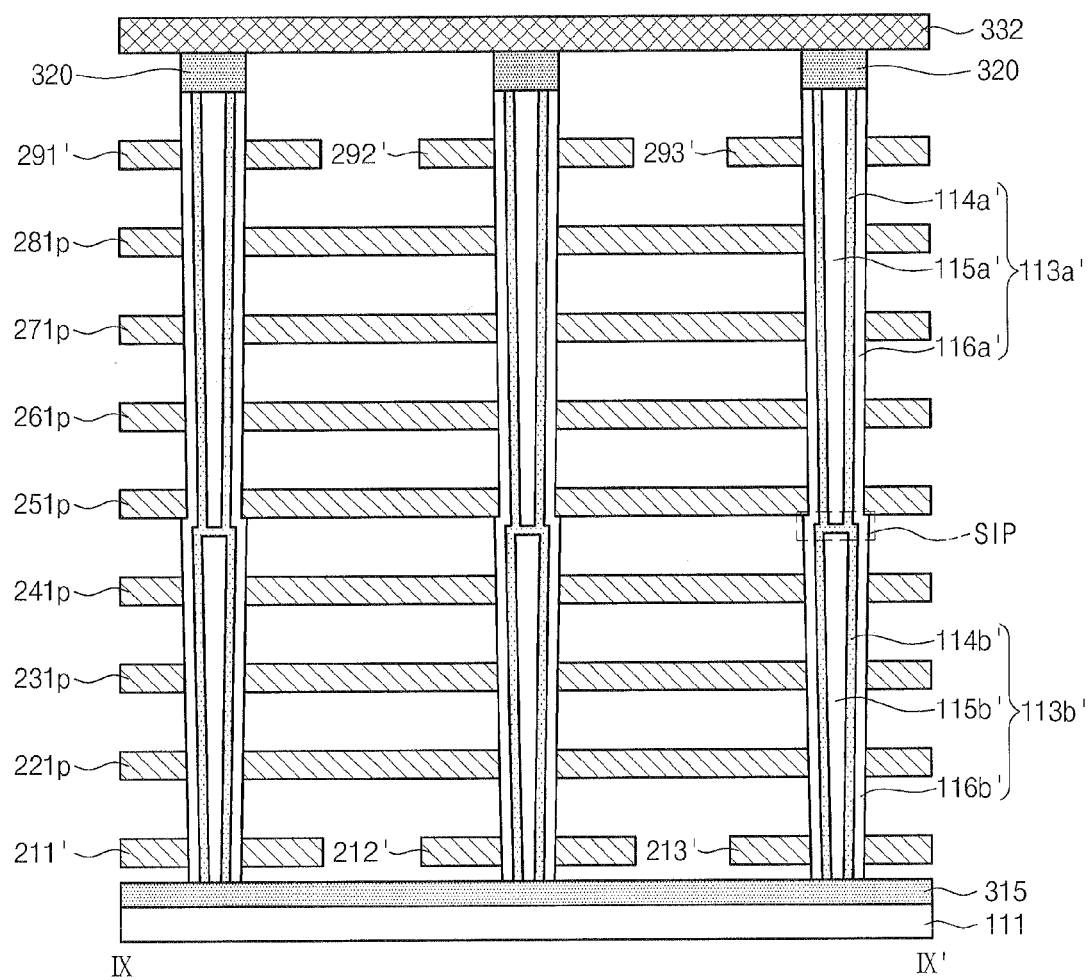
FIG. 67 is a sectional view taken along the line IX-IX' of FIG. 66.

FIG. 66 is a perspective view illustrating one of the memory blocks BLK1 to BLKz in the nonvolatile memory device 100b of FIG. 13 according to an embodiment of the inventive concept. FIG. 67 is a sectional view taken along the line IX-IX' of FIG. 66. Compared to the memory block BLKj described with reference to FIGS. 64 and 65, first conductive materials 211' to 213' having the first height of the memory block BLKk are spaced by a specific distance along the third direction. An equivalent circuit of the memory block BLKk corresponds to the equivalent circuit BLKb_3 described with reference to FIG. 36.

Figure 68:
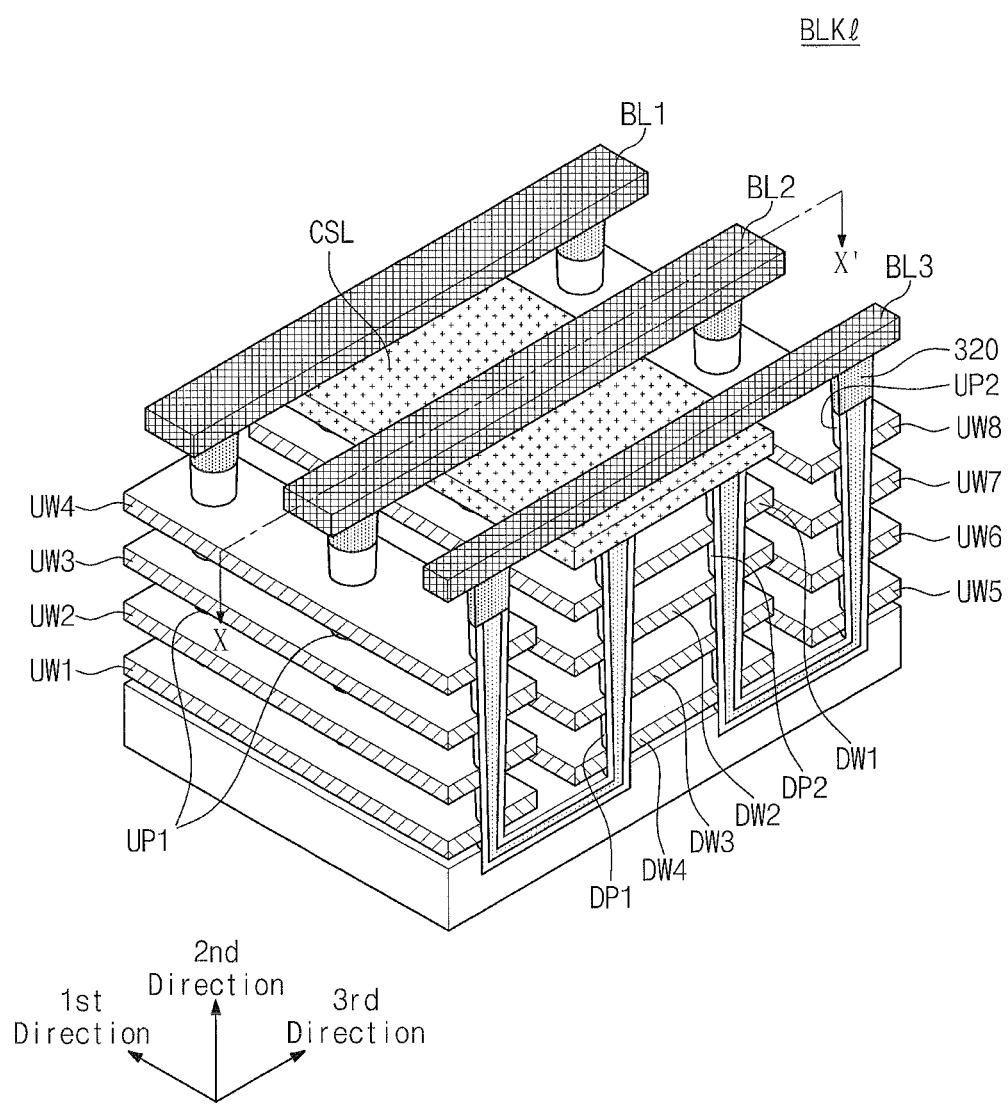
FIG. 68 is a perspective view illustrating a memory block in the nonvolatile memory device of FIG. 13 according to an embodiment of the inventive concept.
Figure 69:
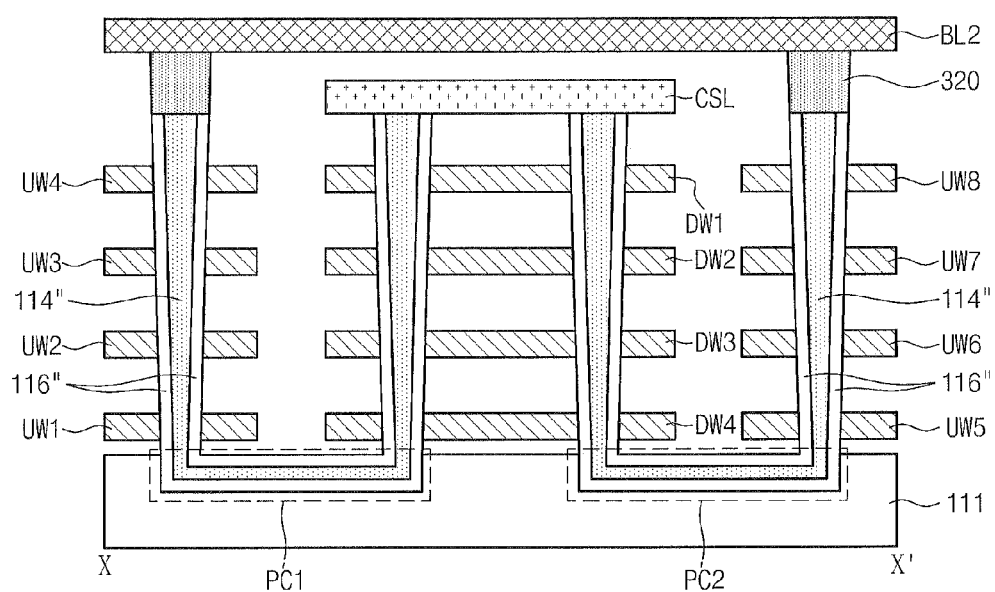
FIG. 69 is a sectional view taken along the line X-X' of FIG. 68.

FIG. 68 is a perspective view illustrating one of the memory blocks BLK1 to BLKz in the nonvolatile memory device 100b of FIG. 13 according to an embodiment of the inventive concept. FIG. 69 is a sectional view taken along the line X-X' of FIG. 68. Referring to FIGS. 68 and 69, first to fourth upper word lines UW1 to UW4 extending along the first direction are provided on the substrate 111. First to fourth upper word lines UW1 to UW4 are spaced along the second direction by a specific distance. First upper pillars UP1 spaced along the first direction by a specific distance and penetrating the first to fourth upper word lines UW1 to UW4 along the second direction are provided.

On the substrate 111, first to fourth lower word lines DW1 to DW4 extending along the first direction are provided. The first to fourth lower word lines DW1 to DW4 are spaced along the second direction by a specific distance. The first to fourth lower word lines DW1 to DW4 are spaced along the third direction by a specific distance apart from the first to fourth upper word lines UW1 to UW4.

First lower pillars DP1 spaced along the first direction by a specific distance and penetrating the first to fourth lower word lines DW1 to DW4 along the second direction are provided. Moreover, second lower pillars DP2 spaced along the first direction by a specific distance and penetrating the first to fourth lower word lines DW1 to DW4 along the second direction are provided. Exemplarily, the first lower pillars DP1 and the second lower pillars DP2 are disposed in parallel along the second direction. The first lower pillars DP1 and the second lower pillars DP2 are spaced along the third direction by a specific distance.

On the substrate 111, fifth to eighth upper word lines UW5 to UW8 extending along the first direction are provided. The fifth to eighth upper word lines UW5 to UW8 are spaced along the second direction by a specific distance. The fifth to eighth upper word lines UW5 to UW8 are spaced along the third direction by a specific distance apart from the first to fourth lower word lines DW1 to DW4. Second upper pillars UP2 spaced along the first direction by a specific distance and penetrating the fifth to eighth upper word lines UW5 to UW8 along the second direction are provided.

A common source line CSL extending along the first direction is provided on the first and second lower pillars DP1 and DP2. Exemplarily, the common source line CSL may include an n-type silicon material. Exemplarily, if the common source line CSL comprises a conductive material having no conductive type such as an n-type or a p-type, n-type sources may be additionally provided between the common source line CSL and the first and second lower pillars DP1 and DP2. For example, a region adjacent to the common source line CSL among regions of the first and second lower pillars DP1 and DP2 is doped with an n-type and thus may operate as a source. Exemplarily, the common source line CSL and the first and second lower pillars DP1 and DP2 may be connected through the contact plugs. At this point, the contact plugs may be doped with an n-type and thus may operate as a source.

Drains 320 are provided on the tops of the first and second pillars UP1 and UP2, respectively. Exemplarily, the drains 320 include an n-type silicon material. A plurality of bit lines BL1 to BL3 extending along the third direction may be provided on the tops of the drains 320. For example, the bit lines BL1 to BL3 are spaced along the first direction by a specific distance. The upper pillars UP1 and UP2 provided along the third direction are connected to the same bit line. Exemplarily, the bit lines BL1 to BL3 comprise metal. Exemplarily, the bit lines BL1 to BL3 and the drains 320 may be connected through contact plugs (not shown).

Each of the first and second upper pillars UP1 and UP2 includes an insulation layer 116" and a channel layer 114". Each of the first and second lower pillars DP1 and DP2 includes an insulation layer 116" and a channel layer 114". As mentioned described with reference to FIGS. 60 and 61, the insulation layer 116" of the first and second upper pillars UP 1 and UP2 and the first and second lower pillars DP1 and DP2 may include a blocking insulation layer, a charge storage layer, and a tunneling insulation layer.

In an embodiment, the tunneling insulation layer includes a thermal oxide layer. The charge storage layer includes a nitride layer or a metal oxide layer (e.g., an aluminum oxide layer, a hafnium oxide layer, and so on). The blocking insulation layer may be formed of a single layer or a multi layer. The blocking insulation layer may be a high dielectric layer (e.g., an aluminum oxide layer, a hafnium oxide layer, and so on) having a higher dielectric constant than a tunneling insulation layer and a charge storage layer. Exemplarily, the tunneling insulation layer, the charge storage layer, and the blocking insulation layer may constitute an oxide-nitride-oxide (ONO).

The channel layers 114" of the first and second upper pillars UP1 and UP2 and the first and second lower pillars DP1 and DP2 may include a p-type silicon material. The channel layer 114" of the first and second upper pillars UP1 and UP2 and the first and second lower pillars DP1 and DP2 operates as a body of the second direction.

The first upper pillars UP1 and the first lower pillars DP1 are connected through the first pipeline contacts PC1. Exemplarily, insulation layers 116" of the first upper pillars UP1 and first lower pillars DP1 are connected through insulation layers of the first pipeline contacts PC1. The insulation layers of the first pipeline contacts PC1 may be formed of the same materials as the insulation layers 116" of the first upper pillars UP1 and the first lower pillars DP1.

The channel layers 114" of the first upper pillars UP1 and the first lower pillars DP1 are connected through the channel layers of the first pipeline contacts PC1. The channel layers of the first pipeline contacts PC1 may be formed of the same materials as the channel layers 114" of the first upper pillars UP1 and the first lower pillars DP1.

That is, the first upper pillars UP 1 and the first to fourth upper word lines UW1 to UW4 form first upper strings, and first lower pillars DP1 and first to fourth lower word lines DW1 to DW4 form first lower strings. The first upper strings and the first lower strings are connected through first pipeline contacts PC1, respectively. Drains 320 and bit lines BL1 to BL3 are connected to one end of the first upper strings. A common source line CSL is connected to one end of the first lower strings. That is, the first upper strings and the first lower strings form a plurality of NAND strings NS connected between the bit lines BL1 to BL3 and the common source line CSL.

Likewise, the second upper pillars UP2 and the fifth to eighth upper word lines UW5 to UW8 form second upper strings, and second lower pillars DP2 and first to fourth lower word lines DW1 to DW4 form second lower strings. The second upper strings and the second lower strings are connected through second pipeline contacts PC2, respectively. Drains 320 and bit lines BL1 to BL3 are connected to one end of the second upper strings. A common source line CSL is connected to one end of the second lower strings. That is, the second upper strings and the second lower strings form a plurality of NAND strings NS connected between the bit lines BL1 to BL3 and the common source line CSL.

To form channels in the channel layers 114" of the first and second pipeline contacts PC1 and PC2, first and second pipeline contact gates (not shown) may be provided. In an embodiment, the first and second pipeline contact gates (not shown) may be provided on the surfaces of the first and second pipeline contacts PC1 and PC2. For example, the first and second pipeline contact gates (not shown) may correspond to dummy memory cells DMC.

Except that eight transistors are provided in one string and two strings are connected to each of the first to third bit lines BL1 to BL3, an equivalent circuit of the memory block may correspond to one of the equivalent circuit BLKb_1, BLKb_2, and BLKb_4 to BLKb_10 described with reference to FIGS. 21, 29, and 39 through 45.

Figure 70:
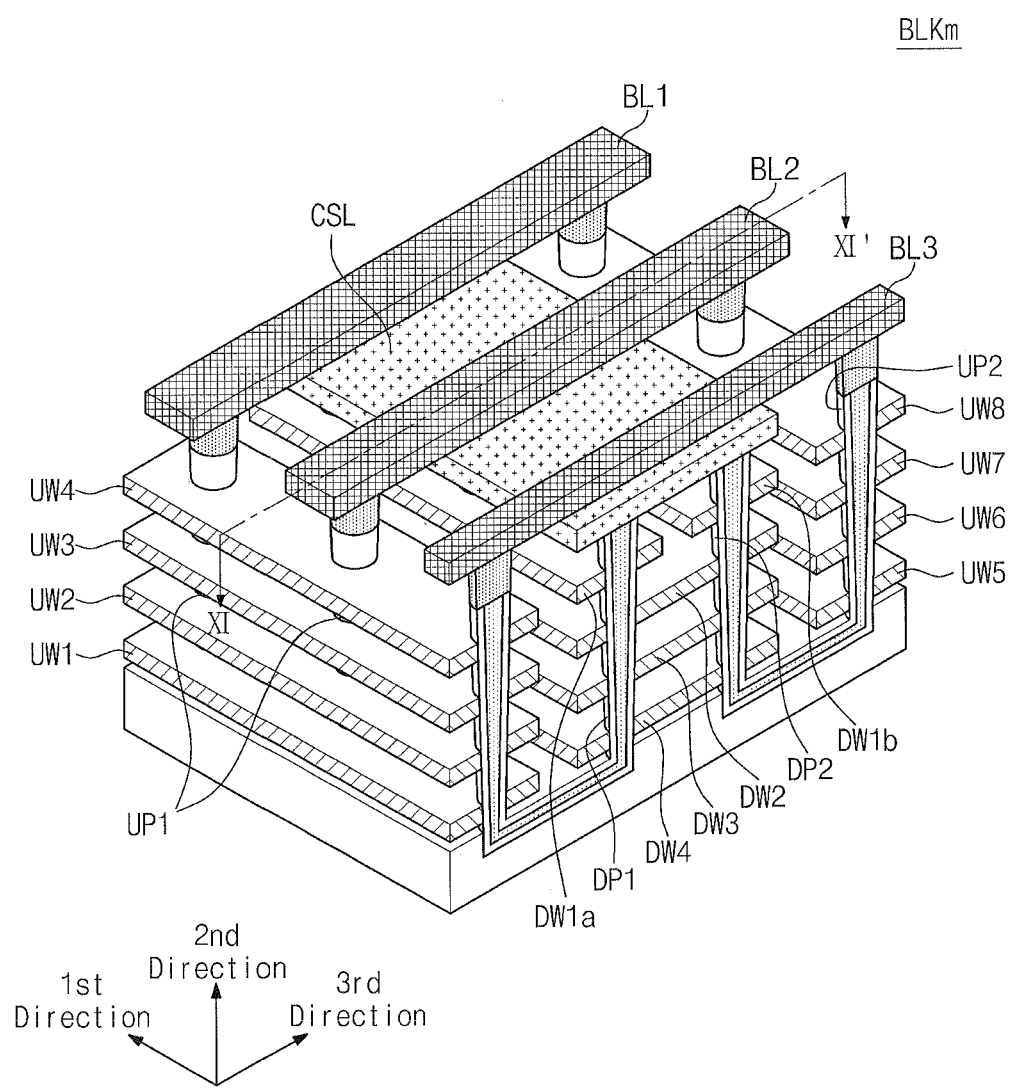
FIG. 70 is a perspective view illustrating a memory block in the nonvolatile memory device of FIG. 13 according to an embodiment of the inventive concept.
Figure 71:
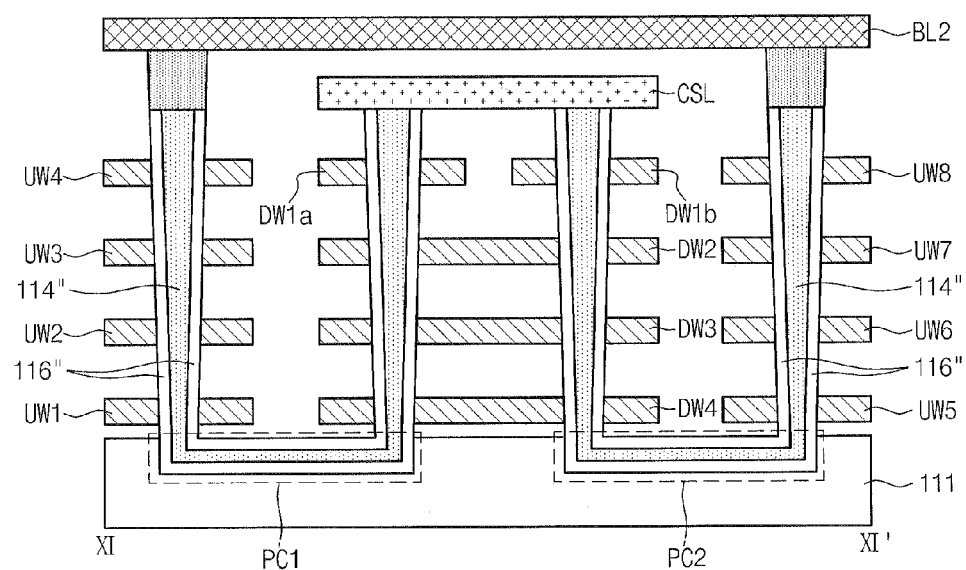
FIG. 71 is a sectional view taken along the line X-X' of FIG. 70.

FIG. 70 is a perspective view illustrating one of the memory blocks BLK1 to BLKz in the nonvolatile memory device 100b of FIG. 13 according to an embodiment of the inventive concept. FIG. 71 is a sectional view taken along the line X-X' of FIG. 70. Compared to the memory block BLK1 described with reference to FIGS. 68 and 69, a first lower word line is divided into a first portion DW1a and a second portion DW1b in a memory block BLKm. The first and second portion DW1a and DW1b are spaced from each other by a specific distance.

First lower pillars DP1 constituting NAND strings NS together with first upper pillars UP1 penetrate the first portion DW1a of the first lower word line. Second lower pillars DP2 constituting NAND strings NS together with second upper pillars UP2 penetrate the second portion DW1b of the first lower word line.

Except that eight transistors are provided in one string and two strings are connected to first to third bit lines BL1 to BL3, respectively, an equivalent circuit of the memory block BLKm may correspond to the equivalent circuit BLKb_3 described with reference to FIG. 36.

In an embodiment, in the memory blocks BLKg to BLK1 described with reference to FIGS. 60 to 71, pillars 113' or 113a' and 113b' are formed after first conductive materials 211p to 281p and 291' to 293', or 211' to 213' and 221p to 281 and 291' to 293' are formed. That is, the first conductive materials 211p to 281p and 291' to 293', or 211' to 213' and 221p to 281 and 291' to 293' may include etchable conductive material.

Figure 72:
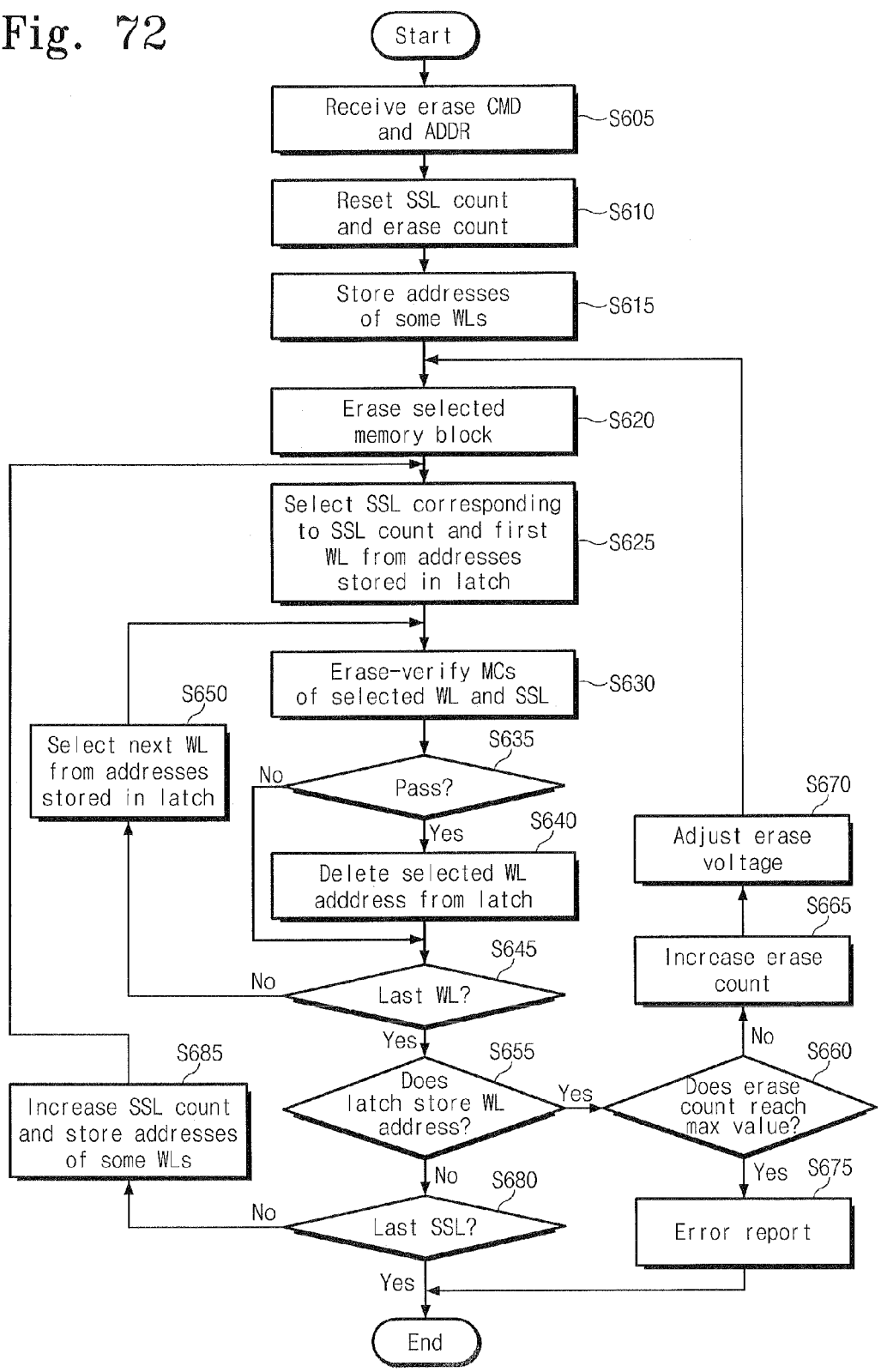
FIG. 72 is a flowchart illustrating a method of operating a nonvolatile memory device according to an embodiment of the inventive concept.

FIG. 72 is a flowchart illustrating a method of operating a nonvolatile memory device according to an embodiment of the inventive concept. Referring to FIGS. 13 and 72, in operation S605, an erase command and an address are received. For example, the received address corresponds to one of a plurality of blocks BLK1 to BLKz of the nonvolatile memory device 100b. A memory block (e.g., BLKb) corresponding to the received address among the plurality of memory blocks BLK1 to BLKz is selected. For example, the received address corresponds to at least two string selection lines SSL.

In operation S610, a SSL count and an erase count are reset. For example, the erase count is reset to 1. The SSL count represents one of string selection lines SSL corresponding to the received address. For example, the SSL count may be reset to represent a first string selection line (e.g., SSL1) of the selected memory block BLK.

In operation S615, addresses of some of word lines are stored. For example, the addresses of some of the word lines corresponding to the received address are stored. For example, the addresses of some of the word lines of the selected memory block BLK are stored in the word line address latch 177. For example, the addresses of some of the word lines are stored in the word line address latch 177 from the fuse unit 180.

Exemplarily, operations S610 and S615 may be construed as initialization of erase operation. The initialization of operations S610 and S615 may be performed regardless of an order.

In operation S620, memory cells MC corresponding to the received address are erased. For example, the selected memory block is erased. For example, the control logic 170b controls the address decoder 120, the read & write unit 130, and a voltage generating unit 160 to erase the selected memory block BLK.

In operation S625, a string selection line corresponding to the SSL count is selected, and a first word line is selected from the addresses stored in the word line address latch 177. Exemplarily, the SSL count is converted into a string selection line address. A string selection line corresponding to the converted string selection line address may be selected. Exemplarily, a first word line among some of the word lines corresponding to the addresses stored in the word line address latch 177 may be selected.

In operation S630, the selected word line is erase-verified. For example, the control logic 170c controls the address decoder 120, the read & write unit 130, and the voltage generating unit 160 to erase-verify a plurality of memory cells MC corresponding to the selected word line.

In operation S635, it is determined whether a verification result is passed or not. If the selected word line is determined as being erase-passed, the address of the selected word line is erased in operation S640. Thereafter, operation 645 is performed. If the selected word line is determined as being erase-failed, operation S640 is omitted and operation S645 is performed.

In operation S645, it is determined whether the selected word line is the last word line or not. For example, it is determined whether the selected word line is the last word line among some of the word lines corresponding to addresses stored in the word line address latch 177. If the selected word line is not the last word line, the next word line is selected from addresses stored in the word line address latch 177 in operation S650. Thereafter, operations S630 and S645 are again performed. If the selected word line is the last word line, operation S655 is performed.

In operations S630 through S650, some of the word lines corresponding to the addresses stored in the word line address latch 177 among the word lines of the selected memory cells. The address of the erases-passed word line is erased from the word line address latch 177. That is, if operations S630 through S650 are performed, the addresses of the erased-failed word lines among the addresses of some of the word lines transmitted from the fuse unit 180 remain in the word line address latch 177.

In operation S655, it is determined whether an address is stored in the word line address latch 177. If at least one address is stored in the word line address latch 177, it means that at least one of some of the word lines corresponding to the addresses transmitted from the fuse unit 180 has been erase-failed in a selected row of NAND strings NS of the selected memory block BLK. At this point, operation S660 is performed.

In operation S660, it is determined whether the erase count reaches the maximum value or not. If the erase count does not reach the maximum value, the erase count is increased in operation S665. An erase voltage Vers is adjusted in operation S670. For example, the level of the erase voltage Vers may be increased. Thereafter, the erase operation (operation S620) and erase-verification (operations S625 through S650) of the selected memory block BLK are again performed.

If the erase count has reached the maximum value, an error report is generated in operation S675. For example, the control logic 170b generates an error report representing that an error has occurred during an erase operation. The generated error report may be provided to a host of the nonvolatile memory device 100b.

In operation S655, if an address is not stored in the word line address latch 177, it means that some of the word lines corresponding to the addresses transmitted from the fuse unit 180 have been erase-passed in a selected row of NAND strings NS of the selected memory block BLK. At this point, operation S680 is performed.

In operation S680, it is determined whether the selected string selection line is the last string selection line or not. That is, it is determined whether the erase-verification of some of the word lines has been completed in all the rows of the NAND strings NS of the selected memory block BLK. If the selected string selection line (i.e., row of the NAND strings) is not the last string selection line, the SSL count is increased in operation S685. The addresses of some of the word lines are stored in the word line address latch 177 from the fuse unit 180. Thereafter, operation S625 is performed.

If the selected string selection line is the last string selection line, it means that the memory cells MC of the selected memory block BLK have been erase-passed. Accordingly, the erase operation is terminated.

Figure 73:
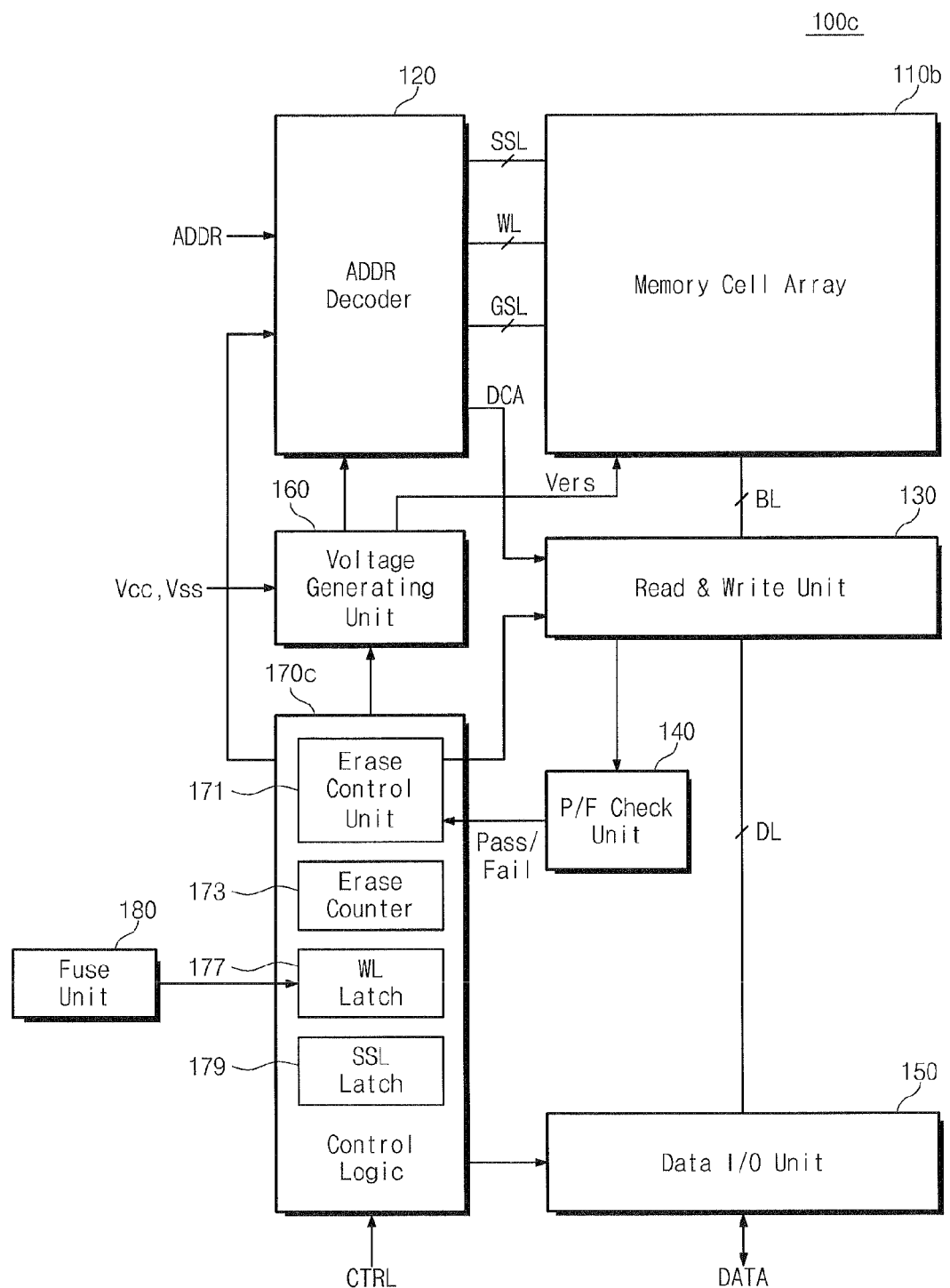
FIG. 73 is a block diagram illustrating a nonvolatile memory device according to an embodiment of the inventive concept.

FIG. 73 is a block diagram illustrating a nonvolatile memory device 100c according to an embodiment of the inventive concept. Referring to FIG. 73, the nonvolatile memory device 100c includes a memory cell array 110b, an address decoder 120, a read & write unit 130, a pass/fail check unit 140, a data input/output unit 150, a voltage generating unit 160, and a control logic 170c. Except the control logic 170c, the nonvolatile memory device 100c has the same structure as the nonvolatile memory device 100b described with reference to FIG. 13.

Except that a string selection line latch (hereinafter, referred to as an SSL latch) 179 is added to the control logic 170c, the control logic has the same structure as the control logic 170b described with reference to FIG. 13.

The SSL latch 179 is configured to store addresses of some of string selection lines of a selected memory block BLK.

Figure 74:
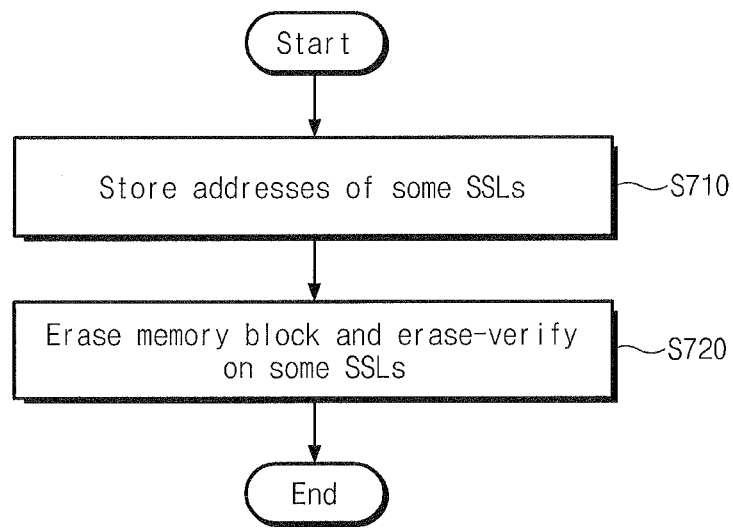
FIG. 74 is a flowchart illustrating an operating method of the nonvolatile memory device of FIG. 73.

FIG. 74 is a flowchart illustrating an operating method of the nonvolatile memory device of FIG. 73. Referring to FIG. 74, the addresses of some of string selection lines are stored in operation S710. In operation S720, a memory block is erased, and erase-verification is performed in some of word lines.

For example, in the erase-verification method described with reference to FIG. 14, all of the string selection lines have been sequentially selected. During the erase-verification of the nonvolatile memory device 100c, some of the string selection lines corresponding to string selection line addresses stored in the SSL latch 179 are sequentially selected. If erase-pass is detected in some of the string selection lines, the selected memory block BLK may be determined as being erase-passed.

Since the erase-verification is performed on some of the string selection lines, the operation speed of the nonvolatile memory device 100c can be increased.

In an embodiment, the addresses of some of the string selection lines may be programmed by a user. That is, the string selection line to be erase-verified among the string selection lines of the selected memory block may be selected by a user.

In an embodiment, the erase-verification is performed in the string selection lines of the selected memory block BLK, but the erase-verification is inhibited in some of the string selection lines of the selected memory block BLK.

Figure 75:
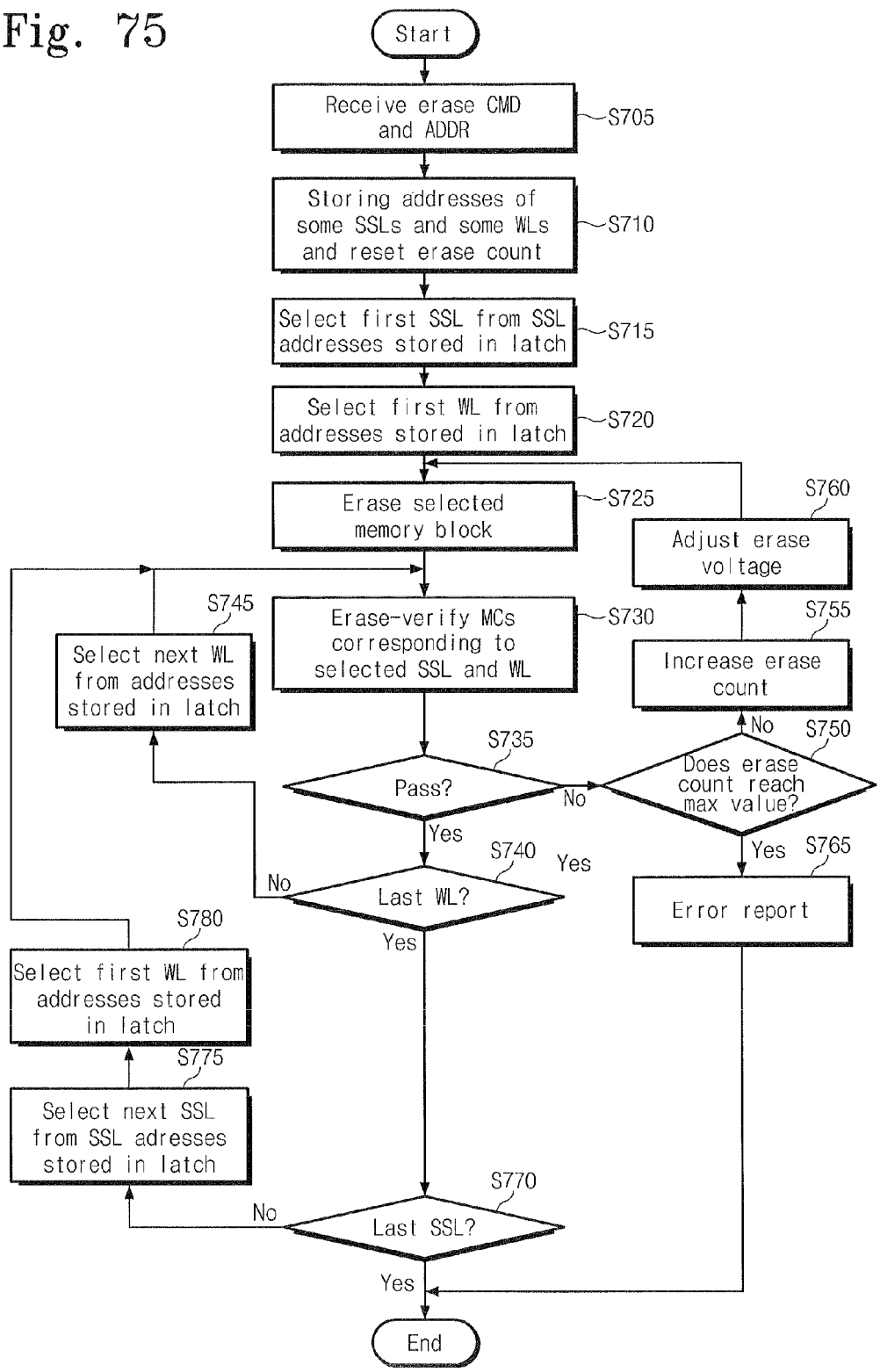
FIG. 75 is a flowchart illustrating a method of operating the nonvolatile memory device of FIG. 73 according to an embodiment of the inventive concept.

FIG. 75 is a flowchart illustrating a method of operating the nonvolatile memory device 100c of FIG. 73 according to an embodiment of the inventive concept. As described with reference to FIG. 74, a plurality of memory cells corresponding to some of a plurality of string selection lines of a selected memory block in the nonvolatile memory device 100c are erase-verified.

Referring to FIGS. 73 and 75, in operation S705, an erase command and an address are received. For example, the received address corresponds to one of a plurality of blocks BLK1 to BLKz of the nonvolatile memory device 100c. A memory block BLK corresponding to the received address among the plurality of memory blocks BLK1 to BLKz is selected. For example, the received address corresponds to at least two string selection lines SSL.

In operation S710, addresses of some of the string selection lines of the selected memory block BLK are stored in the SSL latch 179. The addresses of some of the word lines of the selected memory block BLK are stored in the word line address latch 177. An erase count is reset.

In operation S715, a first string selection line is selected from the string selection lines corresponding to the string selection line addresses stored in the SSL latch 179.

In operation S720, a first word line is selected from the word lines corresponding to the addresses stored in the word line address latch 177.

In operation S725, the selected memory block BLK is erased.

In operation S730, a plurality of memory cells corresponding to the selected string selection line and the selected word line are erase-verified.

In operation S735, it is determined whether an erase-verification result is erase-passed or not. If the erase-verification result is 'pass', operation S740 is performed.

In operation S740, it is determined whether the selected word line is the last word line or not. For example, it is determined whether the selected word line is the last word line among word lines corresponding to addresses stored in the word line address latch 177. If the selected word line is not the last word line, operation S745 is performed. In operation S745, a next word line is selected from the word lines corresponding to the addresses stored in the word line address latch 177. Thereafter, operation S730 is again performed.

If the erase-verification result is erase-fail, operation S750 is performed. In operation S750, it is determined whether the erase count reaches the maximum value or not. If the erase count does not reach the maximum value, the erase count is increased in operation S755. Thereafter, an erase voltage Vers is adjusted in operation S760. For example, the level of the erase voltage Vers may be increased. Thereafter, the erase operation (operation S725) of the selected memory block BLK and the erase-verification from the erase-failed word line are again performed.

If the erase count has reached the maximum value in operation S725, an error report is generated in operation S765. For example, the control logic 170c generates an error report representing that an error has occurred during an erase operation. The generated error report may be provided to a host of the nonvolatile memory device 100c.

That is, the erase-verification is performed on a per-word line basis in the plurality of memory cells corresponding to the selected string selection lines. If the erase-verification is detected, the erase-verification is stopped, and the erase is again performed. Thereafter, the erase-verification resumes from the erase-failed word line. If the erase-pass is detected, a next word line is selected.

In operation S740, if the selected word line is the last word line, operation S770 is performed.

In operation S770, it is determined whether the selected string selection line is the last string selection line. For example, it is determined whether the selected string selection line is the last string selection line among the string selection lines corresponding to the string selection line addresses stored in the SSL latch 179. If the selected string selection line is the last string selection line, the erase operation is terminated. If the selected string selection line is not the last string selection line, operation S775 is performed.

In operation S775, a next string selection line is selected from the string selection lines corresponding to the string selection line addresses stored in the SSL latch 179. In operation S780, a first word line is selected from the word lines corresponding to the addresses stored in the word line address latch 177. Thereafter, operation S730 is again performed.

In an embodiment, addresses of string selection lines corresponding to memory cells having lower erase characteristics than other memory cells among the plurality of memory cells of the selected memory block BLK are stored in the SSL latch 179. That is, when a plurality of memory cells corresponding to the stored string selection line addresses are erase-passed, a plurality of memory cells of the selected memory block BLK may be erase-passed.

In an embodiment, addresses of string selection lines corresponding to memory cells of the selected memory block BLK that are located at its edge may be stored in the SSL latch 179.

Figure 76:
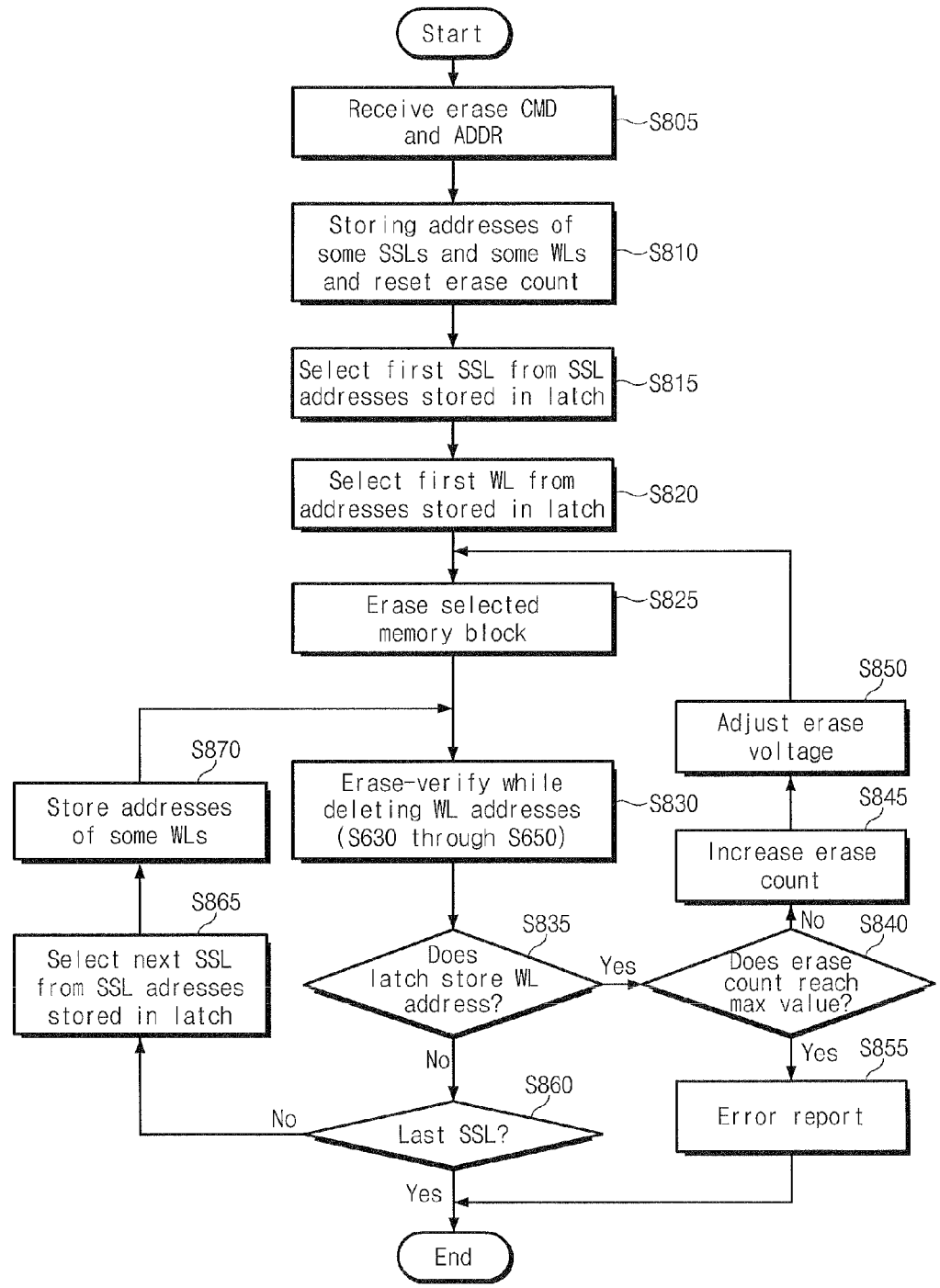
FIG. 76 is a flowchart illustrating a method of operating the nonvolatile memory device of FIG. 73 according to an embodiment of the inventive concept.

FIG. 76 is a flowchart illustrating a more detailed erase method of the nonvolatile memory device 100c of FIG. 73 according to a second embodiment of the inventive concept. Referring to FIGS. 73 and 76, in operation S805, an erase command and an address are received. For example, the received address corresponds to one of a plurality of blocks BLK1 to BLKz of the nonvolatile memory device 100c. A memory block BLK corresponding to the received address among the plurality of memory blocks BLK1 to BLKz is selected. For example, the received address corresponds to at least two string selection lines SSL.

In operation S810, addresses of some of the string selection lines of the selected memory block BLK are stored in the SSL latch 179. The addresses of some of the word lines of the selected memory block BLK are stored in the word line address latch 177. An erase count is reset.

In operation S815, a first string selection line is selected from the string selection lines corresponding to the string selection line addresses stored in the SSL latch 179.

In operation S820, a first word line is selected from the word lines corresponding to the addresses stored in the word line address latch 177.

In operation S825, the selected memory block BLK is erased.

In operation S830, word line addresses are erased, and erase-verification is performed. For example, similarly to operations S630 through S650 described with reference to FIG. 72, the addresses of word lines corresponding to erase-passed memory cells are erased from the word line address latch 177, and the selected string selection line and a plurality of memory cells corresponding to the addresses stored in the word line address latch 177 are erase-verified by unit of respective word line. If operation S830 is performed, the addresses of the word lines corresponding to the erase-failed memory cells remain in the word line address latch 177.

In operation S835, it is determined whether at least one address stored in the word line address latch 177 exists. If there is at least one address stored in the word line address latch 177, operation S840 is performed.

In operation S840, it is determined whether the erase count has reached the maximum value. If the erase count has not reached the maximum value, the erase count is increased in operation S845. Thereafter, an erase voltage Vers is adjusted in operation S850. For example, the level of the erase voltage Vers may increase. Thereafter, operation S825 is again performed.

If the erase count has reached the maximum value in operation S840, an error report is generated in operation S855. For example, the control logic 170c generates an error report representing that an error has occurred during an erase operation. The generated error report may be provided to a host of the nonvolatile memory device 100c.

If the selected string selection line and the plurality of memory cells corresponding to the addresses stored in the word line address latch 177 are erase-passed, the word line address latch 177 does not store the word line address. At this point, operation S860 is performed.

In operation S860, it is determined whether the selected string selection line is the last string selection line or not. For example, it is determined whether the selected string selection line is the last string selection line among string selection lines corresponding to string selection line addresses stored in the SSL latch 179.

If the selected string selection line is the last string selection line, the erase operation is terminated. If the selected string selection line is not the last string selection line, a next string selection line is selected from the string selection lines corresponding to the string selection line addresses stored in the SSL latch 179 in operation S865. In operation S870, some of the word lines of the selected memory block BLK are stored in the word line address latch 177. Thereafter, operation S830 is again performed.

Addresses of string selection lines corresponding to memory cells having lower erase characteristics than other memory cells among the plurality of memory cells of the selected memory block BLK are stored in the SSL latch 179. That is, when a plurality of memory cells corresponding to the stored string selection line addresses are erase-passed, a plurality of memory cells of the selected memory block BLK may be erase-passed.

In an embodiment, addresses of string selection lines corresponding to memory cells of the selected memory block BLK that are located at its edge may be stored in the SSL latch 179.

Figure 77:
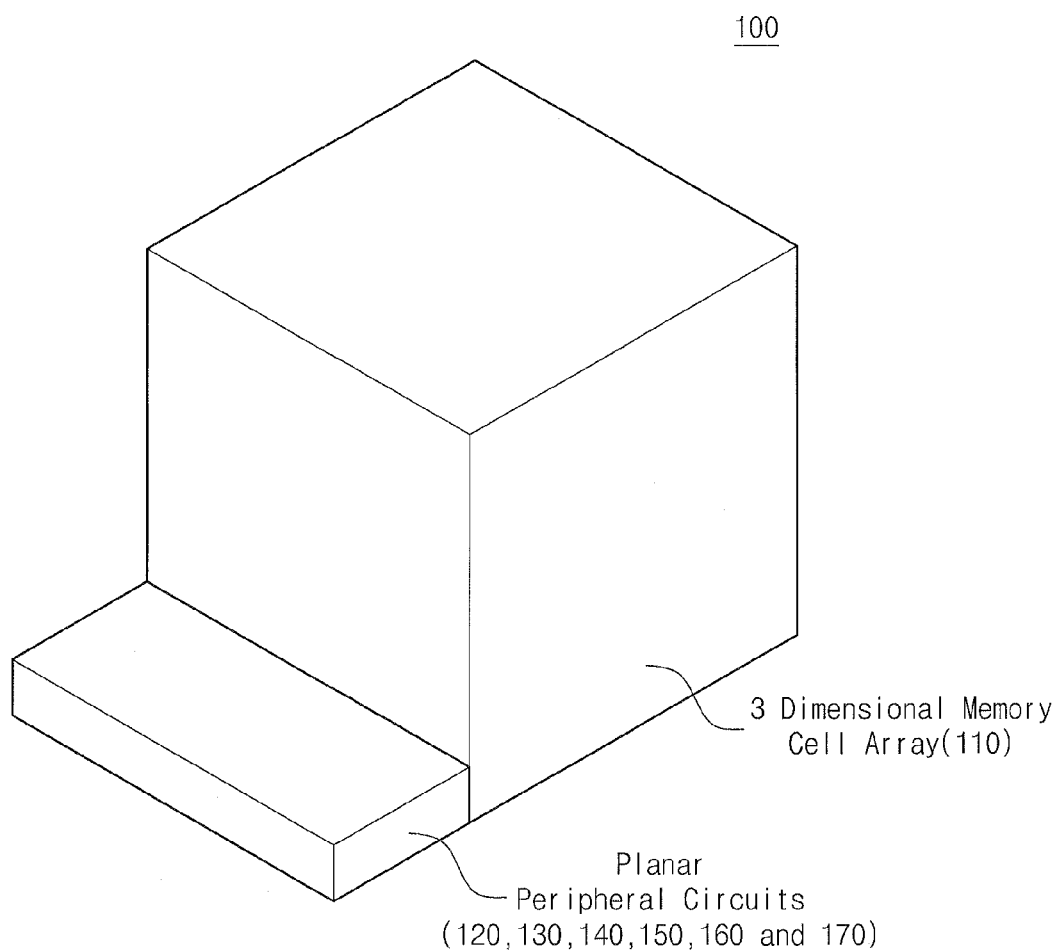
FIG. 77 is a perspective view illustrating a structure of the nonvolatile memory device described with reference to FIG. 13 or 73.

FIG. 77 is a perspective view illustrating a structure of the nonvolatile memory device 100b or 100c described with reference to FIG. 13 or 73 according to an embodiment of the inventive concept. Hereinafter, the nonvolatile memory device 100 will be defined as representing one of the nonvolatile memory devices 100b and 100c described with reference to FIGS. 13 and 73. The control logic 170 will be defined as representing one of the control logics 170b and 170c described with reference to FIGS. 13 and 73.

Referring to FIG. 77, the nonvolatile memory device 100 includes a three-dimensional memory cell array 110 and planar peripheral circuits 120, 130, 140, 150, 160, and 170.

As described with reference to FIGS. 15 through 71, the memory cell array 110 includes memory cells stacked in a direction of crossing a substrate 111. That is, the memory cell array 110 has a three-dimensional structure in which memory cells are three-dimensionally arranged.

In an embodiment, the peripheral circuits 120, 130, 140, 150, 160, and 170 are configured of devices that are provided in a mono-layer on the substrate 111. That is, the peripheral circuits 120, 130, 140, 150, 160, and 170 are configured of devices having planar structures.

In an embodiment, the planar peripheral circuits 120, 130, 140, 150, 160, and 170 are provided at one side of the three-dimensional memory cell array 110. However, the three-dimensional cell array 110 and the planar peripheral circuits 120, 130, 140, 150, 160, and 170 are not limited to their positional relation and number.

For example, the planar peripheral circuits 120, 130, 140, 150, 160, and 170 may be provided at two or more sides of the three-dimensional memory cell array 110. Also, at least two three-dimensional memory cell arrays 110 may be provided with the planar peripheral circuits 120, 130, 140, 150, 160, and 170 at one or more side of each three-dimensional memory cell array 110.

Figure 78:
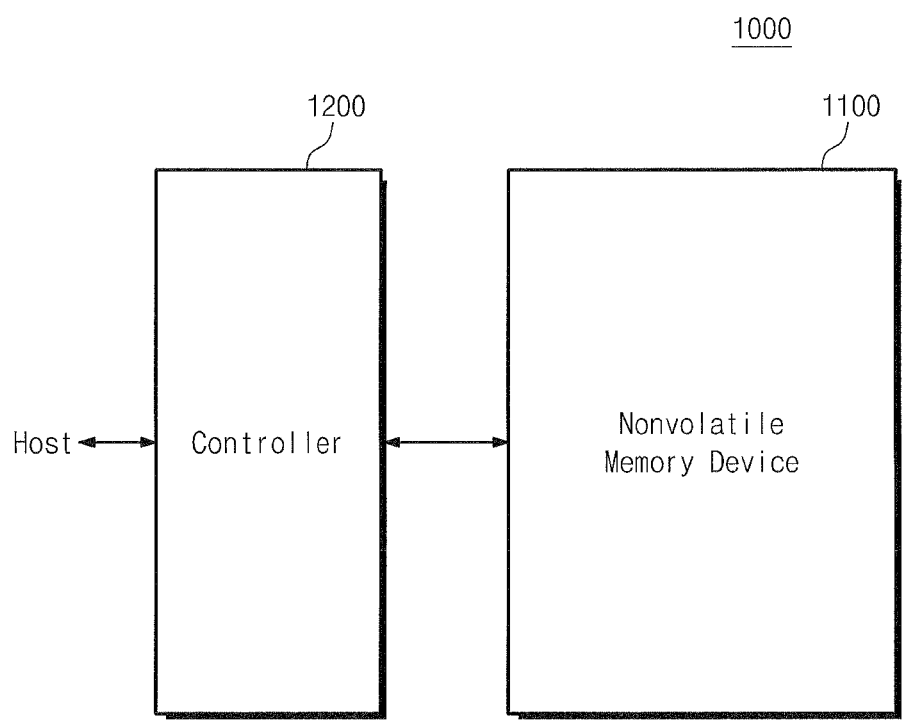
FIG. 78 is a block diagram illustrating a memory system according to an embodiment of the inventive concept.

FIG. 78 is a block diagram illustrating a memory system 1000 according to an embodiment of the inventive concept.

Referring to FIG. 78, the memory system 1000 according to an embodiment of the inventive concept includes a nonvolatile memory device 1100 and a controller 1200.

The nonvolatile memory device 1100 has the same structure as one of the nonvolatile memory devices 100a, 100b, and 100c described with reference to FIGS. 1, 13, and 73, and operates identically to the nonvolatile memory devices 100a, 100b, and 100c. That is, the nonvolatile memory device 1100 erases a selected memory block BLK, and erase-verifies the erased memory block BLK on a per-word line basis. When erase-fail is generated, the selected memory block BLK is again erased, and the erase-verification resumes from an erase-failed word line.

The controller 1200 is connected to a host and the nonvolatile memory device 1100. In response to a request from the host, the controller 1200 accesses the nonvolatile memory device 1100. For example, the controller 1200 controls the reading, writing, erasing and background operations of the nonvolatile memory device 1100. The controller 1200 provides an interface between the nonvolatile memory device 1100 and the host. The controller 1200 drives firmware for controlling the nonvolatile memory device 1100.

In an embodiment, the controller 1200 provides a control signal CTRL and an address ADDR to the nonvolatile memory device 1100. Furthermore, the controller 12000 exchanges data DATA with the nonvolatile memory device 1100.

In an embodiment, the controller 1200 provides an erase command and an address to the nonvolatile memory device 1100. In response to the erase command and the address that are provided from the controller 1200, the nonvolatile memory device 1100 performs erase and erase-verification in an operating method according to an embodiment of the inventive concept.

For example, the nonvolatile memory device 1100 erases memory cells MC corresponding to a received address, and erase-verifies the erased memory cells MC on a per-word line basis. For example, the nonvolatile memory device 1100 performs erase-verification in some of the word lines corresponding to the erased memory cells MC on a per-word line basis. When erase-fail is generated, the memory cells MC are again erased, and erase-verification resumes from an erase-failed word line. When the received address corresponds to at least two string selection lines SSL, erase-verification is performed on a per-string selection line SSL basis. In an embodiment, in some of the string selection lines SSL corresponding to the received address, erase-verification may be performed on a per-string selection line SSL basis. In an embodiment, erase-verification may be performed on memory cells associated with respective string selection line SSL.

The nonvolatile memory device 1100 transmits the result of an erasing operation to the controller 1200. For example, when the memory cells MC corresponding to the received address are erase-passed, the nonvolatile memory device 1100 may provide a signal indicating erase-pass to the controller 1200. When erase count reaches the maximum value before the memory cells MC corresponding to the received address are erase-passed, the nonvolatile memory device 1100 provides an error report to the controller 1200.

In an embodiment, the controller 1200 may further include a RAM, a processing unit, a host interface, and a memory interface. The RAM is used as at least one of a working memory of the processing unit, a cache memory between the nonvolatile memory device 1100 and the host, and a buffer memory between the nonvolatile memory device 1100 and the host. The processing unit controls the overall operation of the controller 1200.

The host interface includes a protocol for data exchange between the host and the controller 1200. Exemplarily, the controller 1200 communicates with external devices (for example, a host) through at least one of various interface protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol and a Integrated Drive Electronics (IDE) protocol. A memory interface interfaces with the nonvolatile memory device 1100. For example, the memory interface includes a NAND interface or a NOR interface.

The memory system 1000 may further include an error correction block. The error correction block detects and corrects the error of data that is read from the nonvolatile memory device 1100 with an Error Correction Code (ECC). Exemplarily, the error correction block is provided as the element of the controller 1200. The error correction block may be provided as the element of the nonvolatile memory device 1100.

The controller 1200 and the nonvolatile memory device 1100 may be integrated as one semiconductor device. Exemplarily, the controller 1200 and the nonvolatile memory device 1100 are integrated as one semiconductor device to configure a memory card. For example, the controller 1200 and the nonvolatile memory device 1100 are integrated as one semiconductor device to configure a memory card such as a PC card (Personal Computer Memory Card International Association (PCMICA)), a compact flash card (CF), a smart media card (SM, SMC), a memory stick, a multimedia card (MMC, RS-MMC, MMCmicro), an SD card (SD, miniSD, microSD, SDHC), and a universal flash memory device (UFS).

The controller 120 and the nonvolatile memory device 1100 are integrated as one semiconductor device to configure a semiconductor drive (Solid State Drive (SSD)). The semiconductor drive (SSD) includes a storage unit for storing data in a semiconductor memory. When the memory system 1000 is used as the semiconductor drive (SSD), the operation speed of the host connected to the memory system 1000 is considerably improved.

In an embodiment, the memory system 1000 is provided as one of various elements of electronic devices such as computers, Ultra Mobile PCs (UMPCs), workstations, net-books, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID devices and one of various elements configuring a computing system.

In an embodiment, the nonvolatile memory device 1100 or the memory system 1000 may be implemented as various types of packages. For example, the nonvolatile memory device 1100 or the memory system 1000 may be implemented in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP), thereby being mounted.

Figure 79:
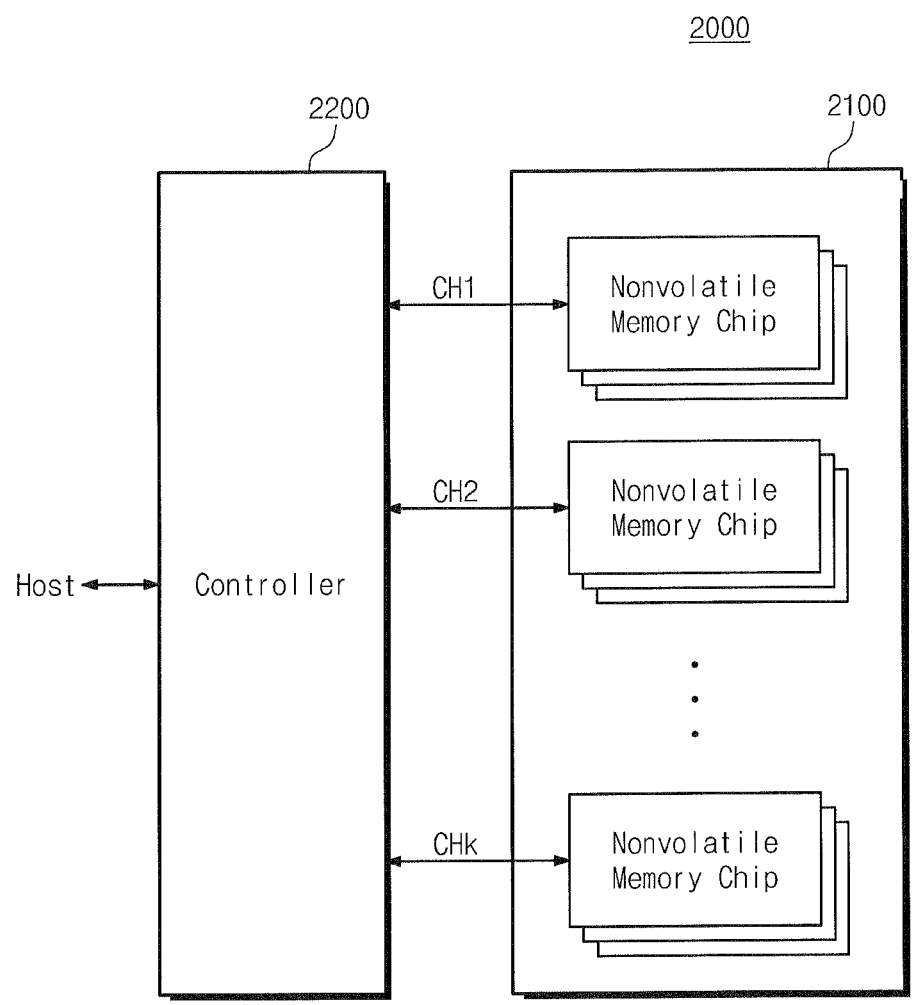
FIG. 79 is a block diagram illustrating a memory system according to an embodiment of the inventive concept.

FIG. 79 is a block diagram illustrating a memory system according to an embodiment of the inventive concept.

Referring to FIG. 79, a memory system 2000 includes a nonvolatile memory device 2100 and a controller 2200. The nonvolatile memory device 2100 includes a plurality of nonvolatile memory chips. The plurality of nonvolatile memory chips are divided into a plurality of groups. Each group of the nonvolatile memory chips communicates with the controller 2200 through a common channel. In an embodiment, the plurality of nonvolatile memory chips communicate with the controller 2200 through first to kth channels CH1 to CHk.

Each nonvolatile memory chip has the same structure as one of the nonvolatile memory devices 100*a*, 100*b*, and 100*c* described with reference to FIGS. 1, 13, and 73, and operates identically to one of the nonvolatile memory devices 100*a*, 100*b*, and 100*c*. That is, each of the nonvolatile memory chip erases a selected memory block BLK, and then erase-verifies the selected memory cells MC on a per-word line word. When erase-fail is generated, the selected memory block BLK is again erased, and erase-verification resumes from an erase-failed word line. The erase and erase-verification are performed for each row of the selected memory block BLK.

In FIG. 79, the plurality of nonvolatile memory chips are connected to one channel according to an embodiment. According to an embodiment, the memory system 2000 may be modified so that one nonvolatile memory chip may be connected to one channel.

Figure 80:
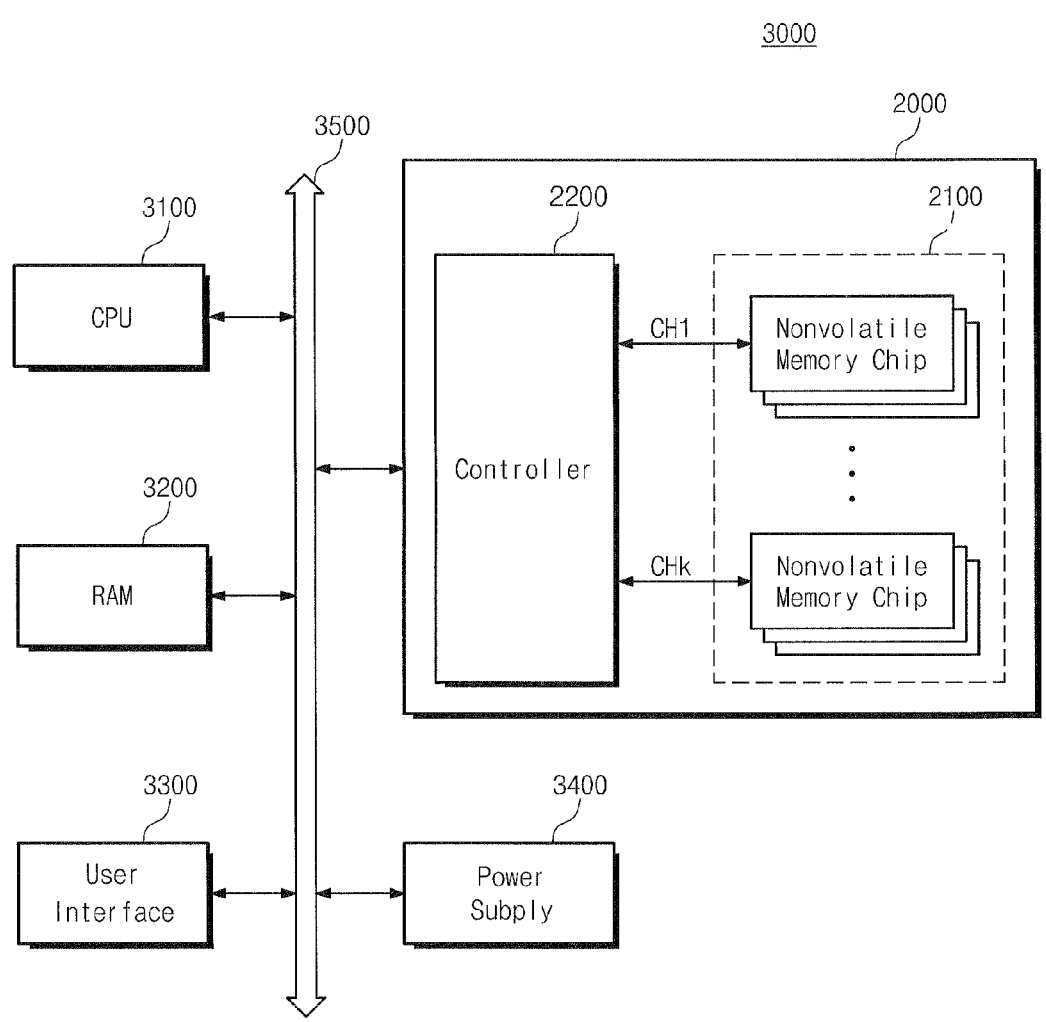
FIG. 80 is a block diagram illustrating a computing system according to an embodiment of the inventive concept.

FIG. 80 is a block diagram illustrating a computing system 3000 according to an embodiment of the inventive concept.

Referring to FIG. 80, a computing system 3000 includes a Central Processing Unit (CPU) 3100, a RAM 3200, a user interface 3300, a power supply 3400, and the memory system 2000.

The memory system 2000 is electrically connected to the CPU 3100, the RAM 3200, the user interface 3300 and the power supply 3400 through a system bus 3500. Data, which is provided through the user interface 3300 or is processed by the CPU 3100, is stored in the memory system 2000.

In FIG. 80, it is illustrated that the nonvolatile memory device 2100 is connected to the system bus 3500 through the controller 2200. However, the nonvolatile memory device 2100 may be directly connected to the system bus 3500.

In FIG. 80, it is illustrated that the memory system 2000 is provided which has been described above with reference to FIG. 79. However, the memory system 2000 may be replaced by the memory system 1000 that has been described above with reference to FIG. 78.

In an embodiment, the computing system 3000 may include both of the memory systems 1000 and 2000 that have respectively been described above with reference to FIGS. 78 and 79.

In the above-described embodiments, embodiments of the inventive concept have been described with reference to various flowcharts. The order of operations according to an embodiment of the inventive concept has been defined by the above-described flowcharts. However, the technical spirit and scope of the inventive concept will not be limited to the orders of the operations described in the above-described flowcharts. Without departing from the technical spirit of the inventive concept, the order of operations described in the above flowcharts can be modified.

In an embodiment, an operation for selecting a memory block may be performed after an erase command and an address are received and before a memory block is selected, and is not limited by former or latter operations of other operations.

Similarly, an operation for selecting a word line for the first time may be performed after an erase command and an address are received and before an erased memory block is erase-verified, but is not limited thereto. An operation for selecting a word line later may be performed after a memory block is erased or memory cells connected to a previously-selected word line are erase-verified, and before a memory block is erase-verified, and is not limited thereto.

An operation for selecting a string selection line for the first time may be performed after an erase command and an address are received and before an erased memory block is erase-verified, but is not limited thereto. An operation for selecting a string selection line later may be performed after memory cells connected to a previously-selected string selection line are erase-passed, and before a memory block is erase-verified, but is not limited thereto.

In an embodiment, an operation for selecting a string selection line may include an operation for converting an SSL count into a string selection line address and an operation for selecting a string selection line corresponding to the converted string selection line address. The operation for selecting a string selection line may further include an operation for initializing or adjusting the SSL count. Another operation may be performed between sub-operations of the operation for selecting a string selection line.

Initial storing of addresses of some of the word lines may be performed after an erase command and an address are received and before a word line to be erase-verified is selected, but is not limited thereto.

Storing of addresses of some of the string selection lines may be performed after an erase command and an address are received and before a string selection line is selected, but is not limited thereto.

In exemplary embodiments, an operation for resetting a latch configured to store an address and an operation for erasing the address stored in the latch have been described with reference to a string selection line and a word line. The reset latch is not limited to having a specific logic value. In an embodiment, as long as the reset latch is dealt not to store an address, the reset latch may have various logic values. Similarly, when a specific address is erased from the latch, a logic value of a storage region corresponding to the erased address is not limited.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of erasing a nonvolatile memory device, the nonvolatile memory device comprising a plurality of memory blocks, each memory block including a plurality of cell strings being connected to a bit line in common and connected to a plurality of string selection lines respectively, each cell string including a plurality of memory cells connected to a plurality of word lines respectively and at least one string selection transistor connected to at least one string selection line of the plurality of string selection lines, the method comprising:
performing an erase operation at the memory block including the plurality of cell strings iteratively until the memory block is erase-passed,
wherein performing the erase operation includes:
erasing the memory block;
erase-verifying a plurality of cell strings of the memory block sequentially; and
storing pass/fail information into a latch,
wherein a cell string of the memory block is erase-passed, the cell string is not erase-verified during subsequent erase operations.

2. The method of claim 1, wherein the latch includes a counter, and the pass/fail information is a count value of the counter.

3. The method of claim 2, wherein the erase-verification is performed from a cell string of the plurality of cell strings corresponding to the count value.

4. The method of claim 3, wherein the count value is increased when the cell string is erase-passed.

5. The method of claim 3, wherein the erase-verification is stopped when the cell string is erase-failed.

6. The method of claim 1, further comprising:
storing addresses of the plurality of cell strings of the memory block into the latch, wherein the pass/fail information is the addresses stored in the latch.

7. The method of claim 6, wherein the erase-verification is performed on cell strings corresponding to the addresses stored in the latch.

8. The method of claim 7, wherein if a cell string of the plurality of cell strings is erase-passed, an address corresponding to the erase-passed cell string is deleted from the latch.

9. The method of claim 7, wherein if a cell string of the plurality of cell strings is erase-failed, a next cell string is erase-verified.

10. The method of claim 7, wherein if a cell string of the plurality of cell strings is erase-failed, the erase-verification is stopped.

11. The method of claim 1, wherein the erase-verifying a plurality of cell strings of the memory block sequentially includes:
selecting a cell string from the plurality of cell strings; and
erase-verifying a plurality of memory cells of the selected cell string sequentially.

12. The method of claim 1, wherein the memory block is a unit of the erase operation which is erased according to a single block address.

13. A nonvolatile memory device comprising:
a memory cell array including a plurality of memory blocks, each memory block including a plurality of cell strings being connected to a bit line in common and connected to a plurality of string selection lines respectively, each cell string including a plurality of memory cells connected to word lines respectively and at least one string selection transistor connected to at least one string selection line of the plurality of string selection lines;
a decoder connected to each memory block of the memory cell array through the plurality of string selection lines and a plurality of word lines;
a read and write circuit connected to the memory cell array through the bit line; and
control logic configured to control the decoder and the read and write circuit to erase a selected memory block and erase-verify the plurality of cell strings of the selected memory block sequentially, and further configured to store pass/fail information into a latch in response to a result of the erase-verification iteratively until the selected memory block is erase-passed,
wherein if a cell string of the plurality of cell strings of the selected memory block is erase-passed during an erase-verification, the cell string is not erase-verified during a subsequent erase-verification.

14. The nonvolatile memory device of claim 13, wherein the plurality of memory cells of each cell string is stacked along a direction perpendicular to a substrate.

15. The nonvolatile memory device of claim 13, wherein the memory block is a unit of the erase operation which is erased according to a single block address.

16. A memory system comprising:
a controller; and
a plurality of nonvolatile memories divided into a plurality of memory groups, the plurality of memory groups communicating with the controller through a plurality of channels respectively, each memory group including at least two nonvolatile memories of the plurality of nonvolatile memories and communicating with the controller through a common channel of the plurality of channels,
wherein the controller is configured to transmit an address and a erase command to a selected channel of the plurality of channels,
wherein a nonvolatile memory corresponding to the address and the selected channel performs erase operations at a memory block selected by the address, wherein each nonvolatile memory includes:
a memory cell array including a plurality of memory blocks, each memory block including a plurality of cell strings being connected to a bit line in common and connected to a plurality of string selection lines respectively, each cell string including a plurality of memory cells connected to word lines respectively and at least one string selection transistor connected to at least one string selection line of the plurality of string selection lines;
a decoder connected to each memory block of the memory cell array through the plurality of string selection lines and a plurality of word lines;
a read and write circuit connected to the memory cell array through the bit line; and
control logic configured to control the decoder and the read and write circuit to erase a selected memory block and erase-verify the plurality of cell strings of the selected memory block sequentially, and further configured to store pass/fail information into a latch in response to a result of the erase-verification iteratively until the selected memory block is erase-passed,
wherein if a cell string of the plurality of cell strings of the selected memory block is erase-passed during an erase-verification, the cell string is not erase-verified during a subsequent erase-verification.

17. The memory system of claim 16, wherein the controller and the plurality of nonvolatile memories form a solid state drive SSD.

18. The memory system of claim 16, wherein the controller and the plurality of nonvolatile memories form at least a part of a computing device.

* * * * *